(12) United States Patent
Lu

(10) Patent No.: US 8,502,344 B2
(45) Date of Patent: Aug. 6, 2013

(54) SEMICONDUCTOR DEVICE

(75) Inventor: Hong-fei Lu, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 760 days.

(21) Appl. No.: 12/411,836

(22) Filed: Mar. 26, 2009

(65) Prior Publication Data
US 2009/0242930 A1    Oct. 1, 2009

(30) Foreign Application Priority Data

Mar. 26, 2008  (JP) ................................. 2008-080489
Jul. 25, 2008   (JP) ................................. 2008-192294

(51) Int. Cl.
*H01L 29/66*    (2006.01)
(52) U.S. Cl.
USPC .................................. 257/557; 257/E29.187
(58) Field of Classification Search
None
See application file for complete search history.

(56) References Cited

U.S. PATENT DOCUMENTS

| | | | |
|---|---|---|---|
| 5,523,599 A | 6/1996 | Fujishima et al. | |
| 5,796,125 A | 8/1998 | Matsudai et al. | |
| 6,150,697 A | 11/2000 | Teshigahara et al. | |
| 6,439,514 B1 | 8/2002 | Yamaguchi et al. | |
| 6,441,432 B1 | 8/2002 | Sumida | |
| 6,646,319 B2 | 11/2003 | Itakura et al. | |
| 7,482,238 B2 * | 1/2009 | Sung ............................. | 438/335 |
| 2006/0255406 A1 | 11/2006 | Ichijo et al. | |
| 2007/0075393 A1 | 4/2007 | Ikuta et al. | |

FOREIGN PATENT DOCUMENTS

| | | |
|---|---|---|
| JP | 6-244412 A | 9/1994 |
| JP | 11-312805 A | 11/1999 |
| JP | 2000-156495 A | 6/2000 |
| JP | 2000-223665 A | 8/2000 |
| JP | 2006-210865 A | 8/2006 |
| JP | 2006-237474 A | 9/2006 |
| JP | 2006-319231 A | 11/2006 |
| JP | 2007-96143 A | 4/2007 |

OTHER PUBLICATIONS

Funaki, Hideyuki, et al.; "Multi-Channel SOI Lateral IGBTS with Large SOA"; Int. Symp. Power Semiconductor Devices and ICs, 1997, pp. 33-36.

Yasuhara, Norio, et al.; "Experimental Verification of Large Current Capability of Lateral IEGTs on SOI", Int. Symp. Power Semiconductor Devices and ICs, 1996, pp. 97-100.

(Continued)

*Primary Examiner* — Michael Lebentritt
*Assistant Examiner* — Kevin Quinto
(74) *Attorney, Agent, or Firm* — Rossi, Kimms & McDowell LLP

(57) ABSTRACT

A lateral high-breakdown voltage semiconductor device is provided in which the breakdown voltages of elements as a whole are improved, while suppressing increases in cell area. A track-shape gate electrode surrounds a collector electrode extending in a straight line, a track-shape emitter electrode surrounds the gate electrode, and a track-shape first isolation trench surrounds the emitter electrode. A second isolation trench surrounds the first isolation trench. The region between the first isolation trench and the second isolation trench is an n-type isolation silicon region. The isolation silicon region is at the same potential as the emitter electrode. In the cross-sectional configuration traversing the gate electrode, the depth of the p base region in an interval corresponding to an arc-shape portion of the gate electrode is shallower than the depth of the p base region in an interval corresponding to a straight-line portion of the gate electrode.

3 Claims, 48 Drawing Sheets

OTHER PUBLICATIONS

"Power Device, Challenge to Silicon Boundaries", Technical Research Committee for High Performance/ Intelligent Power Device, Jun. 2001, Institute of Electrical Engineering of Japan Technical Report No. 842. Parital Translation provided.

Partial English translation of "Notification of Reason for Refusal" issued in Japanese Patent Application No. 2008-192294 dated May 21, 2013.

* cited by examiner

| p BASE REGION DEPTH Xj (μm) | OFF STATE BREAKDOWN VOLTAGE BVoff (V) | ON STATE BREAKDOWN VOLTAGE BVon (V) WHEN VG= 5V |
|---|---|---|
| 2.4 | 245 | 255 |
| 5.8 | 259 | 273 |

SEMICONDUCTOR DEVICE

BACKGROUND

The present invention relates to a semiconductor device, and in particular relates to a lateral-type high-voltage semiconductor device having an insulated gate structure.

In the explanation below and in the attached drawings, an "n" or "p" denoting a layer or region means that electrons or holes, respectively, are the majority carrier. Moreover, a "+" or "−" appended to an "n" or "p" means that the impurity concentration is higher or lower respectively than in a layer or region without such symbols appended.

FIG. 52 is a cross-sectional view showing the configuration of an IGBT (Insulated Gate Bipolar Transistor) of the prior art. As shown in FIG. 52, a SOI (Silicon On Insulator) substrate comprises a supporting substrate 1, buried oxide film 2, and semiconductor layer (n⁻ drift region 3). The p base region 4, p⁺ contact region 5, and n⁺ emitter region 6 are provided in a surface region of the n⁻ drift region 3. The n buffer region 11 and p⁺ collector region 12 are provided in a surface region of the n⁻ drift region 3, at a distance from the p base region 4.

The emitter electrode 7 is in contact with the p⁺ contact region 5 and n⁺ emitter region 6. The gate electrode 8 is provided, with the gate insulating film 9a intervening, on the surface of the p base region 4 between the n⁺ emitter region 6 and the n⁻ drift region 3. The collector electrode 10 is in contact with the p⁺ collector region 12. The surface of the n⁻ drift region 3 is covered by a LOCOS (Local Oxidation of Silicon) oxide film 9b.

In the configuration shown in FIG. 52, when the p⁺ collector region 12 is replaced with an n-type low-resistivity region (n⁺ drain region), a MOSFET (Metal Oxide Semiconductor Field Effect Transistor) configuration results. This unit cell structure is arranged in repetition according to the required current capacity (see for example Japanese Patent Publication No. 3473460 (paragraph [0011], FIG. 1), corresponding to U.S. Pat. No. 6,441,432 B1).

FIG. 53 is a cross-sectional view showing the configuration of a multicell-structure IGBT of the prior art. As shown in FIG. 53, a plurality of cells are arranged in repetition separated by a trench isolation portion. The trench isolation portion comprises an isolation trench 13, and a silicon region adjacent to the isolation trench 13 (and hereafter called an isolation silicon region) 14. The isolation trench 13 is formed by burying a trench reaching from the surface of the SOI substrate to the buried oxide film 2 with an oxide film or other insulating film. A structure in which the trench isolation portion is provided for each cell is also well known (see Japanese Patent Application Laid-open No. 2006-210865 (FIG. 1)).

FIG. 54 is a plane view showing the planar layout of an IGBT of the prior art. As shown in FIG. 54, the collector electrode 10 extends linearly. The gate electrode 8 comprises a pair of opposing straight-line portions, and arc-shape portions at both ends of the straight-line portions which connect the ends, so as to surround the collector electrode 10. Below, a closed planar shape comprising such straight-line portions and arc-shape portions is called a track shape. The emitter electrode 7 is formed in a track shape so as to surround the gate electrode 8. In this layout, the off-state breakdown voltage and on-state breakdown voltage are lower in the arc-shape portions.

To address this, it has been proposed that the length L2 of the n⁻ drift regions 3 of the arc-shape portions be made longer than the length L1 of the n⁻ drift regions 3 of the straight-line portions (see for example Japanese Patent Application Laid-open No. 6-244412 (FIG. 10), corresponding to U.S. Pat. No. 5,523,599A). And, it has been proposed that the channels of the arc-shape portions be made inactive (see for example Japanese Patent Publication No. 3473460 (paragraph [0011], FIG. 1, corresponding to U.S. Pat. No. 6,441,432 B1), Japanese Patent Application Laid-open No. 2007-96143 (FIG. 1), corresponding to US Patent No. 2007075393 A1). It has also been proposed that a potential-fixing region, in which the potential is fixed, be provided in an adjacent region adjacent to the drain region, formed in a stripe shape, with a dielectric isolation region intervening, to prevent fluctuations in the breakdown characteristics of the lateral semiconductor element due to potential fluctuations in a peripheral element (see for example Japanese Patent Application Laid-open No. 2006-210865 (FIG. 1)). And, it has been proposed that the threshold value of the arc-shape portions be made higher than the threshold value of the straight-line portions (see for example Japanese Patent Application Laid-open No. 2006-237474 ("Means of Solution" in "Abstract")). On the other hand, a multichannel-structure IGBT has been reported having a plurality of channel regions for a single collector region (see for example Hideyuki Funaki and four others, "Multi-Channel SOI Lateral IGBTS with Large SOA", Int. Symp. Power Semiconductor Devices and ICs, 1997, pp. 33-36; Norio Yasuhara and three others, "Experimental Verification of Large Current Capability of Lateral IEGTs on SOI", Int. Symp. Power Semiconductor Devices and ICs, 1996, pp. 97-100; and "Challenging the Limits of Power Device Silicon", Inst. Elec. Eng. Jpn. Tech. Rep., No. 842, p. 85).

FIG. 55 is a cross-sectional view showing the configuration of a multichannel-structure IGBT of the prior art. As shown in FIG. 55, the n⁺ first emitter region 6a and n⁺ second emitter region 6b are provided, separated, in the surface region of the same p base region 4. The first gate electrode 8a is provided, with the first gate insulating film 9c intervening, on the surface of the p base region 4 between the n⁺ first emitter region 6a and the n⁻ drift region 3. The second gate electrode 8b is provided, with the second gate insulating film 9d intervening, on the surface of the p base region 4 between the n⁺ second emitter region 6b and the n⁻ drift region 3. The emitter electrode 7 is in contact with the n⁺ first emitter region 6a, n⁺ second emitter region 6b, and the p⁺ contact region 5.

However, in the above-described technology of the prior art, there are the following problems. In the structure of the prior art shown in FIG. 53, there is the drawback that when the isolation silicon region 14 is not present, or when the potential of the isolation silicon region 14 is floating, the electrostatic potential of an adjacent device exerts an influence. On the other hand, when the isolation silicon region 14 is fixed at a specific potential, whether in the on state or the off state, the extent of depletion of the n⁻ drift region differs in the cell positioned adjacent to the isolation trench 13 (hereafter called an end cell) and in the cell positioned closer to the center (hereafter called a center cell). In an end cell, depletion occurs from the isolation silicon region 14, p base region, and supporting substrate. On the other hand, in a center cell, depletion occurs from the p base region and supporting substrate. Hence the breakdown voltage is determined by the center cell when the n⁻ drift region concentration is high, and is determined by the end cell when the supporting substrate concentration is high.

In the case of an IGBT having the conventional structure shown in FIG. 53, the extent of depletion in the n⁻ drift region is different in the off state and in the on state. In the on state, holes are injected from the p⁺ collector region to the n⁻ drift region. Electrons are injected from the channel at the interface between the p base region and the gate insulating film into the n⁻ drift region. The electric field distribution in the n⁻ drift region is determined by equation (1) below. Here E is the electric field intensity, ∇ is a spatial derivative, ∇·E is the divergence of the electric field, $N_D^+$ is the space charge density in the n⁻ drift region, p is the density of holes injected from the collector, n is the density of electrons injected from the channel, and ∈ is the dielectric constant.

$$\nabla \cdot E = (-N_D^+ + p - n)/\in \tag{1}$$

In the portion of the n⁻ drift region close to the collector region, the number of holes is greater than the number of electrons, so that the n⁻ drift region is not readily depleted. In order to raise the on-state breakdown voltage, the isolation silicon region 14 surrounded by the trench isolation portion may be set to the same potential as the emitter, to utilize depletion from the isolation silicon region 14. However, in the case of the center cell, depletion from the isolation silicon region 14 cannot be utilized, and so the breakdown voltage is unbalanced, and the breakdown voltage is determined by either the end cell or by the center cell.

In Japanese Patent Publication No. 3473460 (paragraph [0011], FIG. 1, corresponding to U.S. Pat. No. 6,441,432 B1) and Japanese Patent Application Laid-open No. 2007-96143 ((FIG. 1), corresponding to US Patent No. 2007075393 A1), there are concerns that the breakdown voltage cannot be increased. When the n⁻ drift region concentration is low, the breakdown voltage is determined by the arc-shape portions of the track shape. This is explained as follows, referring to FIG. 56 and FIG. 57. FIG. 56 and FIG. 57 are explanatory diagrams explaining the fact of determination of the breakdown voltage by the arc-shape portions. FIG. 56 is a plane view showing the arc shape planar layout corresponding to the arc-shape portions, and FIG. 57 is a plane view showing the straight line-shape planar layout corresponding to the structure shown in FIG. 56.

As shown in FIG. 56, in the arc structure the p⁺ collector region 12 is surrounded on the outside by the n buffer region 11, the outside of this is surrounded by the n⁻ drift region 3, the outside of this is further surrounded by the p base region 4, and the outside of this is further surrounded by the n⁺ emitter region 6, in a portion of a concentric-circle structure forming a fan shape. In the straight-line structure shown in FIG. 57, the p⁺ collector region 12, n buffer region 11, n⁻ drift region 3, p base region 4, and n⁺ emitter region 6 are arranged in straight-line shapes, in this order. In both of these structures, although not shown, a gate insulating film and gate electrode are arranged above the p base region 4, a portion of the n⁻ drift region 3, and a portion of the n⁺ emitter region 6.

In the arc structure, compared with the straight-line structure, the area of the p base region 4 is larger, and the area of the n⁻ drift region 3 is smaller. Hence when a high voltage is applied to the p⁺ collector region 12, there is more depletion in the n⁻ drift region 3 of the arc structure than in the n⁻ drift region 3 of the straight-line structure. Hence if the concentration in the n⁻ drift region 3 is determined such that the breakdown voltage of the straight-line structure is optimal, the electric field at the interface of the n⁻ drift region 3 and the n buffer region 11 in the arc structure reaches the critical electric field intensity for silicon. As a result, elements with an arc structure fail before failure of elements having straight-line structures.

In the on state in which a channel is formed at the surface of the p base region 4, when a high voltage is applied to the p⁺ collector region 12, the current density is comparatively uniform in the n⁻ drift region 3 of the straight-line structure. On the other hand, in the arc structure, the current density in the n⁻ drift region 3 gradually rises on approaching the n buffer region 11. As a result, the effects of collision ionization are more severe in the arc structure than in the straight-line structure, and failure occurs more readily on the on state. If a large-current device with a high breakdown voltage is designed such that over the range of use there is no inversion of the sign of the right-hand side of equation (1) above, then the cause of failure is collision ionization, and not the Kirk effect. Hence if the extent of depletion in the n⁻ drift region 3 is improved, and collision ionization is suppressed, then the on-state breakdown voltage can be maintained even when current concentration occurs due to the above-described arc-shape planar layout.

The structure disclosed in the above-described Japanese Patent Application Laid-open No. 6-244412 ((FIG. 10), corresponding to U.S. Pat. No. 5,523,599A) has the drawback that the cell area is increased, due to lengthening of the drift region in the arc portions. And, the structure disclosed in Japanese Patent Application Laid-open No. 2006-237474 ("Means of Solution" in "Abstract") has the drawback of a reduced current capacity. On the other hand, it is readily inferred that by applying the multichannel structure shown in FIG. 55 to a track-shape planar layout structure such as that shown in FIG. 54, the current capacity can be improved. The various problems described above are not limited to cases in which SOI substrates are used, but similarly occur in cases of general substrates in which there is no buried insulating layer.

SUMMARY OF THE INVENTION

The invention provides a semiconductor device which enables improvement of the breakdown voltages of elements as a whole, while suppressing increases in cell area.

The semiconductor device preferably has a dielectric isolation structure comprising an insulating film extending in the depth direction, and is characterized in having a planar layout as follows. A first electrode extends in a straight-line shape. A first conduction type first semiconductor region is arranged so as to surround the first electrode. A gate electrode has a closed planar shape, and is arranged so as to surround a first semiconductor region. A second electrode has a closed planar shape, and is arranged so as to surround the gate electrode. A first dielectric isolation region has a closed planar shape, and is arranged so as to surround the second electrode. An isolation semiconductor region has a closed planar shape, and is arranged so as to surround the first dielectric isolation region. A second dielectric isolation region has a closed planar shape, and is arranged so as to surround the isolation semiconductor region.

The cross-sectional structure of a semiconductor device having such a planar layout has a structure which is symmetric with respect to the first electrode, and is characterized as follows. The first semiconductor region is provided on a supporting substrate with a buried insulating layer intervening. The second semiconductor region is the first conduction type (in the case of a MOSFET) or the second conduction type (in the case of an IGBT). The second semiconductor region is provided in a surface region of the first semiconductor region along the first electrode. The second semiconductor region is electrically connected to the first electrode. A second conduction type third semiconductor region is provided in a surface region of the first semiconductor region along the second electrode. The third semiconductor region is provided separated from the second semiconductor region. The third semiconductor region is electrically connected to the second electrode. A first conduction type fourth semiconductor region is provided in a surface region of the third semiconductor region along the second electrode. The fourth semiconductor region is electrically connected to the second electrode. The gate electrode is provided, with the gate insulating film intervening, on the surface of the third semiconductor region, between the fourth semiconductor region and the first semiconductor region. A local insulating film is provided on the surface of the first semiconductor region on the opposite side of the third semiconductor region to the first electrode. The local insulating film is provided in contact with the third semiconductor region. The first dielectric isolation region extends from the local insulating film, penetrating the first semiconductor region to reach the buried insulating layer. The isolation semiconductor region is of the first conduction type, and is provided on the side opposite the first semiconductor region, with the first dielectric isolation region intervening. A third electrode is electrically connected to the isolation semiconductor region. The third electrode is at the same potential as the second electrode.

According to this invention, the isolation semiconductor region functions similarly to the supporting substrate, and when a high voltage is applied to the second semiconductor region, depletion of the first semiconductor region occurs proceeding from the interface between the first dielectric isolation region and the first semiconductor region, toward the second semiconductor region. Hence depletion of the first dielectric isolation region can be utilized, so that the on-state breakdown voltage of the element as a whole is improved.

Further, a semiconductor device of this invention, with the above-described cross-sectional structure, is characterized as follows. The planar shape of the third semiconductor region has opposing straight-line portions extending along the first electrode, and arc-shape portions which are at both ends of the straight-line portions and which serve to connect the ends. The depth of the third semiconductor region in these arc-shape portions is shallower than the depth of the third semiconductor region in the straight-line portions.

According to this invention, the lateral-direction area of the junction between the third semiconductor region in the arc-shape portions and the first semiconductor region is reduced, so that the effect of depletion of the first semiconductor region in the arc-shape portions is weakened. By this means, the extent of depletion of the first semiconductor region in the arc-shape portions approaches the extent of depletion of the first semiconductor region in the straight-line portions, so that a balance is maintained between the breakdown voltages of the arc-shape portions and the breakdown voltages of the straight-line portions. Hence the off-state breakdown voltage and the on-state breakdown voltage of the element as a whole are improved. Further, in order to prevent lowering of the breakdown voltage in the arc-shape portions of a track-shape planar layout, there is no need to make the length of the first semiconductor region in the arc-shape portions (see FIG. 54; length L2 in the figure) longer than the length of the first semiconductor region in the straight-line portions (see FIG. 54; length L1 in the figure).

Further, in the above-described invention, a multichannel semiconductor device may have a trench gate structure instead of a planar gate structure. In such a planar layout, the first gate electrode of the planar gate structure has a closed planar shape, arranged so as to surround the first semiconductor region. The second gate electrode of the trench gate structure is arranged so as to extend in a straight-line shape along the straight-line portion of the second electrode. The first dielectric isolation region has a closed planar shape, and is arranged so as to surround the second gate electrode and second electrode.

The cross-sectional structure is as follows. The first gate electrode is provided, with the gate insulating film intervening, on the surface of the third semiconductor region, between the fourth semiconductor region and the first semiconductor region. A first conduction type fifth semiconductor region is provided in a surface region of the third semiconductor region along the second electrode. The fifth semiconductor region is electrically connected to the second electrode. The trench of the second gate electrode is provided in contact with the fifth semiconductor region, penetrating the third semiconductor region to reach the first semiconductor region. The second gate electrode is provided on the inside of this trench, with the second gate insulating film intervening.

Further, in the above-described invention, a planar layout may be employed in which a compound structure, having a plurality of unit structures each comprising a first electrode, gate electrode, and second electrode, are arranged within a closed region of the first dielectric isolation region. This cross-sectional structure is characterized as follows. The depth of the third semiconductor region positioned outermost from the compound structure is shallower than the depth of other third semiconductor regions. By means of this configuration, breakdown voltage balance is maintained, so that the breakdown voltages of elements as a whole are improved. Further, the depth of third semiconductor regions in arc-shape portions may be shallower than the depth of straight-line portions in the third semiconductor region positioned outermost from the compound structure. Moreover, the lengths of the portions of the third semiconductor regions and gate insulating film which are in contact are longer in the arc-shape portions than in the straight-line portions of the third semiconductor regions.

Further, in the above-described invention, a planar layout may be employed in which a third dielectric isolation region is arranged between the first dielectric isolation region and the second dielectric isolation region. The third dielectric isolation region is electrically connected to the first dielectric isolation region. The planar shape of the second electrode has opposing straight-line portions extending along the first electrode, and arc-shape portions which are at both ends of the straight-line portions and which serve to connect the ends. The first dielectric isolation region has a closed planar shape which surrounds the second electrode. The third dielectric isolation region is arranged in arc-shape portions of the second electrode. The region between the first dielectric isolation region and the third dielectric isolation region is the second isolation semiconductor region. In the cross-sectional structure thereof, the third dielectric isolation region extends from the local insulating film, penetrating the first isolation semiconductor region to reach the buried insulating layer.

According to this invention, the effect of depletion of the first semiconductor region from the interface between the first dielectric isolation region and the first semiconductor region at the arc-shape portions is weakened, so that a balance is maintained between the breakdown voltage of the arc-shape portions and the breakdown voltage of the straight-line portions. Hence the breakdown voltages of the element as a whole are improved.

Further, a semiconductor device of this invention has a structure which is junction-separated by a semiconductor region extending in the depth direction, and is characterized in having the following planar layout and cross-sectional structure. The above compound structure is arranged in a closed region of a semiconductor region. The compound structure is formed in the first conduction type first semiconductor region provided on the second conduction type semiconductor substrate. The isolation semiconductor region penetrates the first semiconductor region and reaches the second conduction type semiconductor region. The depth of the third semiconductor region positioned outermost from the compound structure is shallower than the depth of the other third semiconductor regions. By means of this configuration, a balance of breakdown voltages is maintained, and so the breakdown voltages of elements as a whole are improved.

Further, a semiconductor device of this invention has a trench isolation structure, and is characterized in having the following planar layout and cross-sectional structure. The compound structure is arranged in a closed region of a trench isolation structure. The compound structure is formed in a first conduction type first semiconductor region provided on a second conduction type semiconductor substrate. The trench isolation structure penetrates the first semiconductor region and reaches to the second conduction type semiconductor substrate. The depth of a third semiconductor region positioned outermost from the compound structure is shallower than the depth of the other third semiconductor regions. By means of this configuration, a balance of breakdown voltages is maintained, and so the breakdown voltages of elements as a whole are improved.

In this invention, a second conduction type low-resistance region may be provided below third semiconductor regions positioned near the center of the compound structure, between the first semiconductor region and the second conduction type semiconductor substrate. By means of this configuration, still better balance of breakdown voltages is maintained, so that the breakdown voltages of elements as a whole are improved.

Further, a semiconductor device of this invention has a trench isolation structure, and is characterized in having the following planar layout and cross-sectional structure. The compound structure is arranged in a closed region of a trench isolation structure. The compound structure is formed in a first conduction type first semiconductor region provided on a second conduction type semiconductor substrate. The trench isolation region penetrates the first semiconductor region and reaches the second conduction type semiconductor substrate. A second conduction type low-resistance region is provided below the third semiconductor region positioned near the center of the compound structure, between the first semiconductor region and the second conduction type semiconductor substrate. By means of this configuration, a balance of breakdown voltages is maintained, and so the breakdown voltages of elements as a whole are improved.

By means of a semiconductor device of this invention, there is the advantageous result that the breakdown voltages of elements as a whole can be improved, while suppressing increases in cell area.

Other features, advantages, embodiments, etc. of the invention will become apparent to those skilled in the art from the following detailed description of the preferred embodiments of the invention.

BRIEF DESCRIPTION OF THE DRAWINGS

The invention will be described in detail with reference to certain preferred embodiments thereof and the accompanying drawings.

DESCRIPTION OF THE PREFERRED EMBODIMENTS

Below, preferred aspects of a semiconductor device of this invention are explained in detail, referring to the attached drawings. Here, explanations are given taking an IGBT as an example of the semiconductor device. In the following explanations of aspects and attached drawings, similar components are assigned the same symbols, and redundant explanations are omitted.

Embodiment 1

Figure 1:
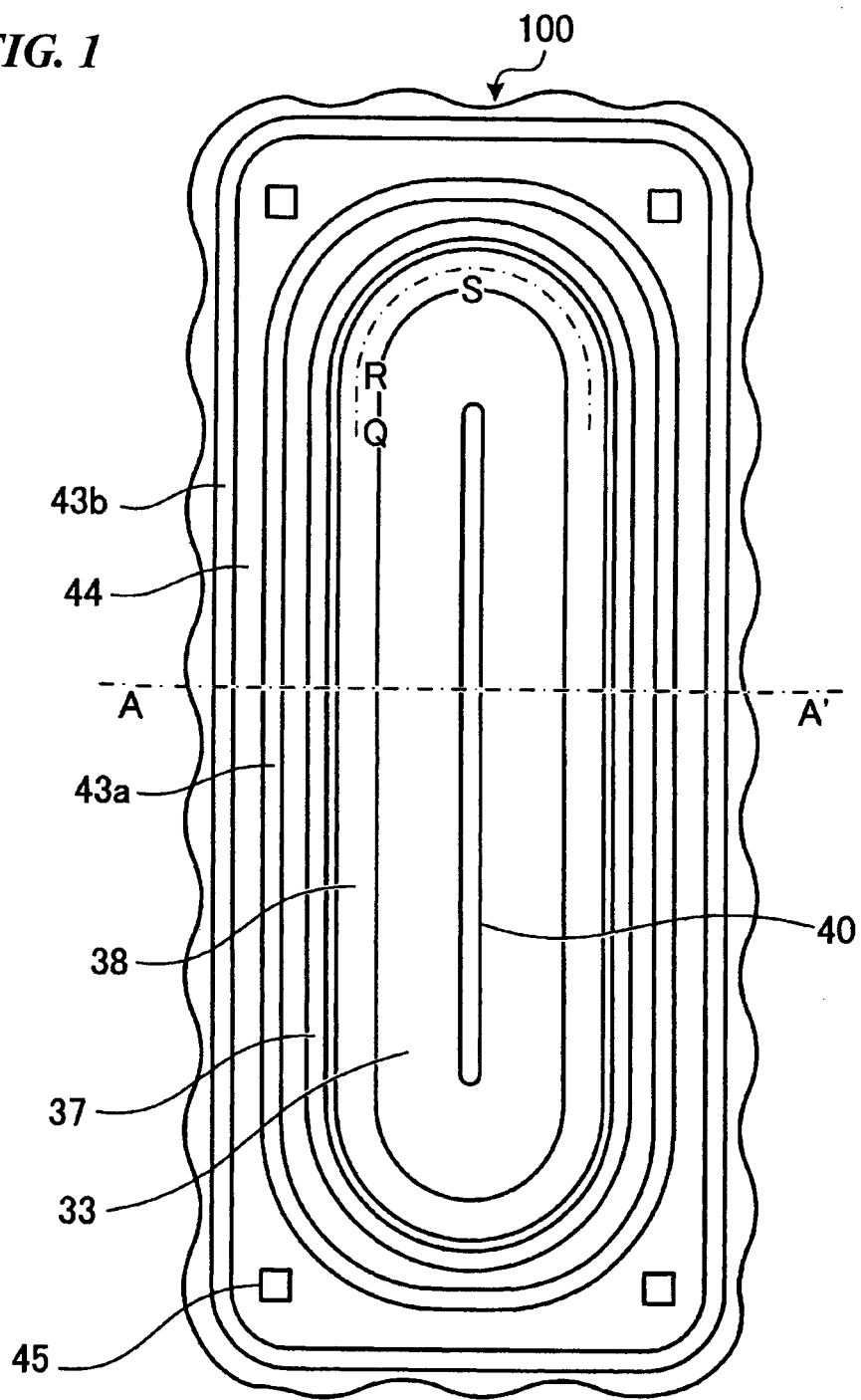
FIG. 1 is a plane view showing the planar layout of the IGBT of Embodiment 1.

FIG. 1 is a plane view showing the planar layout of the IGBT of Embodiment 1 of the invention. As shown in FIG. 1, in the planar layout of the IGBT 100, the collector electrode (first electrode) 40 extends in a straight-line shape. The gate electrode 38 has a track shape, and surrounds the collector electrode 40. The region between the collector electrode 40 and the gate electrode 38 is an n⁻ drift region (first semiconductor region) 33. The emitter electrode (second electrode) 37 has a track shape, and surrounds the gate electrode 38. The emitter electrode 37 is surrounded by a first isolation trench (first dielectric isolation region) 43a.

The first isolation trench 43a has for example a track shape, and is surrounded by a second isolation trench (second dielectric isolation region) 43b. The first isolation trench 43a and second isolation trench 43b comprise insulating films extending in the depth direction (the direction perpendicular to the drawing of FIG. 1). The region between the first isolation trench 43a and second isolation trench 43b is an n-type isolation silicon region (isolation semiconductor region) 44. The isolation silicon region 44 is at the same potential as the emitter electrode 37 due to a short-circuiting electrode (third electrode) 45.

Figure 2:
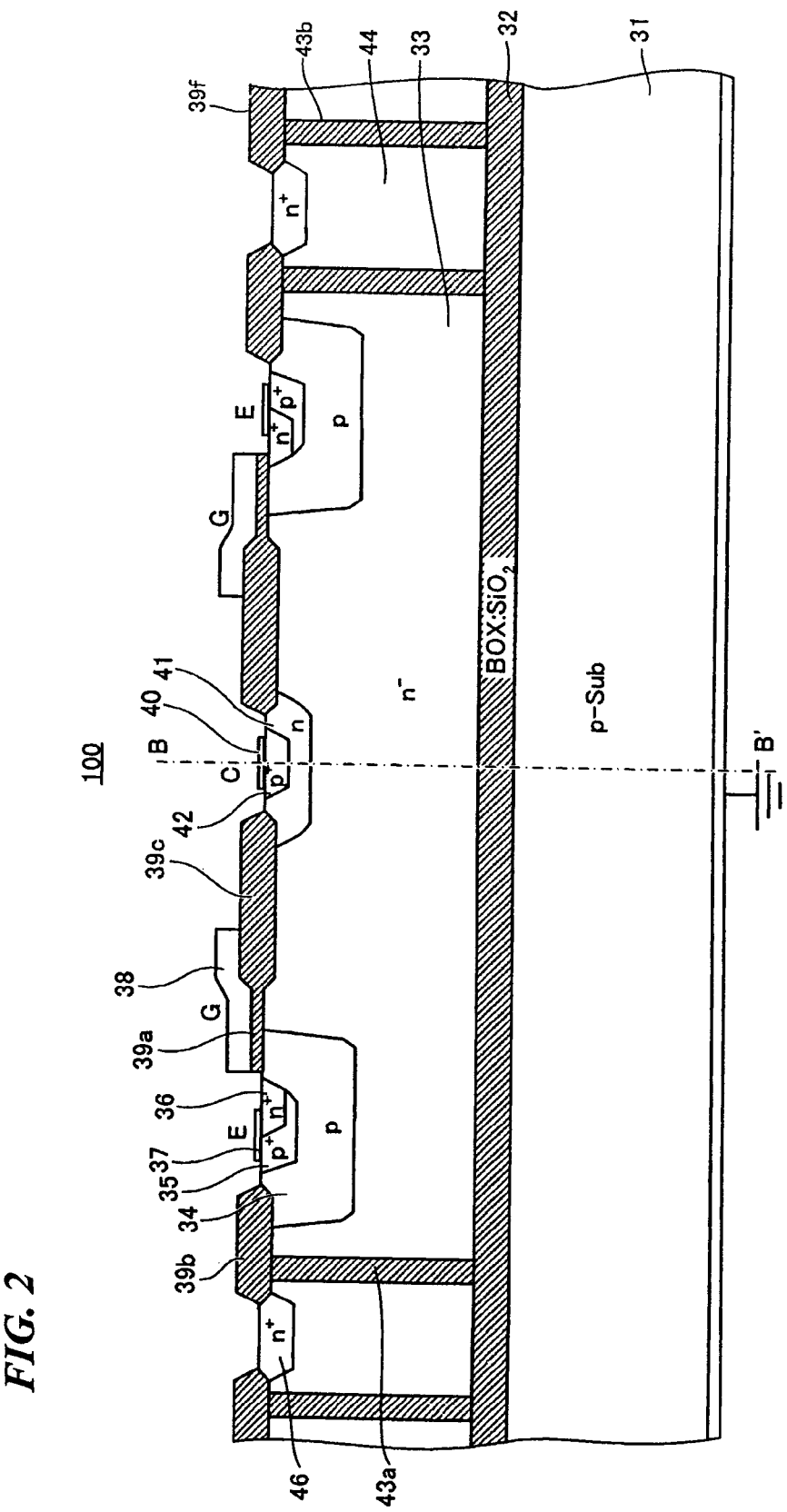
FIG. 2 is a cross-sectional view showing the configuration at section line A-A' in FIG. 1.

FIG. 2 is a cross-sectional view showing the configuration at section line A-A' in FIG. 1. This section line A-A' traverses the straight-line shape portion of the track shape in the region on the inside of the second isolation trench 43b. As shown in FIG. 2, the IGBT 100 is manufactured using an SOI substrate. The SOI substrate is formed by layering a buried oxide film 32 on a supporting substrate 31, then layering, on top of this, a high-resistivity n-type semiconductor layer. This n-type semiconductor layer becomes the n⁻ drift region 33 and isolation silicon region 44. The n⁻ drift region 33 is the region of the SOI substrate n-type semiconductor layer on the inside of the first isolation trench 43a. The isolation silicon region 44 is the region of the SOI substrate n-type semiconductor layer outside the first isolation trench 43a.

An n buffer region 41 is provided in the center portion of the surface region of the n⁻ drift region 33. A p⁺ collector region (second semiconductor region) 42 is provided in a surface region of the n buffer region 41. The collector electrode (C) 40 is provided in contact with the surface of the p⁺ collector region 42. The collector electrode 40 is electrically connected to the p⁺ collector region 42. The p⁺ collector region 42 and n buffer region 41 are provided along the collector electrode 40.

A p base region (third semiconductor region) 34 is provided in a surface region of the n⁻ drift region 33, separated from the n buffer region 41. An n⁺ emitter region (fourth semiconductor region) 36 is provided in a surface region of the p base region 34. A p⁺ contact region 35 is provided on a surface region of the p base region 34 in contact with the n⁺ emitter region 36. The emitter electrode (E) 37 is provided in contact with both the n⁺ emitter region 36 and with the p⁺ contact region 35. The emitter electrode 37 is electrically connected to the n⁺ emitter region 36. The emitter electrode 37 is also electrically connected to the p base region 34 via the p⁺ contact region 35. The p base region 34, p⁺ contact region 35 and n⁺ emitter region 36 are provided along the emitter electrode 37.

The gate electrode (G) 38 is provided, with the gate insulating film 39a intervening, on the surface of the p base region 34, between the n⁺ emitter region 36 and the n⁻ drift region 33. A first LOCOS oxide film 39c is provided on the surface of the n⁻ drift region 33, between the gate insulating film 39a and the p⁺ collector region 42. A second LOCOS oxide film (local insulating film) 39b is provided, in contact with the p base region 34, on the surface of the n⁻ drift region 33 on the side of the p base region 34 opposite the collector electrode 40. Third LOCOS oxide film (local insulating film) 39f is in contact with isolation silicon region 44 and the second isolation trench 43b.

The first isolation trench 43a comprises a trench extending from the second LOCOS oxide film 39b, penetrating the n⁻ drift region 33 and reaching the buried oxide film 32, and an oxide film or other insulating film buried within this trench. Hence the n⁻ drift region 33 is insulated and separated from the periphery by the first isolation trench 43a and the buried oxide film 32. An n-type low-resistance region 46 is provided in a surface region of the isolation silicon region 44. The short-circuiting electrode 45 is provided in contact with the surface of the low-resistance region 46. The short-circuiting electrode 45 is electrically connected to the isolation silicon region 44 via the low-resistance region 46. The short-circuiting electrode 45 and low-resistance region 46 are for example provided in the four corner portions of the isolation silicon region 44 (see FIG. 1), and so does not appear in the cross-section of FIG. 2 (and similarly for FIG. 6, FIG. 8, FIG. 15, FIG. 33, FIG. 37, FIG. 46, and FIG. 50).

The IGBT 100 has a structure which is symmetric with respect to the axis of symmetry passing through the collector electrode 40 (line B-B' in FIG. 2). The supporting substrate 31 is grounded. The n buffer region 41, $p^+$ collector region 42, LOCOS oxide films 39b and 39c, gate insulating film 39a, $p^+$ contact region 35, $n^+$ emitter region 36, p base region 34, and low-resistance region 46 are omitted in FIG. 1.

Figure 3:
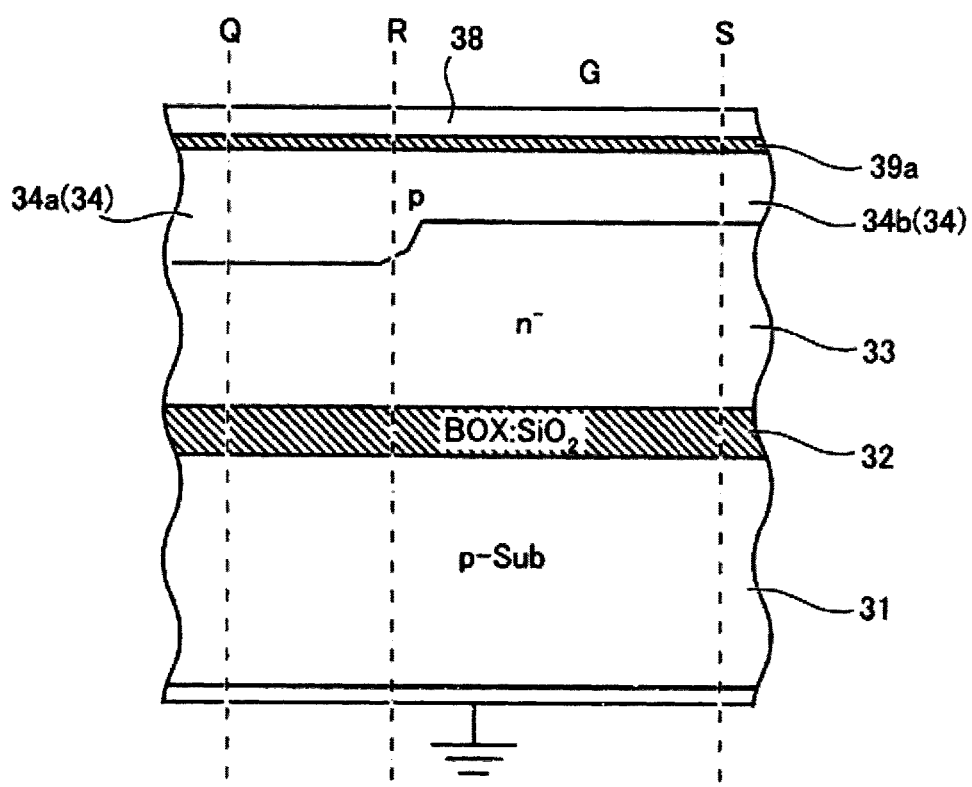
FIG. 3 is a cross-sectional view showing the configuration at section line Q-R-S in FIG. 1.

FIG. 3 is a cross-sectional view showing the configuration at the section line Q-R-S in FIG. 1. The section line Q-R-S passes through the gate electrode 38, and the portion between Q and R corresponds to the straight-line shape portion of the gate electrode 38, while the portion between R and S corresponds to the arc-shape portion of the gate electrode 38. The planar shape of the p base region 34 is a track shape, similar to that of the emitter electrode 37. As shown in FIG. 3, the depth of the p base region 34b in the arc-shape portions of this track shape (hereafter called the arc-shape portion p base region 34b) is shallower than the depth of the p base region 34a in the straight-line portions (hereafter called the straight-line portion p base region 34a).

In general, a plurality of diffusion layers are provided in a power IC. Hence the manufacturing process thereof comprises a plurality of processes of forming diffusion layers. For example, a p-type well for use in forming high-threshold high-breakdown voltage elements, a p-type well for use in forming low-threshold CMOS (Complementary Metal Oxide Semiconductor) elements, and similar are provided. Hence when forming the p base region 34, by appropriately including processes to form different p-type diffusion layers, the threshold value of the straight-line portion p base regions 34a and the threshold value of the arc-shape portion p base regions 34b can be made substantially the same.

Figure 53:
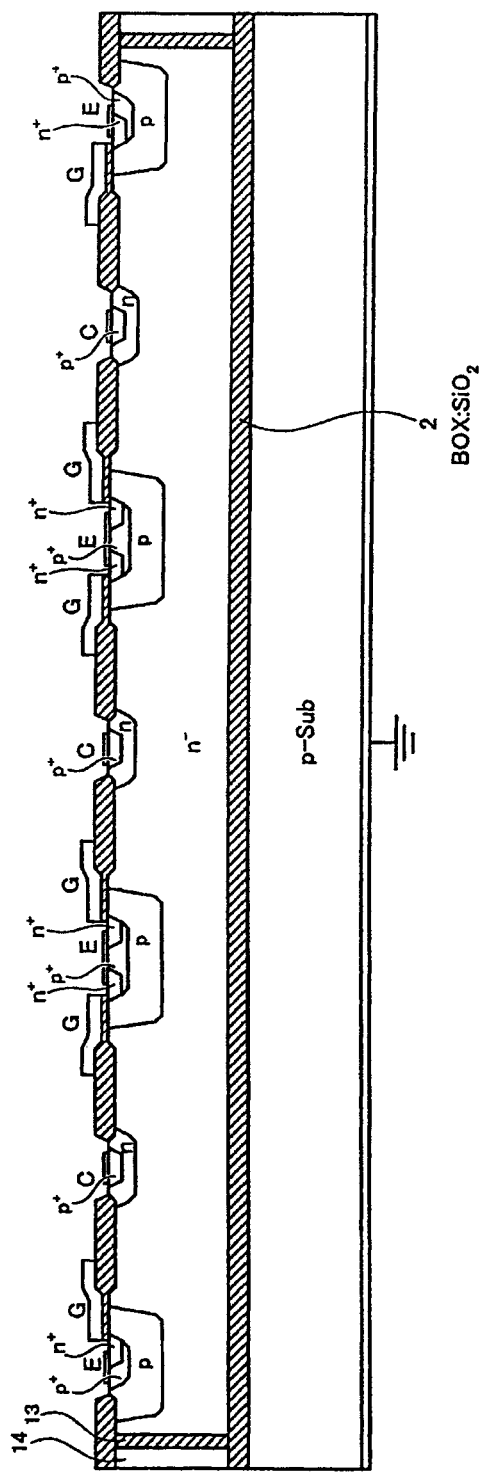
FIG. 53 is a cross-sectional view showing the configuration of a multicell-structure IGBT of the prior art.
Figure 54:
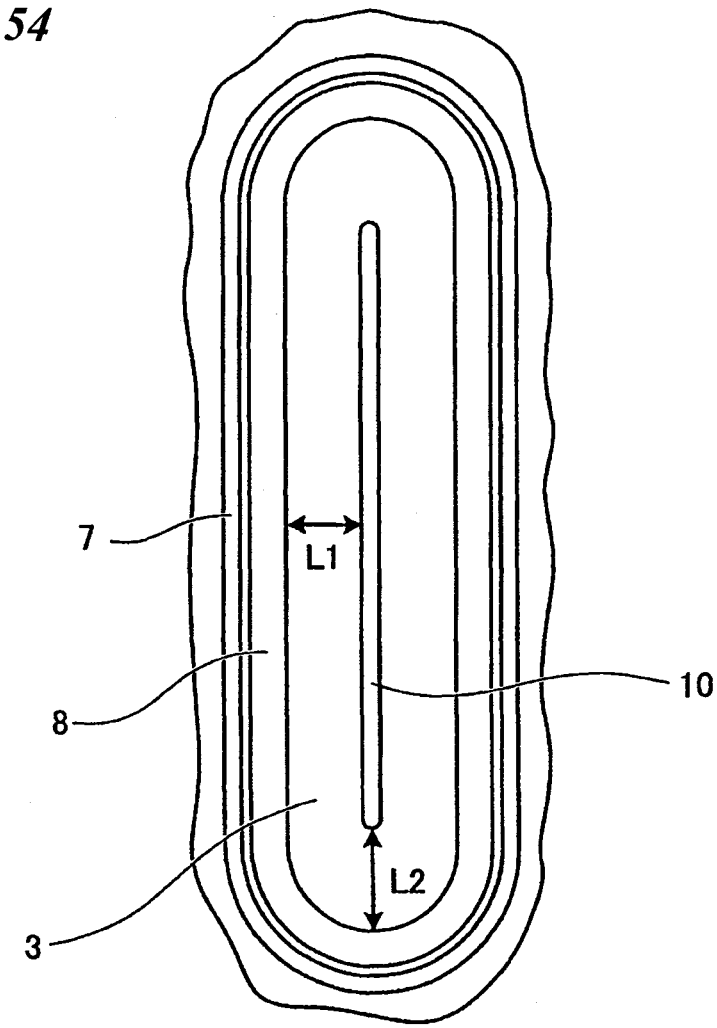
FIG. 54 is a plane view showing the planar layout of an IGBT of the prior art.
Figure 55:
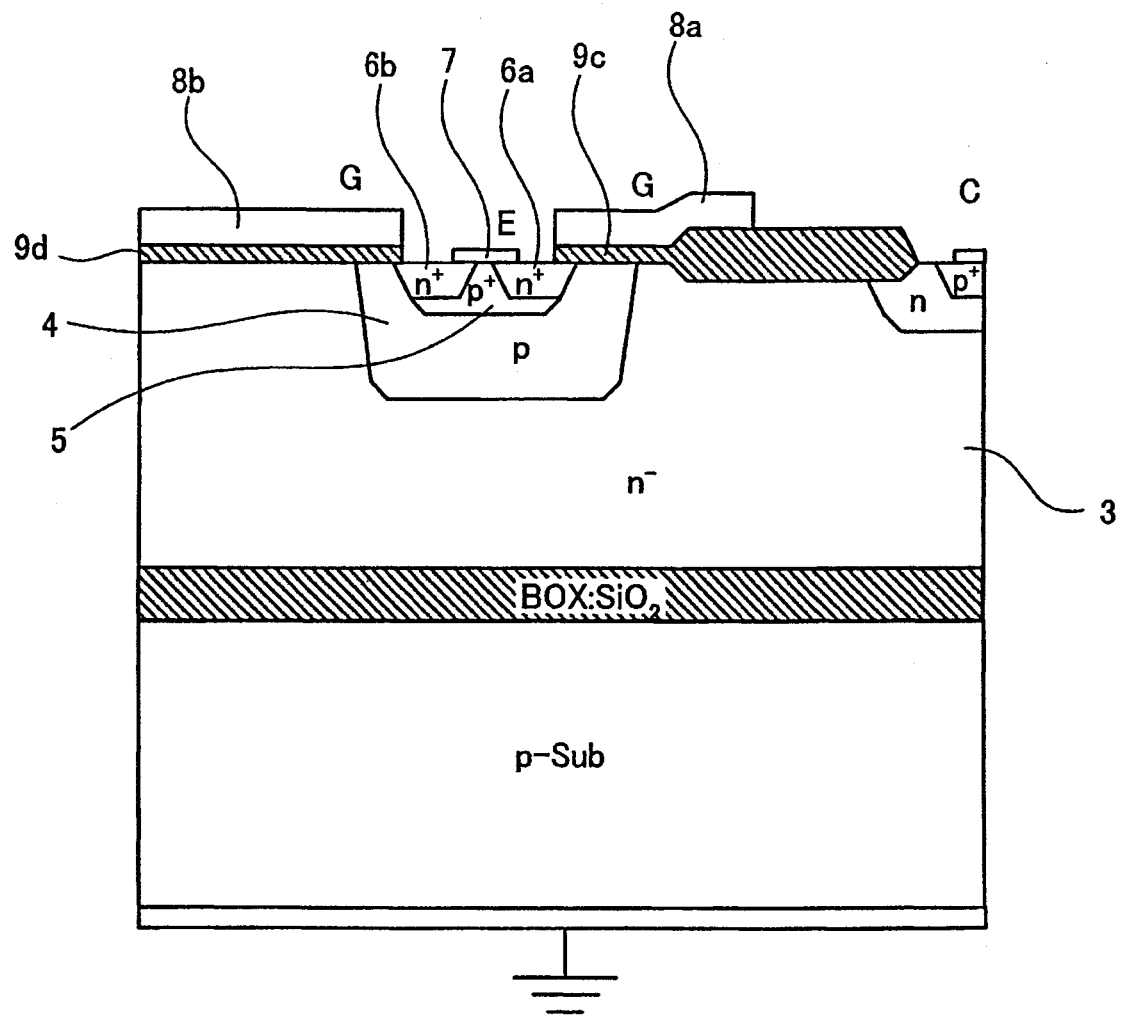
FIG. 55 is a cross-sectional view showing the configuration of a multichannel-structure IGBT of the prior art.

In the on state, as indicated by equation (1) above, the effective donor concentration rises in the vicinity of the n buffer region 41 due to hole injection. Hence depletion in the $n^-$ drift region is more difficult than in the off state. In the configuration of the prior art shown in FIG. 53, there is no isolation silicon region 14, or even if there is an isolation silicon region 14, when the adjacent element overall is used on the high side, the effect of depletion from the isolation silicon region 14 is zero or is small, so that the element on-state breakdown voltage falls. On the other hand, in the configuration of Embodiment 1 there is an isolation silicon region 44, low-resistance region 46, and short-circuiting electrode 45, so that a higher on-state voltage than in the prior art is obtained.

Figure 4:
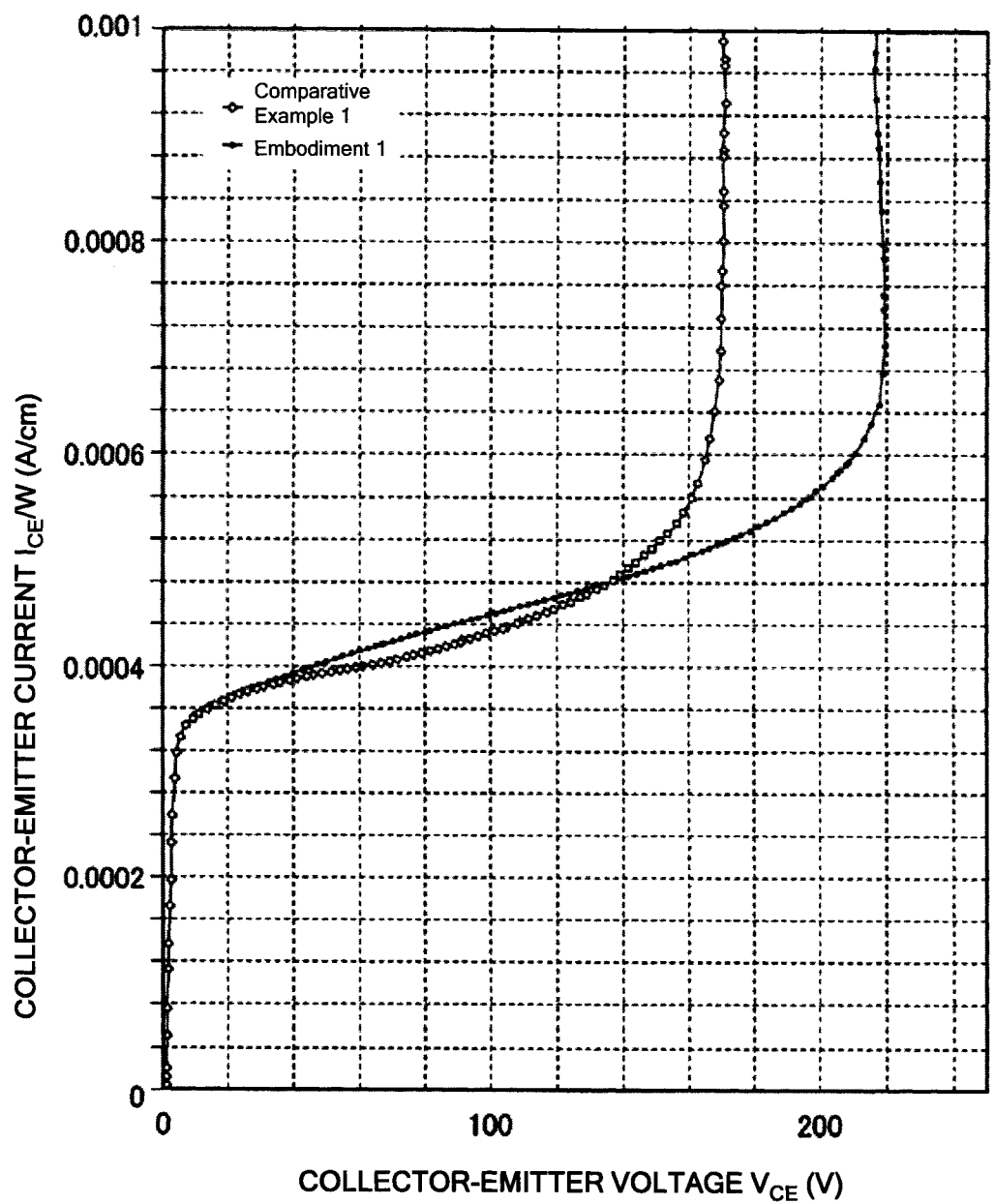
FIG. 4 is a characteristic diagram showing simulation results for the on-state voltage in Embodiment 1.

FIG. 4 is a characteristic diagram showing simulation results for the on-state voltage in Embodiment 1. In FIG. 4, Practical Example 1 shows the on-state breakdown voltage for the straight-line portions of the track shape in FIG. 1 in an IGBT with the configuration shown in FIG. 2; Comparative Example 1 shows the breakdown voltage of an IGBT configured without the isolation silicon region 44, low-resistance region 46 or short-circuiting electrode 45 in the configuration of FIG. 2. Otherwise the configuration is the same in Practical Example 1 and Comparative Example 1. The thickness of the $n^-$ drift region 33 is 14 μm, and the distance from the p base region 34 to the n buffer region 41 is approximately 13 μm. Also, the concentration in the $n^-$ drift region 33 is $4\times10^{14}$ $cm^{-3}$. A voltage of 5 V is applied to the gate electrode 38. From FIG. 4 it is seen that in Practical Example 1, the straight-line portions of the track shape have an on-state breakdown voltage which is 50 V higher than in Comparative Example 1.

According to Embodiment 1, the isolation silicon region 44 is at the same potential as the emitter electrode 37, so that the isolation silicon region 44 functions similarly to the supporting substrate 31. As a result, when a high voltage is applied to the $p^+$ collector region 42, depletion of the $n^-$ drift region 33 occurs from the interface between the first isolation trench 43a and the $n^-$ drift region 33 toward the $p^+$ collector region 42. That is, depletion from the first isolation trench 43a can be utilized, so that the on-state breakdown voltage of the element as a whole is improved.

Further, the depth of the arc-shape portion p base region 34b is shallower than the depth of the straight-line portion p base region 34a, so that the lateral-direction junction area of the arc-shape portion p base region 34b and $n^-$ drift region 33 is reduced, and the effect of depletion of the $n^-$ drift region 33 in the arc-shape portions is weakened. As a result, the extent of depletion of the $n^-$ drift region 33 in the arc-shape portions approaches the extent of depletion of the $n^-$ drift region 33 in the straight-line portions, and a balance is maintained between the breakdown voltages of the arc-shape portions and the breakdown voltages of the straight-line portions. Hence the off-state breakdown voltage and the on-state breakdown voltage of the element as a whole are improved. Further, in the arc-shape portions of a track-shape planar layout, even when the length of the $n^-$ drift region 33 in arc-shape portions is not made longer than the length of the $n^-$ drift region 33 in straight-line portions, lowering of the breakdown voltage in the arc-shape portions can be prevented. In this way, there is the advantageous result that breakdown voltages for the element as a whole can be improved, while suppressing increases in cell area.

Embodiment 2

Figure 5:
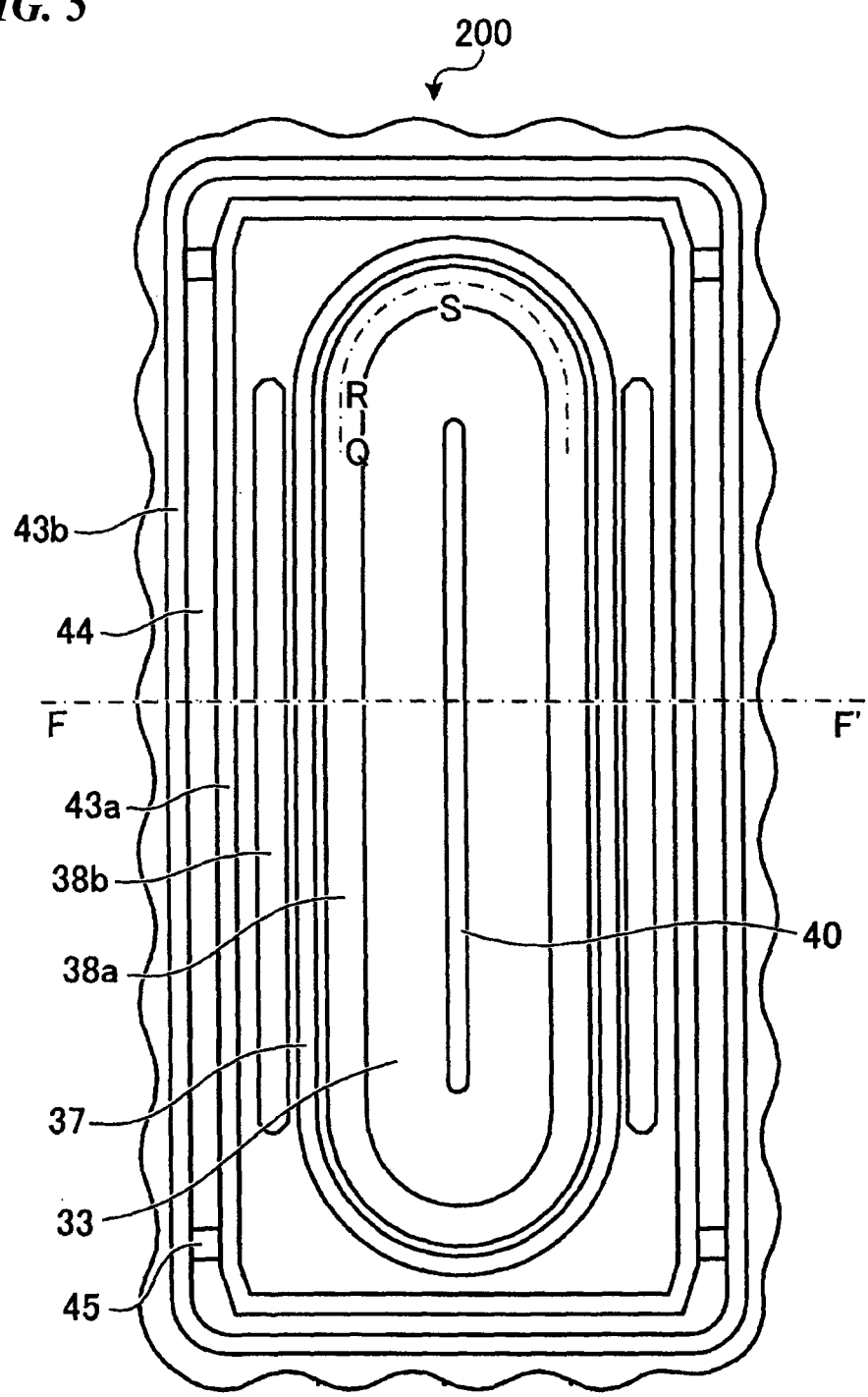
FIG. 5 is a plane view showing the planar layout of the IGBT of Embodiment 2.
Figure 6:
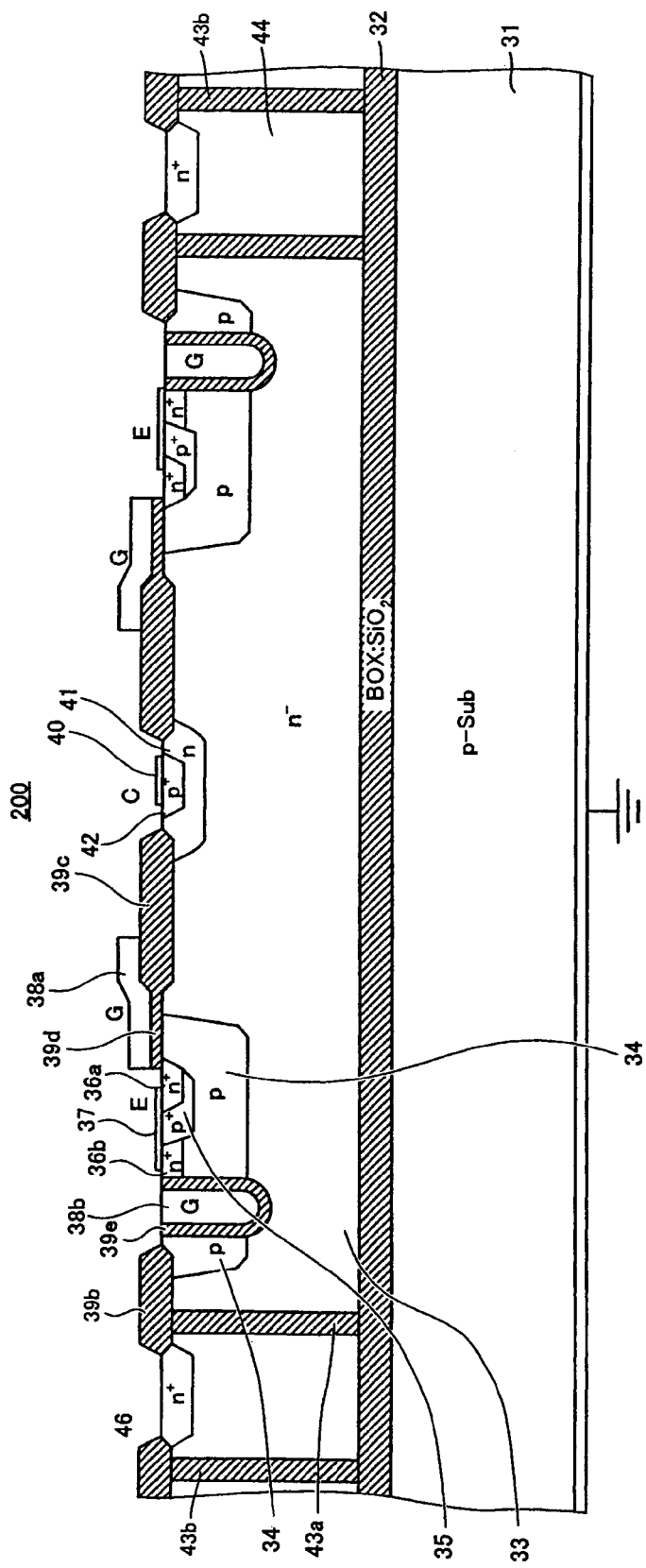
FIG. 6 is a cross-sectional view showing the configuration at section line F-F' in FIG. 5.

FIG. 5 is a plane view showing the planar layout of the IGBT of Embodiment 2 of this invention. FIG. 6 is a cross-sectional view showing the configuration at section line F-F' in FIG. 5. This section line F-F' traverses the straight-line portions of the track shape in the region on the inside of the second isolation trench 43b. The IGBT 200 of Embodiment 2 is a multichannel IGBT having a trench gate structure in addition to a planar gate structure.

As shown in FIG. 5, in the planar layout, the first gate electrode 38a of the planar gate structure is the same as the gate electrode 38 of Embodiment 1. The second gate electrodes 38b of the trench gate structure are arranged only on the outside of and along the straight-line portions of the emitter electrode 37. The second gate electrodes 38b extend in straight lines. The first isolation trench 43a is arranged so as to surround the second gate electrodes 38b and the emitter electrode 37. Otherwise the configuration relating to the planar layout is similar to that of Embodiment 1.

As shown in FIG. 6, in the cross-sectional configuration at the section line F-F', the $n^+$ first emitter region (fourth semiconductor region) 36a is the same as the $n^+$ emitter region 36 in Embodiment 1. The first gate electrode 38a is provided, with the first gate insulating film 39d intervening, on the surface of the p base region 34 between the $n^+$ first emitter region 36a and the $n^-$ drift region 33. The $n^+$ second emitter region (fifth semiconductor region) 36b is provided in a surface region of the p base region 34, on the side of the $p^+$ contact region 35 opposite the $n^+$ first emitter region 36a. The n+ second emitter region 36b is provided along the emitter electrode 37, and is electrically connected to the emitter electrode 37.

The trenches of the second gate electrodes 38b are provided in contact with the n+ second emitter region 36b. This trench penetrates the p base region 34 and reaches the n− drift region 33. The second gate electrodes 38b are provided on the inside of this trench, with the second gate insulating films 39e intervening. Otherwise the configuration relating to the cross-section at section line F-F' in FIG. 5 is the same as in Embodiment 1. Also, the cross-sectional configuration at section line Q-R-S in FIG. 5, passing through the gate electrode 38 and corresponding to a straight-line portion to an arc-shape portion of the gate electrode 38, is the same as in Embodiment 1. By means of Embodiment 2, advantageous results similar to those of Embodiment 1, as well as the advantageous result of improved current performance, are obtained.

Embodiment 3

Figure 7:
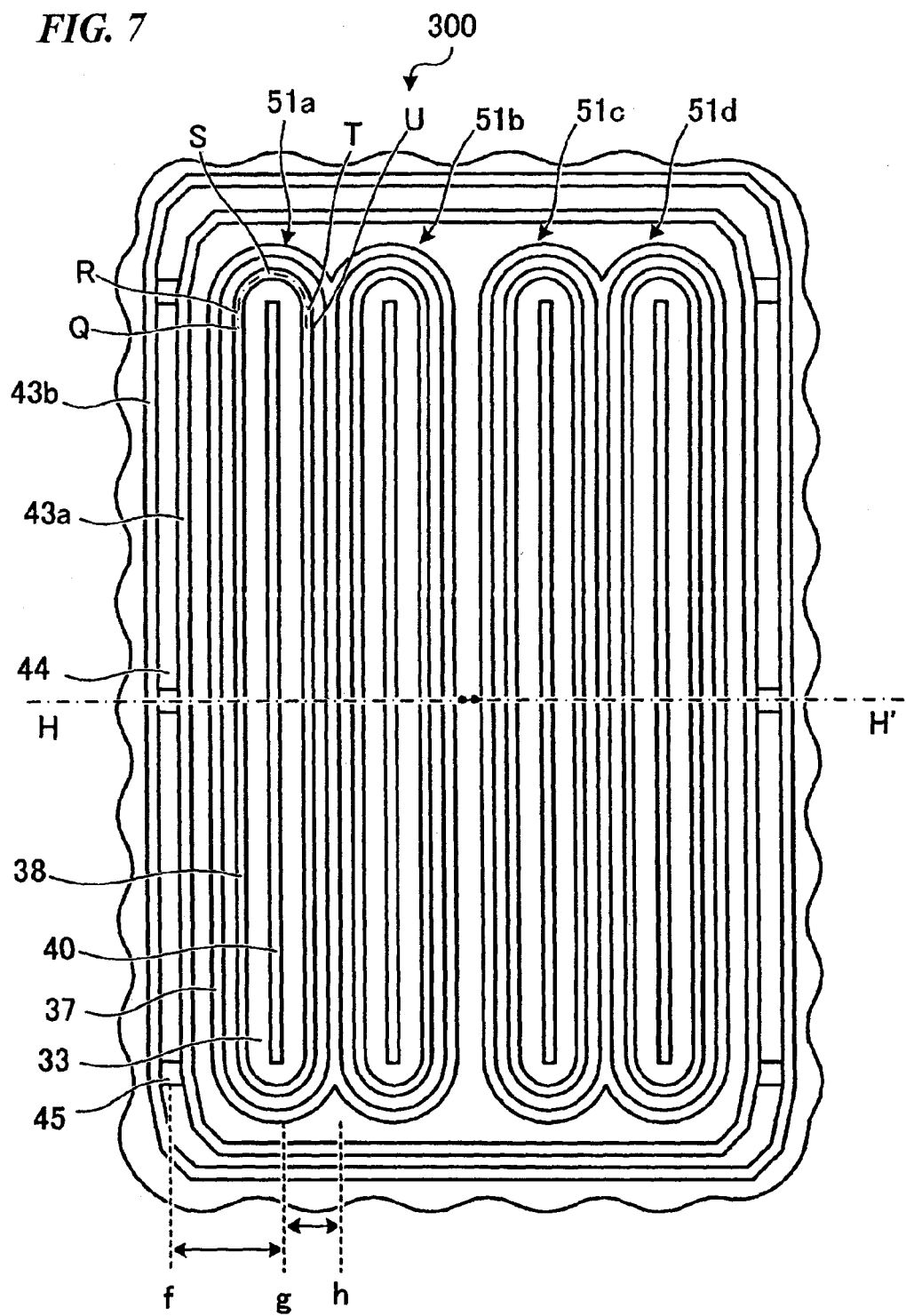
FIG. 7 is a plane view showing the planar layout of the IGBT of Embodiment 3.

FIG. 7 is a plane view showing the planar layout of the IGBT of Embodiment 3 of the invention. The IGBT 300 of Embodiment 3 is a multicell-structure IGBT in which, in the region surrounded by the first isolation trench 43a, a compound structure is arranged, having a plurality of unit structures 51a, 51b, 51c, 51d with a track shape, comprising a collector electrode 40, gate electrode 38, and emitter electrode 37. As shown in FIG. 7, in the planar layout, at portions where adjacent unit structures (51a and 51b, 51c and 51d) are in contact, the emitter electrode 37 is common. Otherwise the configuration relating to the planar layout is similar to that of Embodiment 1.

Figure 8:
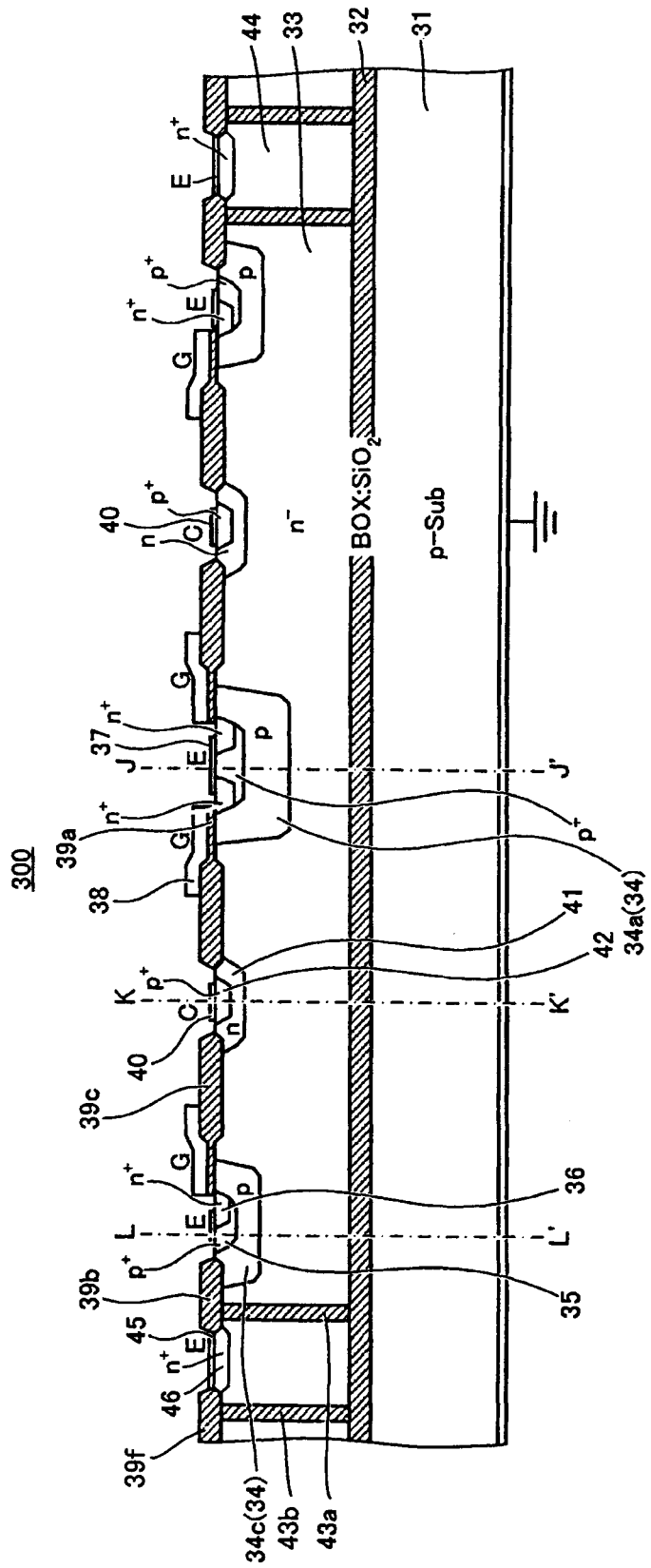
FIG. 8 is a cross-sectional view showing the configuration at section line H-H' in FIG. 7.

FIG. 8 is a cross-sectional view showing the configuration at section line H-H' in FIG. 7. This section line H-H' traverses the straight-line portions of the track shape in the region on the inside of the second isolation trench 43b. For simplicity, FIG. 8 shows a case in which the number of unit structures is two. As shown in FIG. 8, at the cross-sectional configuration at section line H-H', the depth of the p base region 34c outermost from the n− drift region 33, that is, positioned closest to the first isolation trench 43a, is shallower than the depth of the p base region 34a positioned nearer the center.

In FIG. 8, J-J' is an auxiliary line passing through the center emitter electrode 37, K-K' is an auxiliary line passing through the left-side collector electrode 40, and L-L' is an auxiliary line passing through the p base region 34c positioned closest to the first isolation trench 43a. The configuration on the left side from the auxiliary line K-K' is a cross-sectional configuration between a distance between f and g in FIG. 7. In FIG. 8, the configuration between the auxiliary line K-K' and the auxiliary line J-J' is the cross-sectional configuration in the interval g-h in FIG. 7. Except for the fact that the depths of the p base regions 34a and 34c are different, the configuration in the interval between the auxiliary line L-L' and the auxiliary line K-K', and the configuration in the interval between the auxiliary line J-J' and the auxiliary line K-K', are the same.

Further, when in FIG. 8 the number of unit structures is m (where m is an integer equal to or greater than three), a combination of the configuration in the interval between the auxiliary line K-K' and the auxiliary line J-J', and the symmetric configuration which has as symmetry axis the auxiliary line J-J', is repeatedly arranged [m−1] times between the outermost pair of collector electrodes 40. Otherwise the configuration relating to the cross-sectional configuration at the section line H-H' in FIG. 7 is similar to that of Embodiment 1.

The effect of depletion from the isolation silicon region 44 extends to the region between the auxiliary line K-K' and the auxiliary line J-J'.

Figure 9:
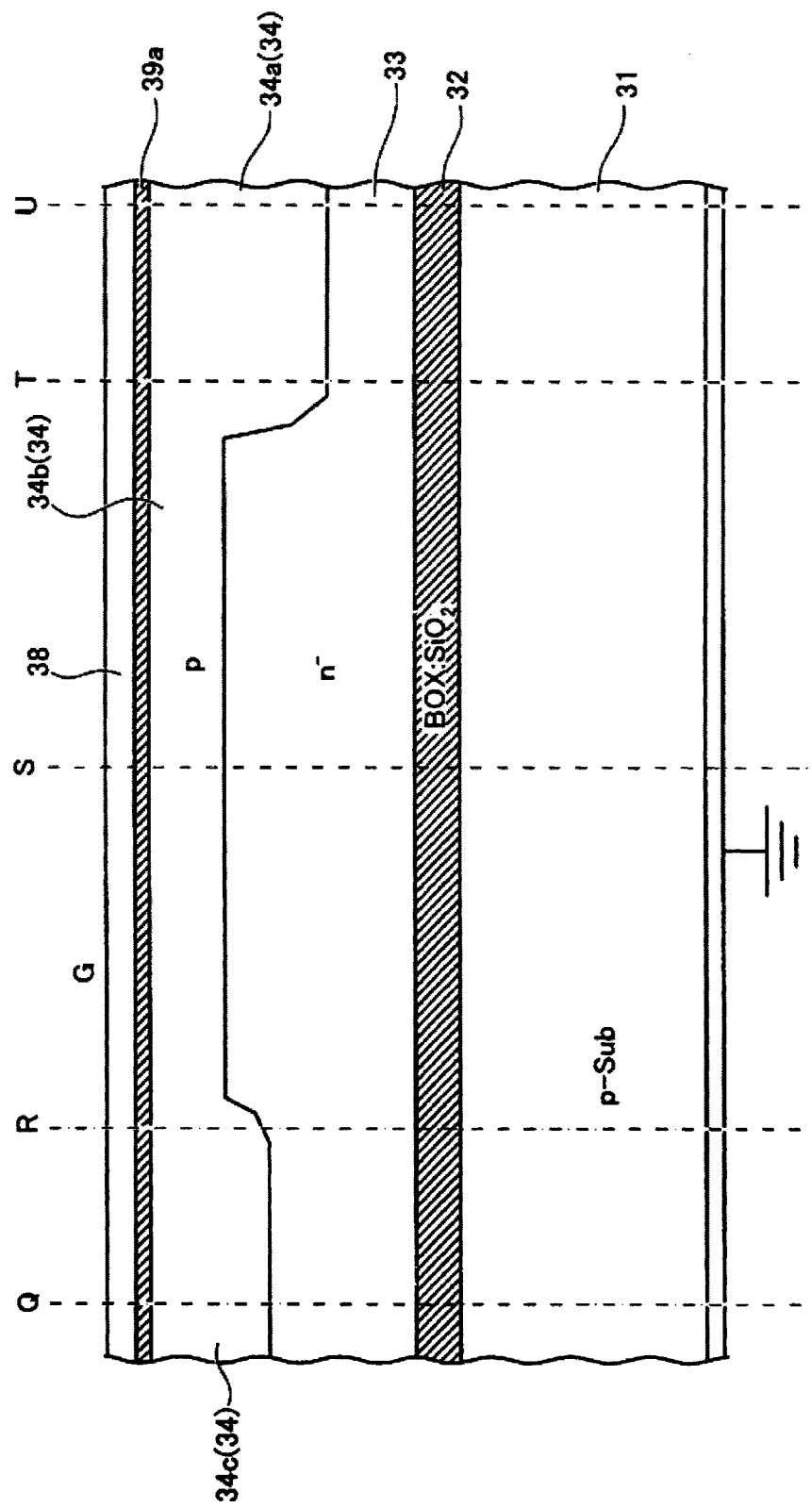
FIG. 9 is a cross-sectional view showing the configuration at section line Q-R-S-T-U in FIG. 7.

FIG. 9 is a cross-sectional view showing the configuration at section line Q-R-S-T-U in FIG. 7. The section line Q-R-S-T-U passes through the gate electrode 38; the portion between Q and R corresponds to the outermost straight-line portion of the gate electrode 38, the portion from R passing through S to T corresponds to the arc-shape portion of the gate electrode 38, and the portion between T and U corresponds to the center straight-line portion of the gate electrode 38. As shown in FIG. 9, the depth of the arc-shape portion p base region 34b is shallower than the depth of the p base region 34c at the outermost straight-line portions (hereafter, the outside straight-line portion p base region 34c), and shallower than the depth of the center straight-line portion p base region 34a (hereafter the center straight-line portion p base region 34a).

In this case also, similarly to Embodiment 1, by appropriately combining a plurality of diffusion layer formation processes comprised by power IC manufacturing processes, and forming the p base region 34, the threshold of the outside straight-line portion p base regions 34c, the threshold of the center straight-line portion p base regions 34a, and the threshold of the arc-shape portion p base regions 34b can be made substantially the same. By means of Embodiment 3, advantageous results similar to those of Embodiment 1 are obtained. Further, the center straight-line portion p base regions 34a are deeper than the outside straight-line portion p base regions 34c, so that breakdown voltage balance is maintained. Hence the breakdown voltages of the element as a whole are improved.

Figure 10:
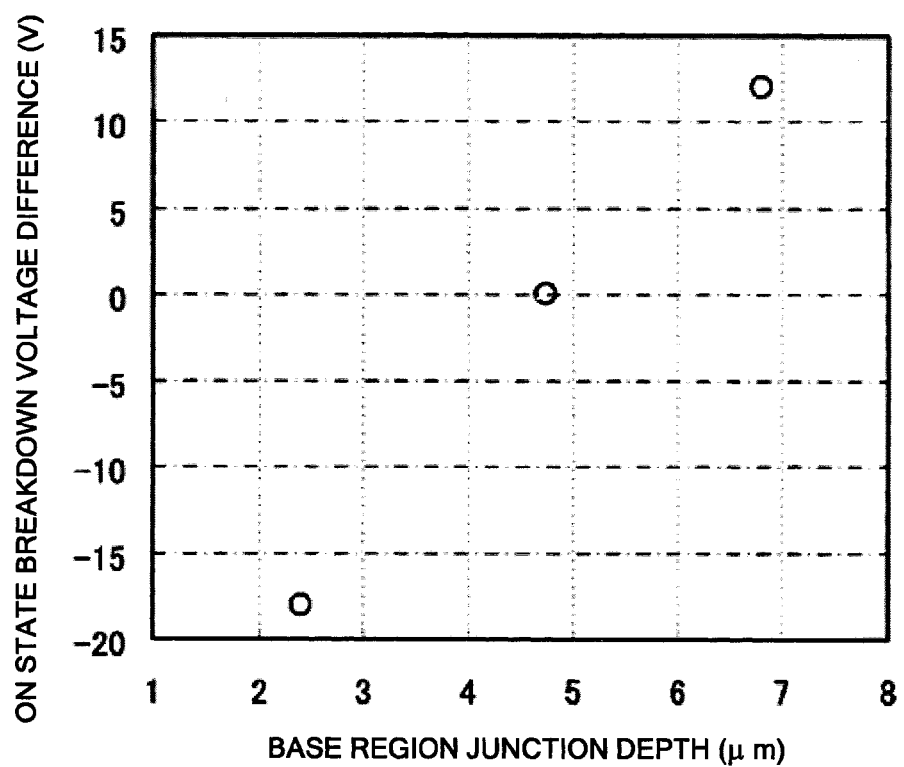
FIG. 10 is a characteristic diagram showing simulation results for the on-state voltage in Embodiment 3.

FIG. 10 is a characteristic diagram showing simulation results for the on-state voltage in Embodiment 3, and shows the difference in on-state breakdown voltages in the structure between the auxiliary line K-K' and the auxiliary line J-J' when the junction depth Xj of the center straight-line portion p base region 34a is varied, in the configuration shown in FIG. 8. 5 V are applied to the gate electrode 38. From FIG. 10, it is seen that when Xj is increased from 2.4 μm to 6.8 μm, the on-state breakdown voltage is improved by approximately 30 V.

Figure 11:
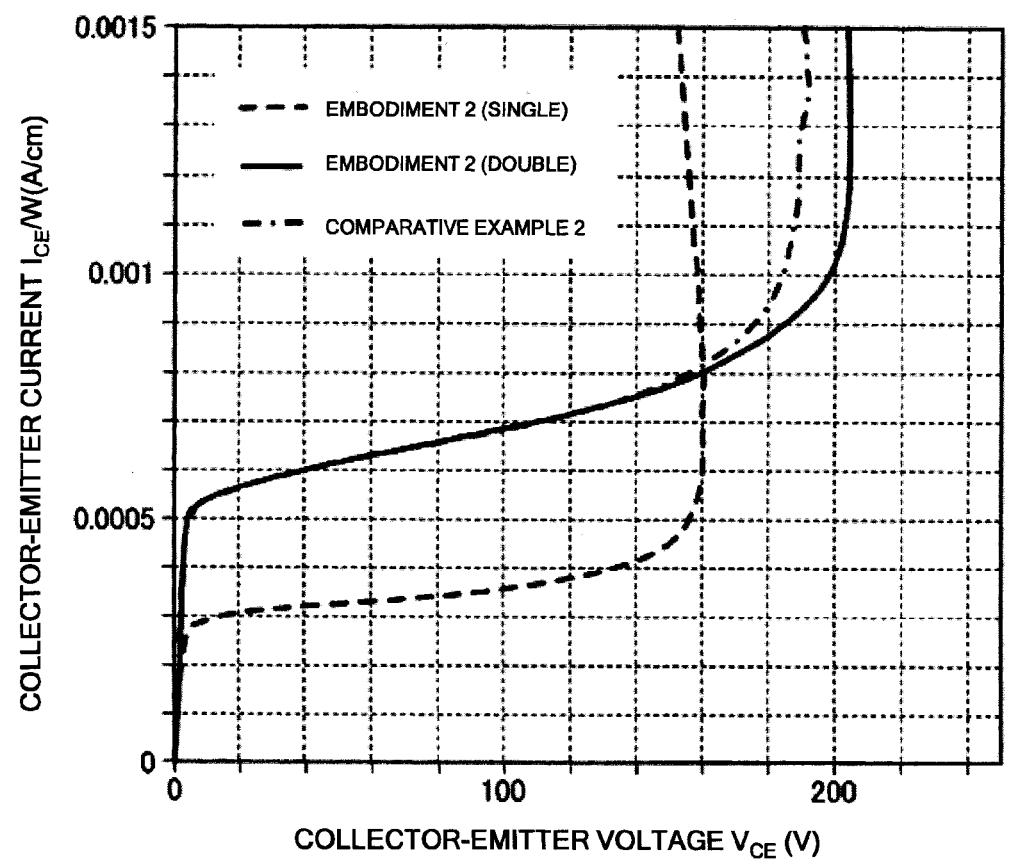
FIG. 11 is a characteristic diagram showing simulation results for the on-state voltage in Embodiment 3.

FIG. 11 is a characteristic diagram showing simulation results for the on-state voltage in Embodiment 3. In FIG. 11, the Practical Example 2 (single) characteristic indicates the on-state breakdown voltage in the structure between the auxiliary line J-J' and the auxiliary line K-K' in the configuration shown in FIG. 8, which is the straight-line portion of the track shape of FIG. 7. The characteristics for Practical Example 2 (double) and Comparative Example 2 indicate the on-state breakdown voltage in the structure from the isolation silicon region 44 on the left side of the configuration shown in FIG. 8 to the auxiliary line J-J'. However, in the case of Practical Example 2 (double), the center straight-line portion p base region 34a is deeper than the outside straight-line portion p base region 34c, but in Comparative Example 2, they are the same depth. From FIG. 11 it is seen that in Practical Example 2 (double) and Comparative Example 2, the number of channels is twice that in Practical Example 2 (single), so that approximately twice the current flows. Also, it is seen that Practical Example 2 (double) has a higher on-state breakdown voltage than Comparative Example 2.

Figure 56:
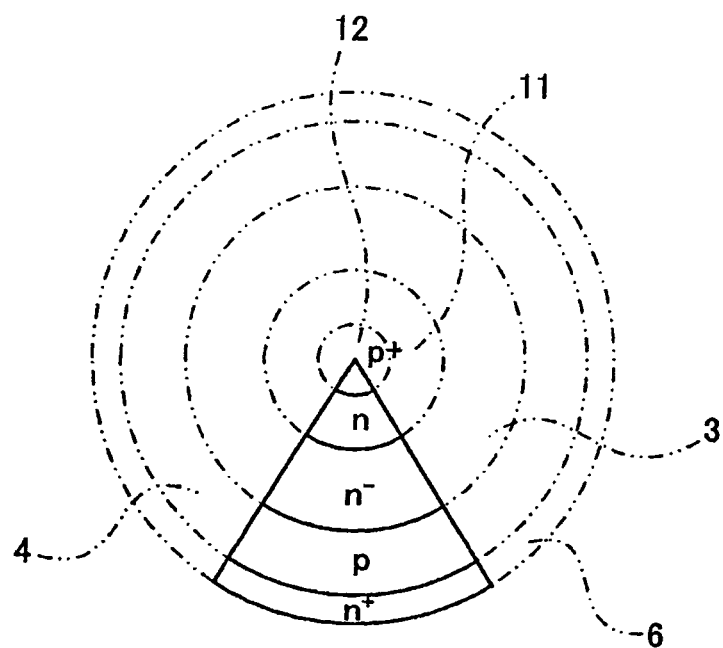
FIG. 56 is an explanatory diagram explaining that the breakdown voltage is determined by arc-shape portions of a track shape; and, FIG. 57 is an explanatory diagram explaining that the breakdown voltage is determined by arc-shape portions of a track shape.
Figure 57:
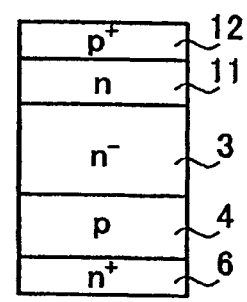

In Embodiment 3, the length of the portion in which the arc-shape portion p base region 34b and the gate insulating film 39a overlap (channel length) may be made longer than the lengths of the portion in which the straight-line portion p base regions 34a, 34c and the gate insulating film 39a overlap (channel lengths). In this case, the gate driving current in the arc-shape portions is limited. Hence the extent of drift region current concentration in the arc structure explained referring to FIG. 56 can be relaxed. In FIG. 9, the depth of the arc-shape portion p base regions 34b is made shallower than the center straight-line portion p base regions 34a; but the center straight-line portion p base regions 34a and the arc-shape portion p base regions 34b may be made the same depth. In this case, it is desirable that the channel length of the arc-shape portions be longer than the channel length of the straight-line portions. Moreover, the outside straight-line portion p base regions 34c and arc-shape portion p base regions 34b may be made the same depth.

Embodiment 4

Figure 12:
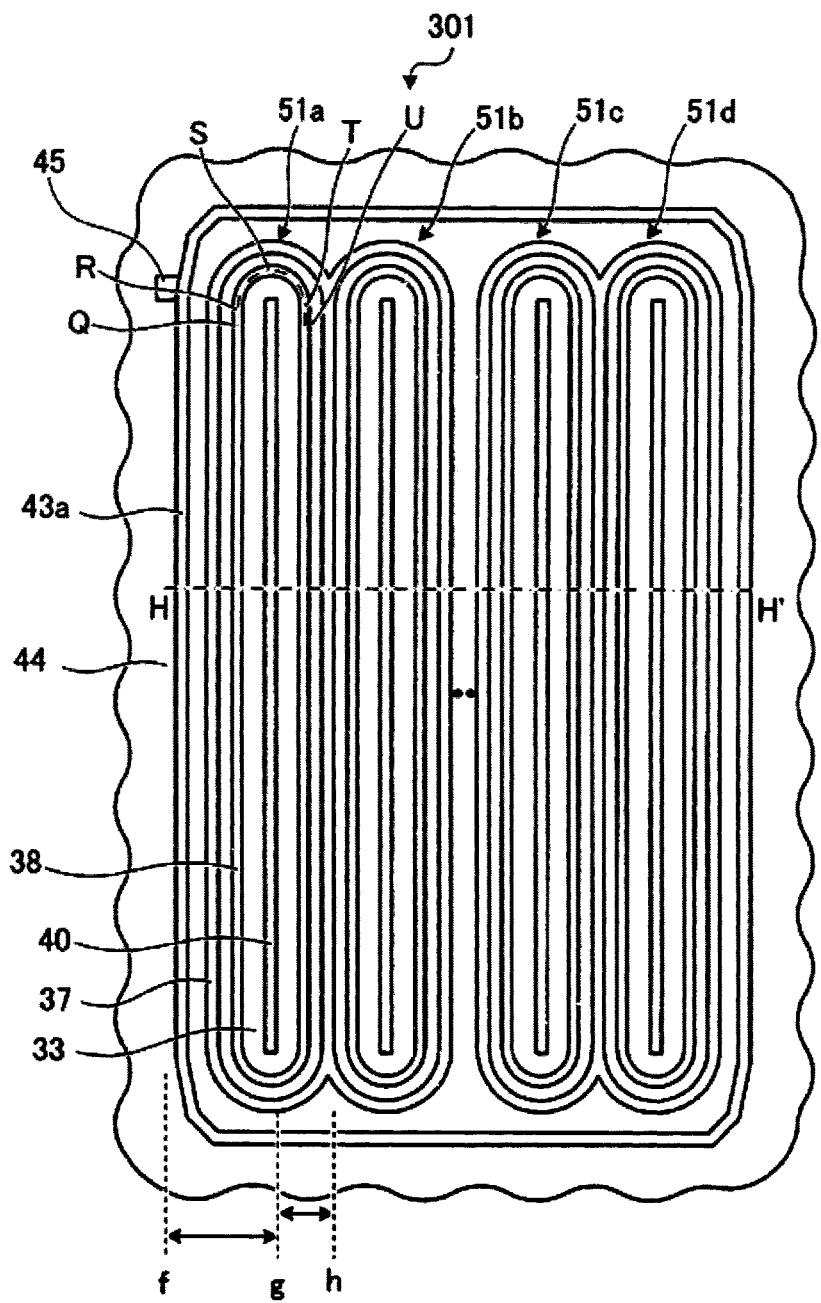
FIG. 12 is a plane view showing the planar layout of the IGBT of Embodiment 4.

FIG. 12 is a plane view showing the planar layout of the IGBT of Embodiment 4 of this invention. The IGBT 301 of Embodiment 4 is configured without the second isolation trench 43b in the planar layout of Embodiment 3. In this case, the semiconductor region on the outside of the first isolation trench 43a is fixed at ground potential or at the emitter potential. In the case of a multicell structure, by forming the outermost p base region to be shallower than the inside p base region, breakdown voltage balance is maintained, and breakdown voltages can be improved, as is clear from the simulation results of FIG. 10 and FIG. 11. Otherwise the configuration is similar to that of Embodiment 3. In Embodiment 1 or Embodiment 2 also, a configuration may be employed in which there is no second isolation trench 43b, and the semiconductor region outside the first isolation trench 43a is fixed at ground potential or at the emitter potential.

Embodiment 5

Figure 13:
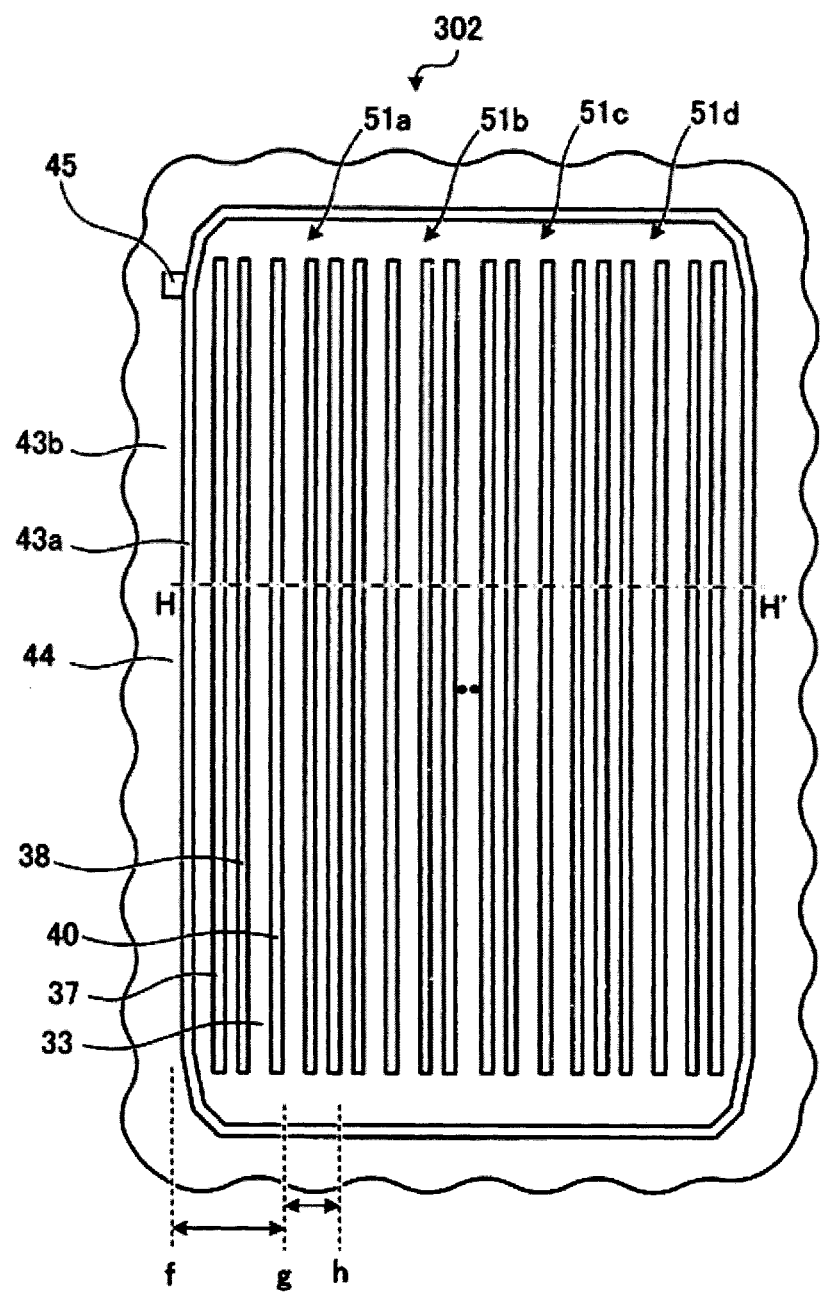
FIG. 13 is a plane view showing the planar layout of the IGBT of Embodiment 5.

FIG. 13 is a plane view showing the planar layout of the IGBT of Embodiment 5 of the invention. The IGBT 302 of Embodiment 5 eliminates the arc-shape portions of the gate electrodes 38 and emitter electrodes 37 in the planar layout of Embodiment 4, employing only the straight-line portions. Otherwise the configuration is similar to that of Embodiment 4. In the case of a multicell structure, by forming the outermost p base region to be shallower than the inside p base region, breakdown voltage balance is maintained, and breakdown voltages can be improved.

Embodiment 6

Figure 14:
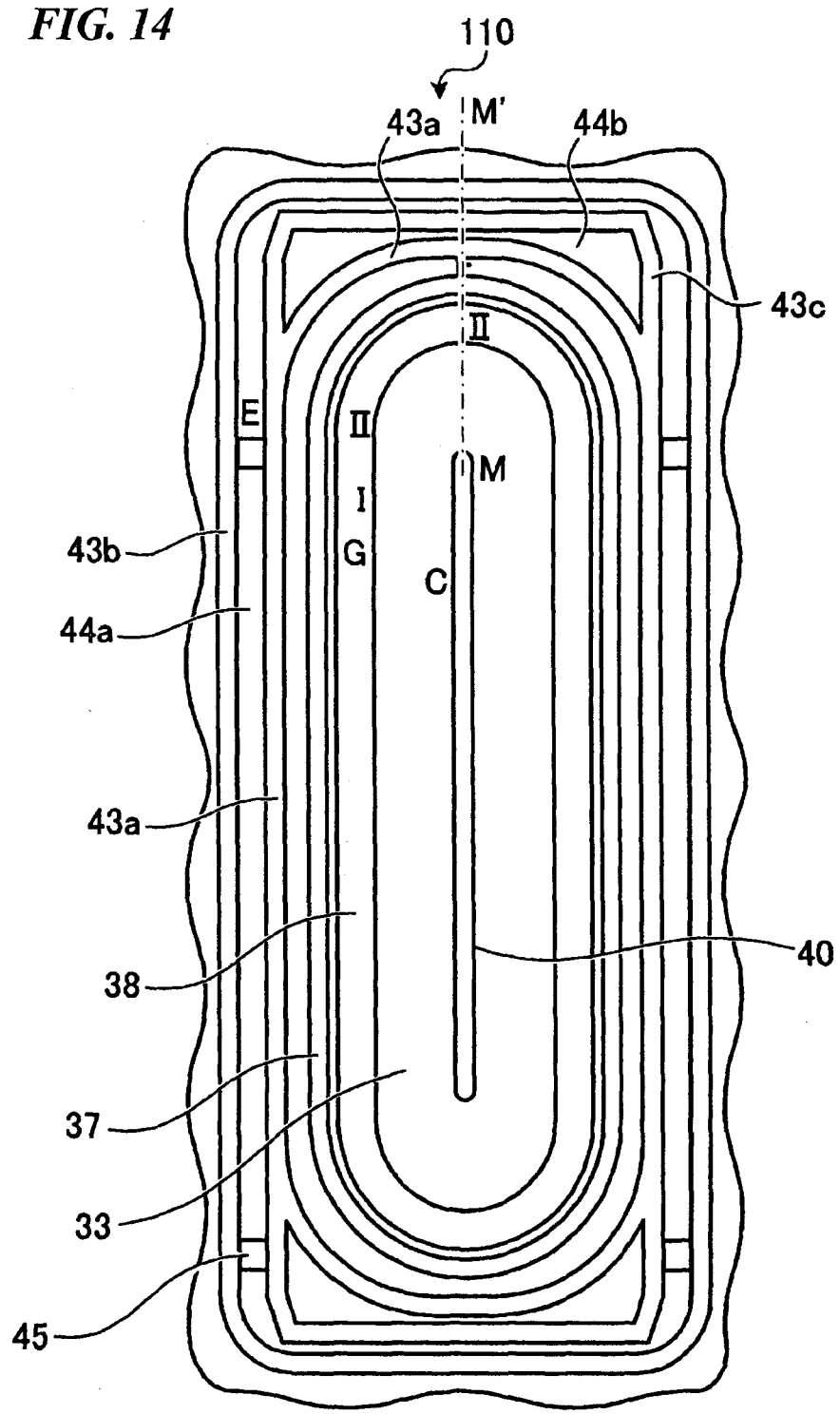
FIG. 14 is a plane view showing the planar layout of the IGBT of Embodiment 6.
Figure 15:
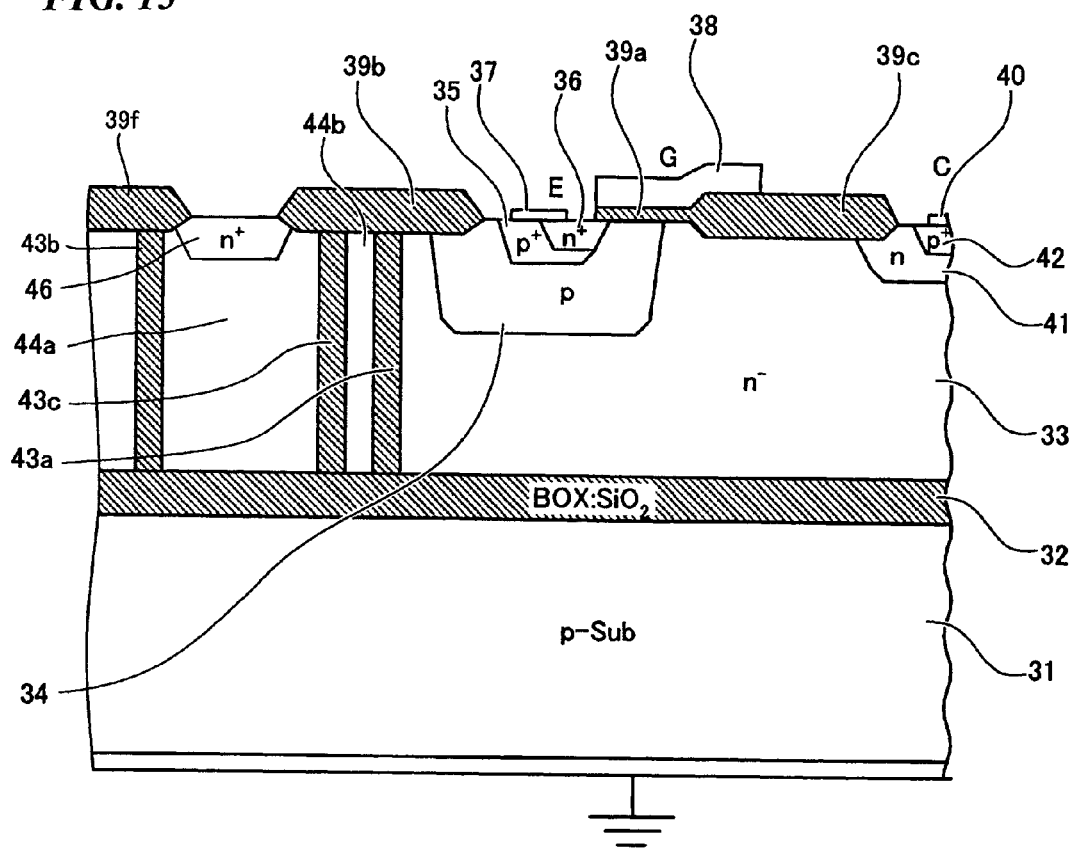
FIG. 15 is a cross-sectional view showing the configuration at section line M-M' in FIG. 14.

FIG. 14 is a plane view showing the planar layout of the IGBT of Embodiment 6 of the invention. FIG. 15 is a cross-sectional view showing the configuration at section line M-M' in FIG. 14. This section line M-M' traverses an arc-shape portion of the track shape in the region on the inside of the second isolation trench 43b and up to the collector electrode 40. The IGBT 110 of Embodiment 6 has the configuration of Embodiment 1, with a third isolation trench (third dielectric isolation region) 43c and a second isolation silicon region (second isolation semiconductor region) 44b added.

The third isolation trench 43c is arranged in the arc-shape portions of the emitter electrode 37, between the first isolation trench 43a and the second isolation trench 43b. The third isolation trench 43c is connected to the first isolation trench 43a. The region between the first isolation trench 43a and the third isolation trench 43c is the second isolation silicon region 44b. The first isolation silicon region (first isolation semiconductor region) 44a between the first isolation trench 43a and third isolation trench 43c, and the second isolation trench 43b, is the same as the isolation silicon region 44 in Embodiment 1. Otherwise the configuration related to the planar layout is similar to that of Embodiment 1.

As shown in FIG. 15, in the cross-sectional configuration at section line M-M', the third isolation trench 43c extends from the second LOCOS oxide film 39b to penetrate the first isolation silicon region 44a and reach the buried oxide film 32. Otherwise the configuration relating to the cross-sectional configuration at section line M-M' in FIG. 14 is similar to that of Embodiment 1. The second isolation trench 43b need not be formed. In this case also, balance is maintained between the breakdown voltages of the arc-shape portions and the straight-line portions, and breakdown voltages of the element as a whole are improved.

By means of Embodiment 6, because a third isolation trench 43c and second isolation silicon region 44b are provided, the effect of depletion of the $n^-$ drift region 33 from the interface between the first isolation trench 43a and $n^-$ drift region 33 in the arc-shape portions is weakened. Hence balance is maintained between the arc-shape portion breakdown voltage and the straight-line portion breakdown voltage, and breakdown voltages of the element as a whole are improved.

Embodiment 7

Figure 16:
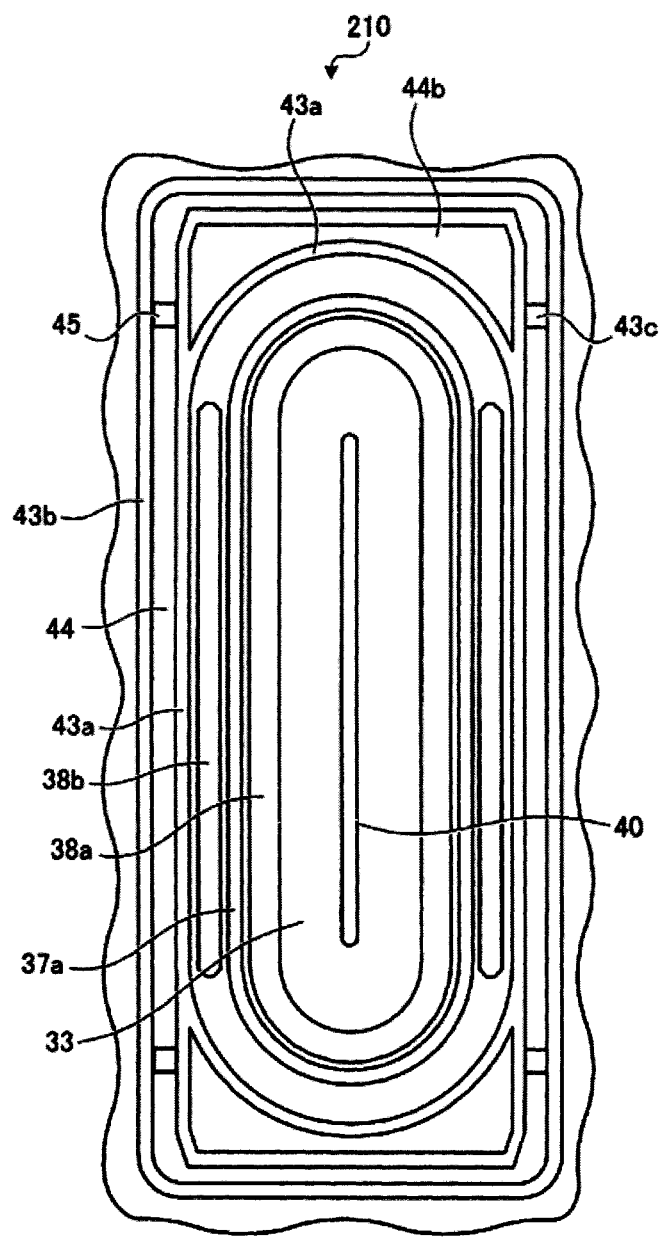
FIG. 16 is a plane view showing the planar layout of the IGBT of Embodiment 7.

FIG. 16 is a plane view showing the planar layout of the IGBT of Embodiment 7 of the invention. The IGBT 210 of Embodiment 7 employs the configuration of Embodiment 2, with a third isolation trench 43c and second isolation silicon region 44b added, similarly to Embodiment 6. The cross-sectional configuration from inside the second isolation trench 43b to an arc-shape portion of the collector electrode 40 is similar to the configuration shown in FIG. 15. The second isolation trench 43b need not be formed. In Embodiment 7, a balance is maintained between the arc-shape portion breakdown voltage and the straight-line portion breakdown voltage, so that the breakdown voltages of the element as a whole are improved.

Embodiment 8

Figure 17:
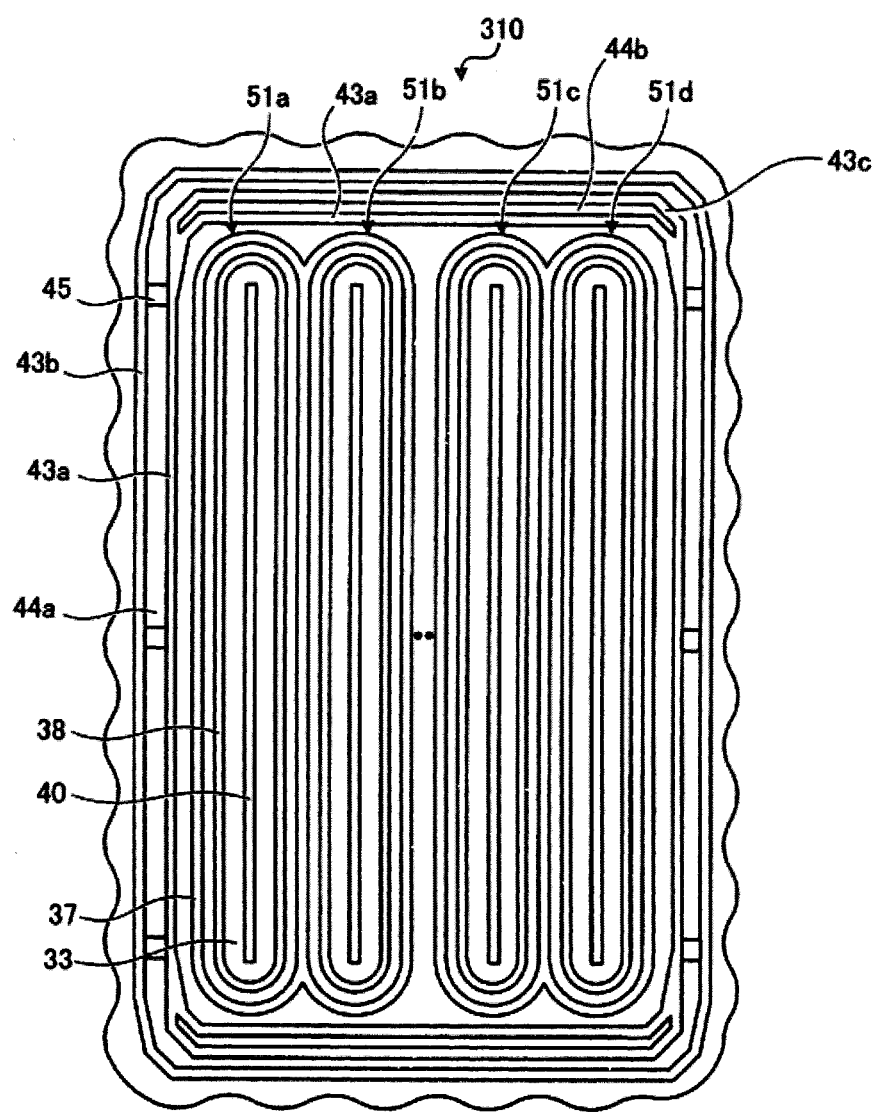
FIG. 17 is a plane view showing the planar layout of the IGBT of Embodiment 8.

FIG. 17 is a plane view showing the planar layout of the IGBT of Embodiment 8 of the invention. The IGBT 310 of Embodiment 8 adds, to the configuration of Embodiment 3, a third isolation trench 43c and a second isolation silicon region 44b, similarly to Embodiment 6. The cross-sectional configuration traversing the arc-shape portion from inside the second isolation trench 43b to the collector electrode 40 is similar to that shown in FIG. 15. As in Embodiment 4, the second isolation trench 43b need not be formed. In Embodiment 8 also, a balance is maintained between the arc-shape portion breakdown voltage and the straight-line portion breakdown voltage, so that the breakdown voltages of the element as a whole are improved. Also, in a planar layout in which there are no arc-shape portions in the gate electrodes 38 and emitter electrodes 37, as in Embodiment 5, the second isolation trench 43b need not be formed.

Embodiment 9

A method of manufacture of the semiconductor devices from Embodiment 1 to Embodiment 8 described above is explained, using an SOI wafer. Here, representative manufacturing processes are explained for the semiconductor device of Embodiment 3, having the cross-sectional configuration shown in FIG. 8.

FIG. 18 to FIG. 29 are cross-sectional views showing in order the manufacturing processes of Embodiment 9. In these figures, on either side of a center portion which is omitted, the left-half portion is a lateral IGBT 400 either during or after manufacture, and the right-half portion is a CMOS element N-channel MOSFET 410 either during or after manufacture. The IGBT 400 and CMOS element (MOSFET 410) are manufactured on the same wafer. These figures show, as the IGBT 400, the portion of a multicell structure comprising the outside straight-line portion p base region 34c and the adjacent center straight-line portion p base region 34a.

Figure 18:
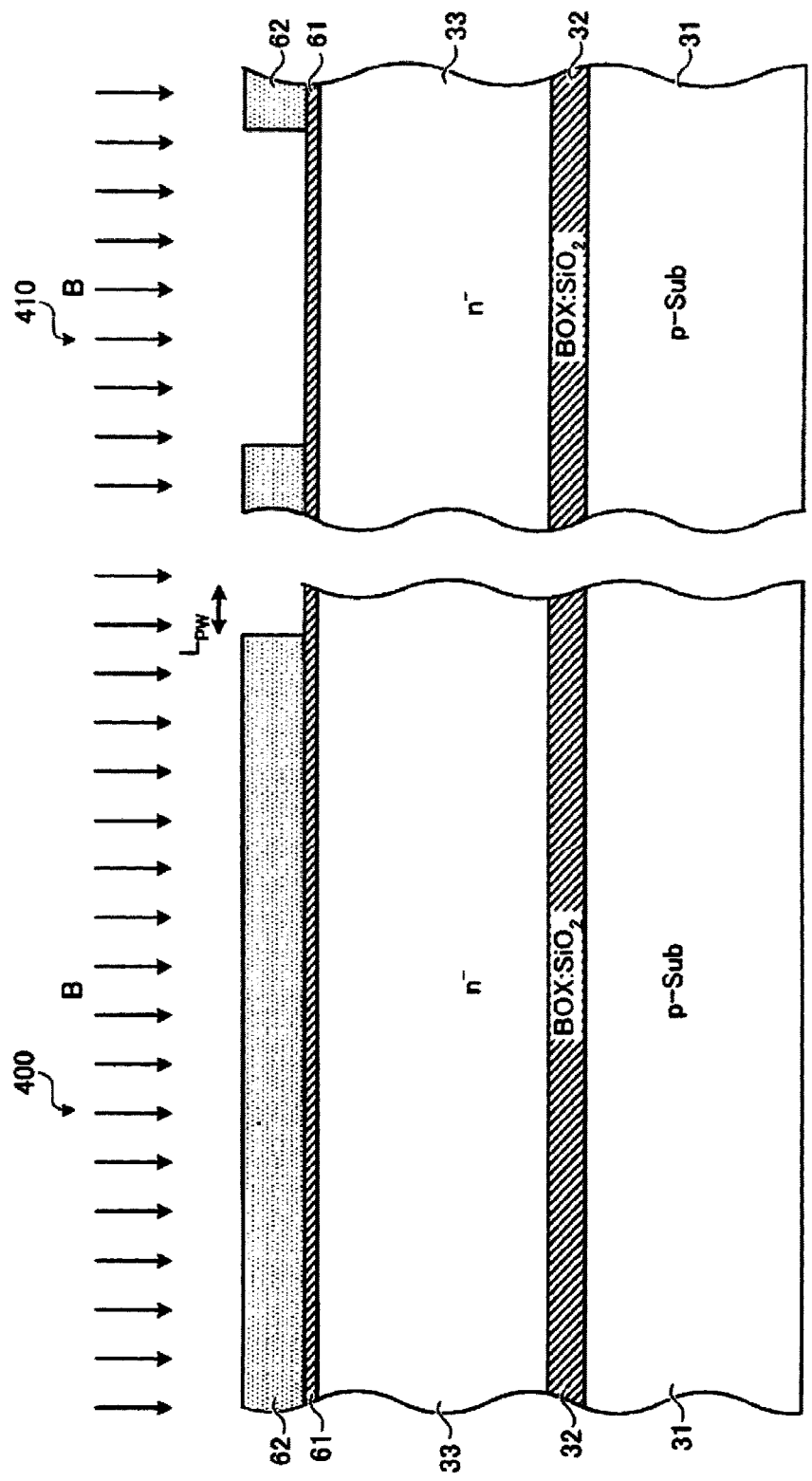
FIG. 18 is a cross-sectional view explaining a manufacturing process of Embodiment 9.

First, as shown in FIG. 18, a SOI wafer is prepared, with a semiconductor layer serving as the n⁻ drift region 33 provided on a supporting substrate 31 with a buried oxide film 32 intervening. A screen oxide film 61 is grown on the SOI wafer surface. Photoresist 62 is applied onto the screen oxide film 61. A photolithography process is performed, and the portion of the photoresist 62 on the p-well formation region is removed. Suppose at this time that the p-well formation region width in the IGBT 400 is $2 \times L_{PW}$. Next, ion implantation of boron (B) or another p-type impurity is performed. No limitations in particular are placed on the implantation conditions; for example, an accelerating voltage of 150 keV and dose of $2 \times 10^{13}$ cm$^{-2}$ may be used. After removing the photoresist 62, the wafer is washed.

Figure 19:
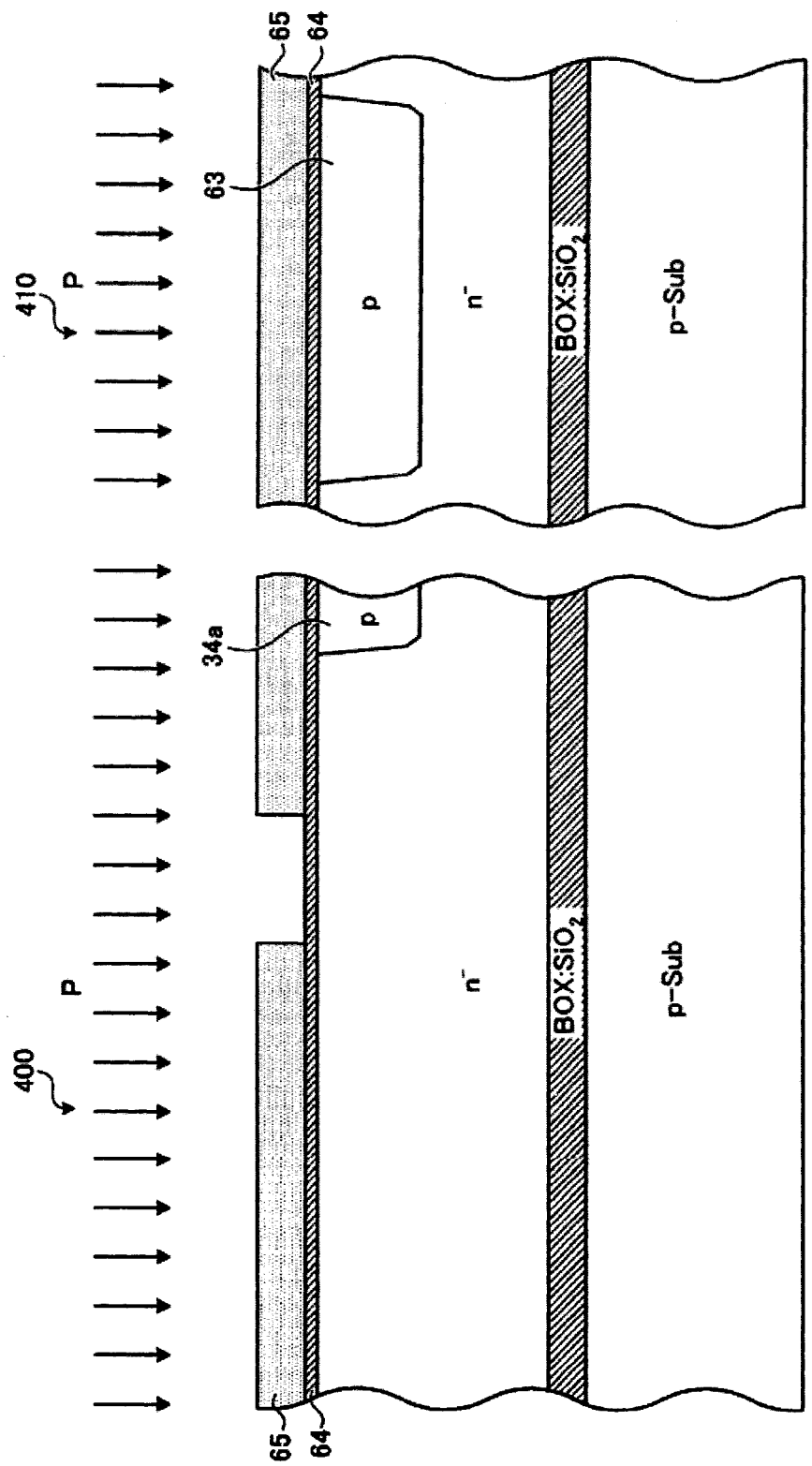
FIG. 19 is a cross-sectional view explaining a manufacturing process of Embodiment 9.

Next, as shown in FIG. 19, a thermal driving process is performed, for example for 300 to 360 minutes at 1150° C. in a nitrogen atmosphere or an oxygen atmosphere, to form the p wells of the IGBT 400 and MOSFET 410. At this time, the p well formed in the IGBT 400 becomes the center straight-line portion p base region 34a, and becomes the p well 63 in the MOSFET 410. After removing the screen oxide film 61 (see FIG. 18), a screen oxide film 64 is nearly grown on the wafer surface, to a thickness of for example 35 to 45 nm. Photoresist 65 is applied onto the screen oxide film 64. A photolithography process is performed, to remove portions of the photoresist 65 over regions in which the n buffer region is formed. Next, ion implantation of phosphorus (P) or another n-type impurity is performed. No limitations in particular are placed on the implantation conditions; for example, an accelerating voltage of 50 keV and dose of $7 \times 10^{12}$ cm$^{-2}$ to $20 \times 2012$ cm$^{-2}$ may be used. The n-type impurity implanted at this time is diffused in a subsequent thermal driving process, to form the n buffer region (the region with symbol 41 in FIG. 8). After removing the photoresist 65, the wafer is washed.

Figure 20:
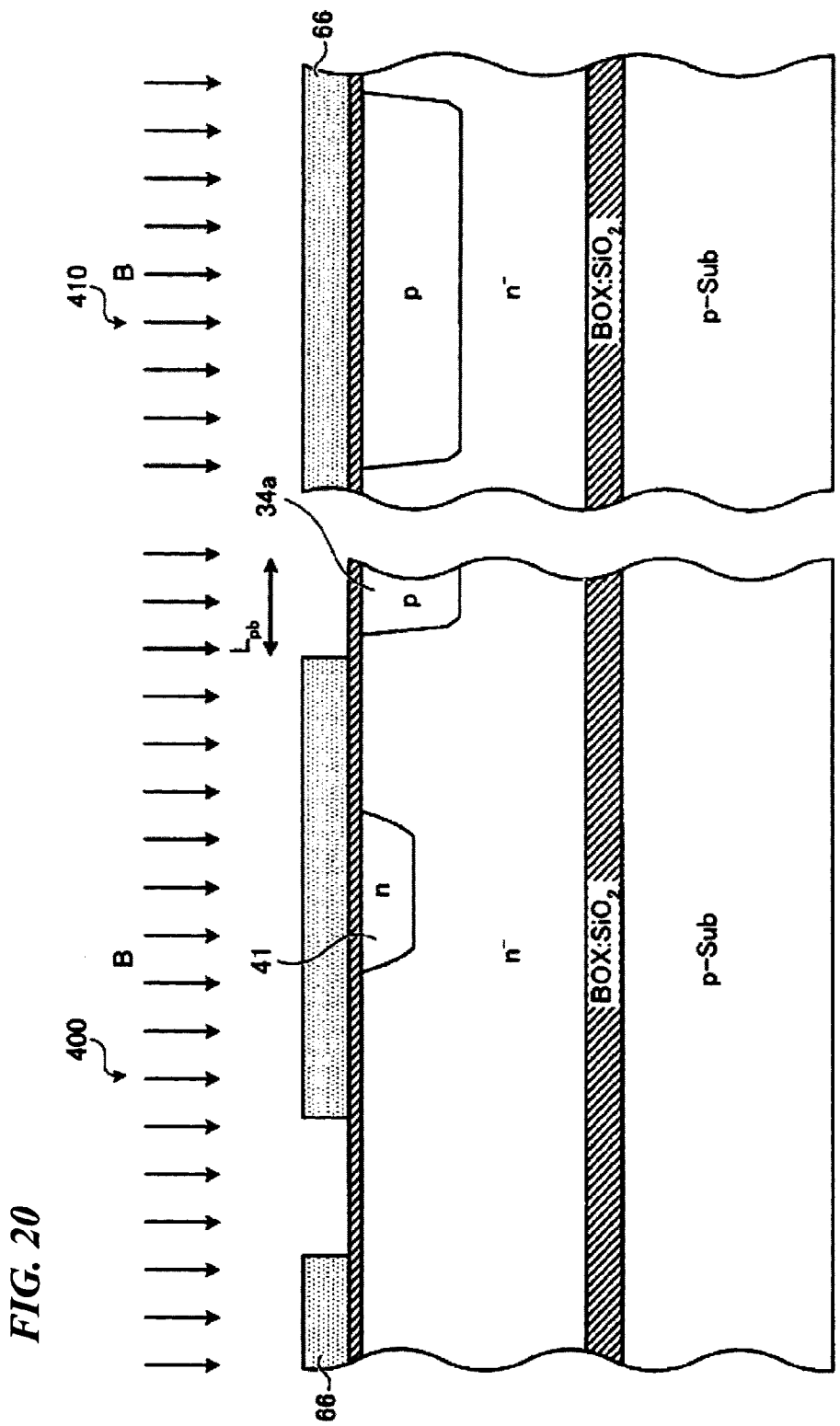
FIG. 20 is a cross-sectional view explaining a manufacturing process of Embodiment 9.

Next, as shown in FIG. 20, photoresist 66 is newly applied, a photolithography process is performed, and the portions of photoresist 66 on regions in which the outside straight-line portion p base regions (the regions with symbol 34c in FIG. 8 and FIG. 9), the arc-shape portion p base regions not appearing in FIG. 20 (the regions with symbol 34b in FIG. 9), and the center straight-line portion p base regions (the regions with symbol 34a in FIG. 8 and FIG. 9) are to be formed, is removed. At this time, the width of the region of formation of the center straight-line portion p base region is $2 \times L_{pb}$. Next, ion implantation of boron (B) or another p-type impurity is performed. No limitations in particular are placed on the implantation conditions; for example, an accelerating voltage of 80 keV and dose of $4 \times 10^{13}$ cm$^{-2}$ to $8 \times 10^{13}$ cm$^{-2}$ may be used. The p-type impurity implanted at this time is diffused in a subsequent thermal driving process, to form the various p base regions (regions with symbols 34a, 34b and 34c in FIG. 8 and FIG. 9). After removing the photoresist 66, the wafer is washed. In FIG. 20, the region indicated by symbol 41 is in the state prior to thermal driving in which n-type impurities have been implanted, but for convenience, this is indicated as the n buffer region 41 (and similarly in FIG. 21).

Figure 21:
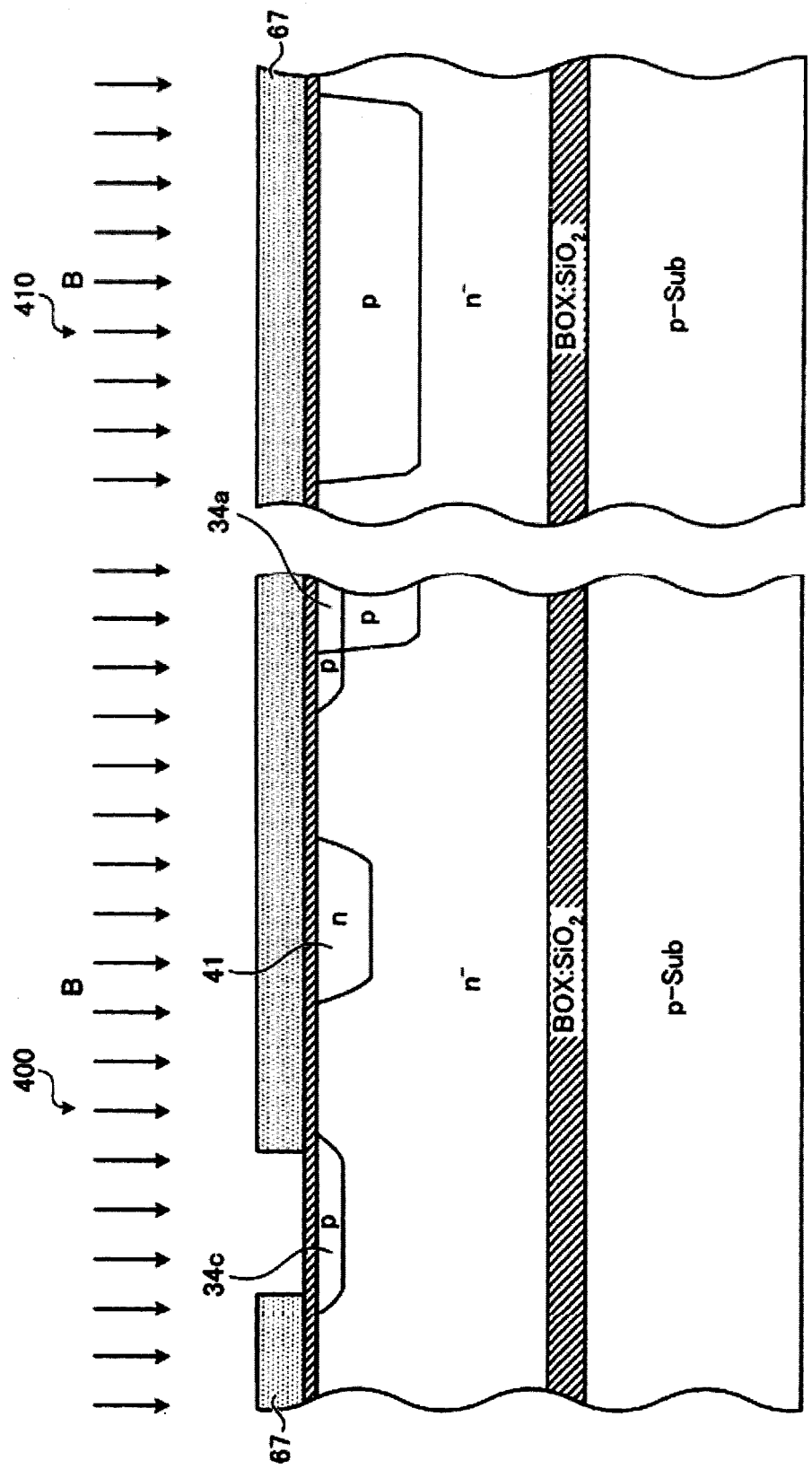
FIG. 21 is a cross-sectional view explaining a manufacturing process of Embodiment 9.

Next, as shown in FIG. 21, photoresist 67 is newly applied, a photolithography process is performed, and portions of the photoresist 67 above regions in which outside straight-line portion p base regions (regions with the symbol 34c in FIG. 8 and FIG. 9) are to be formed are removed. Then, additional ion implantation of boron (B) or another p-type impurity is performed. After removing the photoresist 67, the wafer is washed. The series of additional ion implantation processes, from application of photoresist 67 to wafer washing, is omitted when the outside straight-line portion p base regions 34c are not made deeper than the arc-shape portion p base regions 34b. In FIG. 21, the region indicated by the symbol 34c is in the state prior to thermal driving in which p-type impurities have been implanted, but for convenience, this is indicated as the outside straight-line portion p base region 34c.

Figure 22:
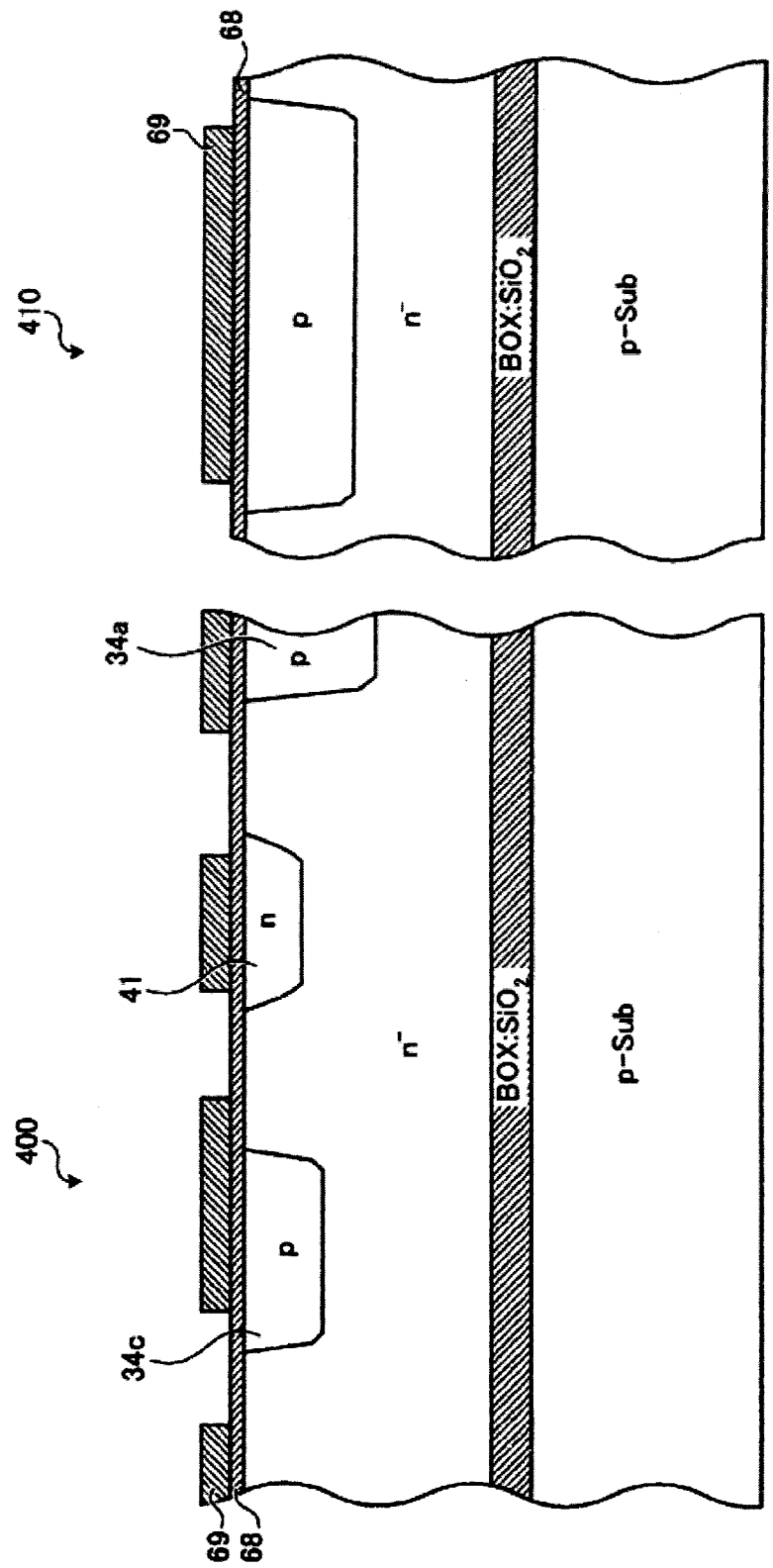
FIG. 22 is a cross-sectional view explaining a manufacturing process of Embodiment 9.

Next, as shown in FIG. 22, a thermal driving process is performed, for example for 120 to 150 minutes at 1100° C. in a nitrogen atmosphere, to form the outside straight-line portion p base regions 34c, arc-shape portion p base regions not appearing in FIG. 22 (regions with the symbol 34b in FIG. 9), center straight-line portion p base regions 34a, and n buffer regions 41. Then, the screen oxide film 64 (see FIG. 19) is removed, and a buffer oxide film 68 of thickness 35 to 45 nm, for example, is either newly grown or is deposited on the wafer surface. A nitride film 69 of thickness for example 150 to 200 nm is deposited on the entire wafer surface. Photolithography and etching processes are performed, to remove the portions of the nitride film 69 above the regions of formation of the LOCOS oxide film.

Figure 23:
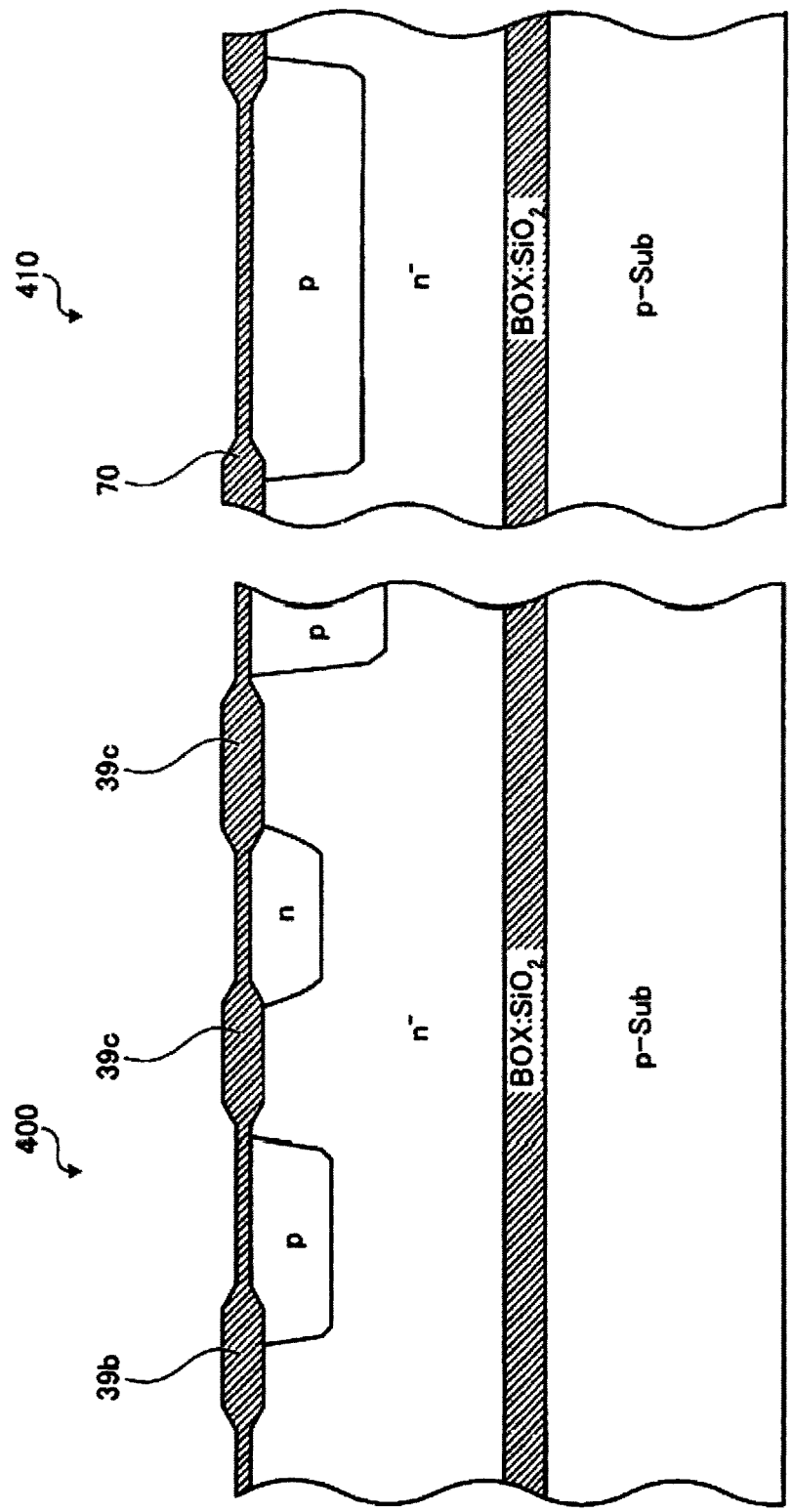
FIG. 23 is a cross-sectional view explaining a manufacturing process of Embodiment 9.

Next, as shown in FIG. 23, a thermal oxidation process is performed, to form LOCOS oxide films 39b, 39c, 70. The nitride film 69 (see FIG. 22) and buffer oxide film 68 (see FIG. 22) on the wafer surface are removed. A sacrificial oxide film is grown on the wafer surface, and after for example ion implantation of $BF_2$ ions to correct the threshold, the sacrificial oxide film is removed.

Figure 24:
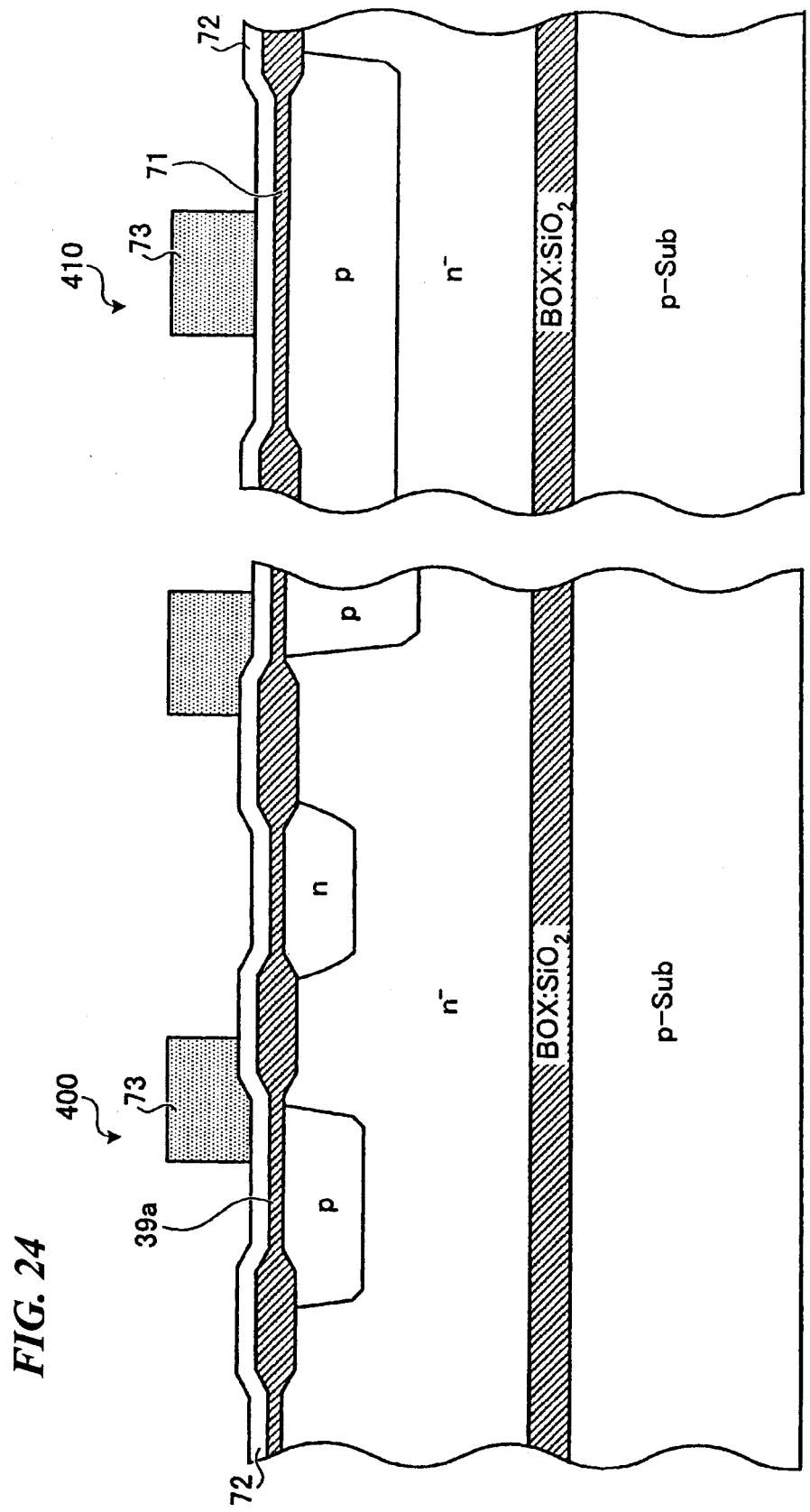
FIG. 24 is a cross-sectional view explaining a manufacturing process of Embodiment 9.

Next, as shown in FIG. 24, gate insulating films 39a, 71 of thickness for example 14 to 20 nm are grown. A low-resistivity polysilicon layer 72 is deposited over the entire wafer surface. Photoresist 73 is applied, a photolithography process is performed, and the photoresist 73 is removed, except for the portions in the regions of gate electrode formation.

Figure 25:
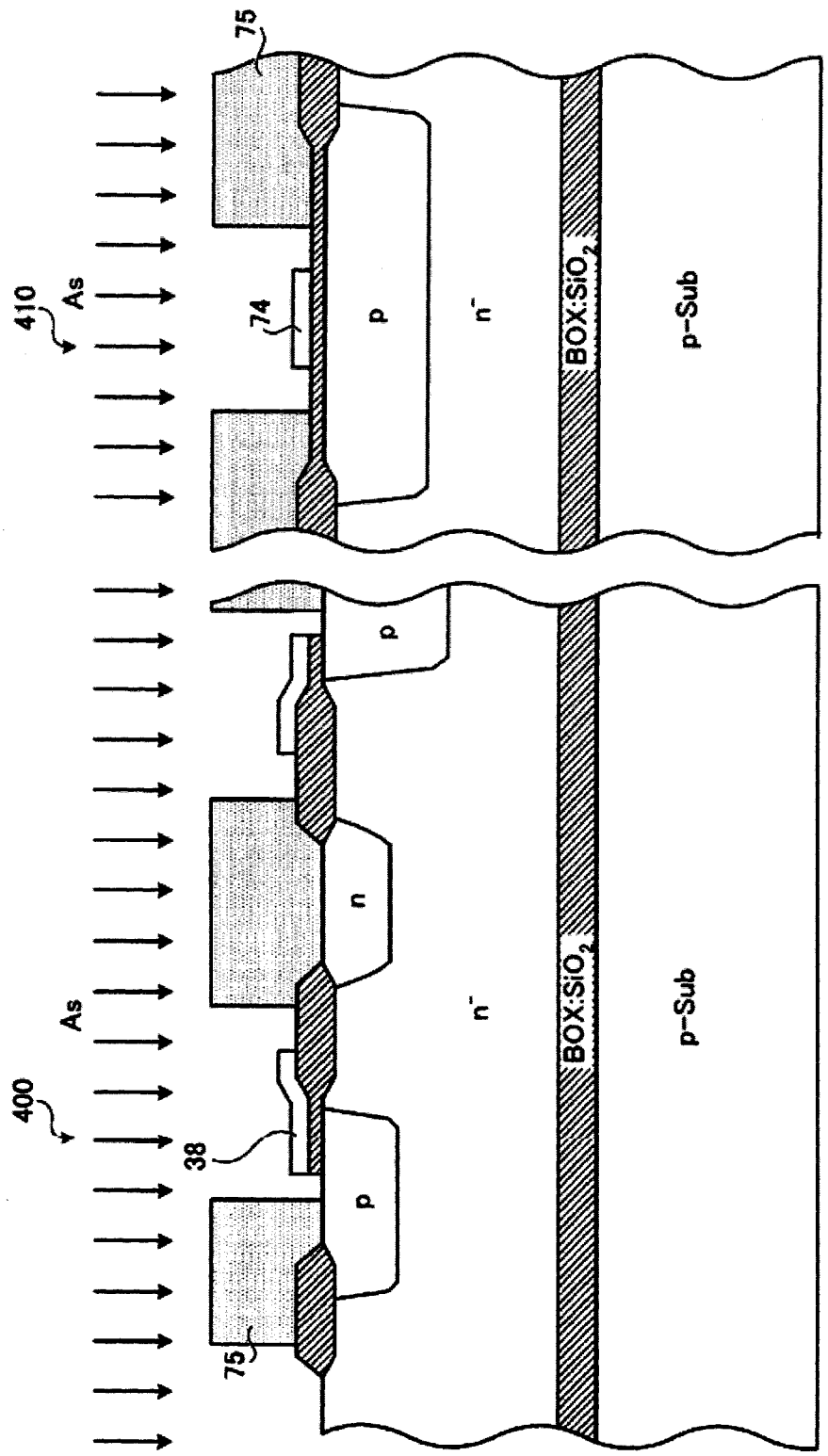
FIG. 25 is a cross-sectional view explaining a manufacturing process of Embodiment 9.

Next, as shown in FIG. 25, anisotropic etching is performed, and a gate stack is formed to become the gate electrodes 38, 74. After removing the photoresist 73 (see FIG. 24), the wafer is cleaned. Next, polysilicon reoxidation and shadow oxidation are performed, to recover from etching damage. Photoresist 75 is applied, and after performing a photolithography process, ion implantation of arsenic (As) or another n-type impurity is performed. After removing the photoresist 75, the wafer is cleaned.

Figure 26:
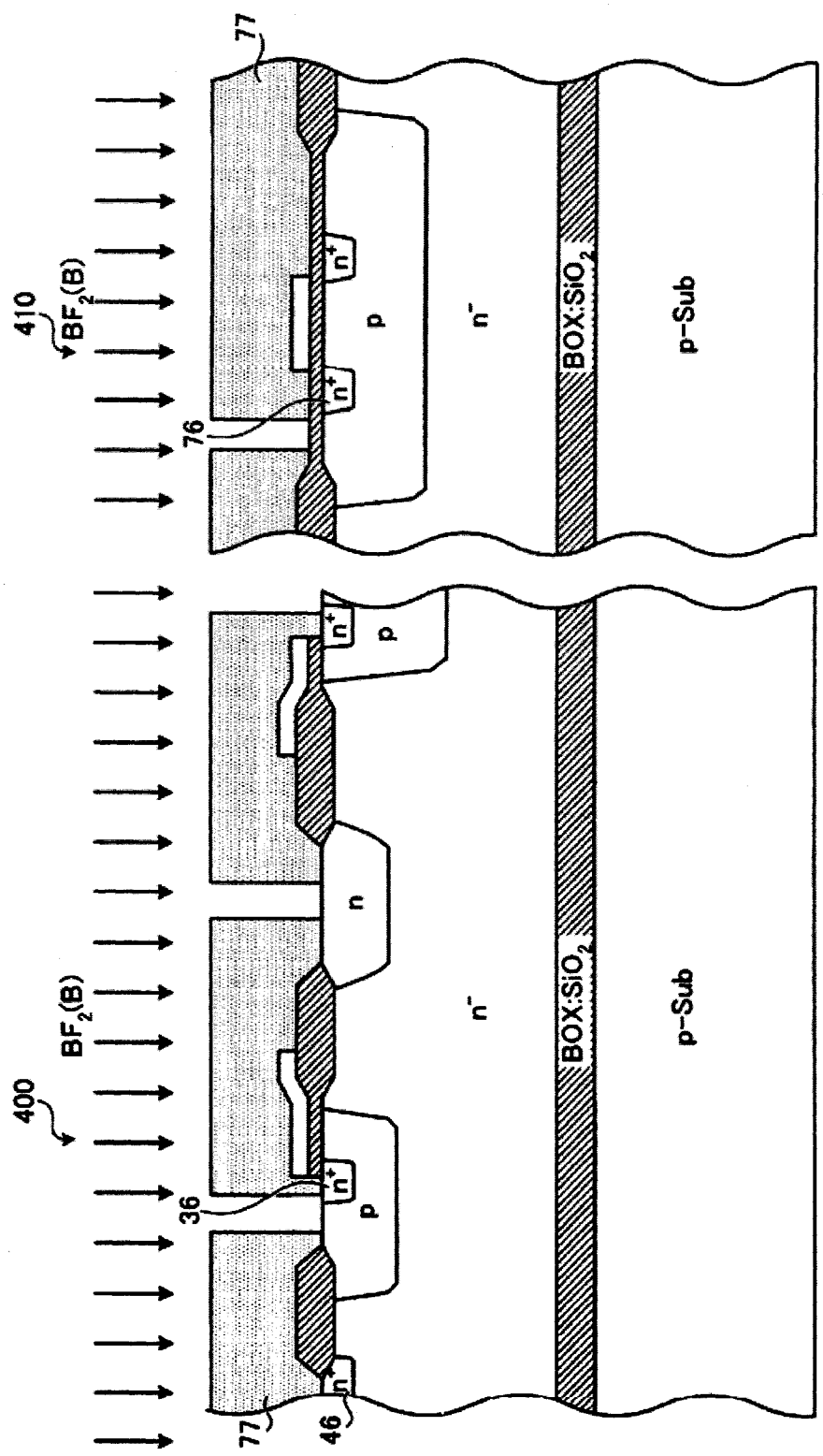
FIG. 26 is a cross-sectional view explaining a manufacturing process of Embodiment 9.
Figure 27:
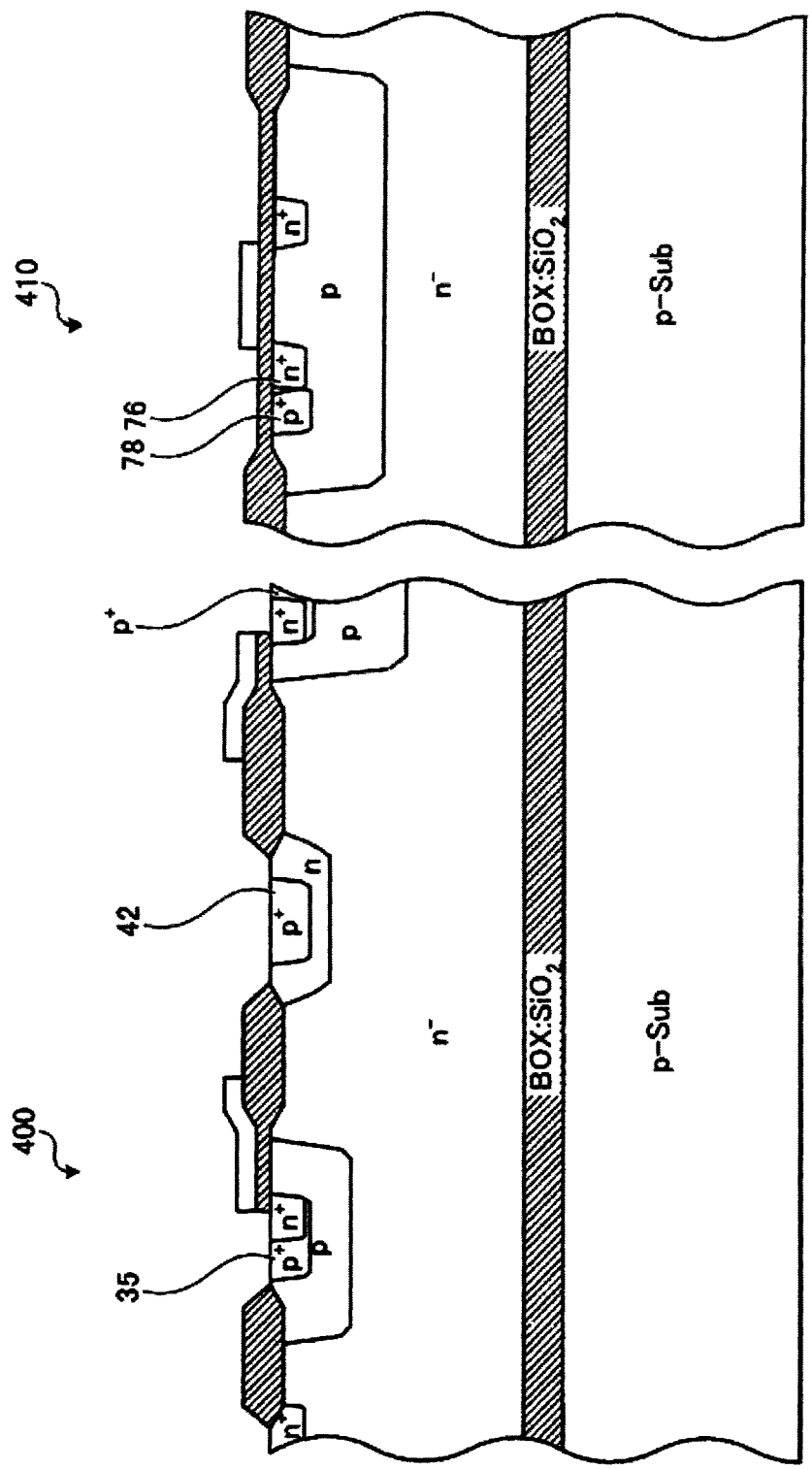
FIG. 27 is a cross-sectional view explaining a manufacturing process of Embodiment 9.

Next, as shown in FIG. 26, a thermal process is performed, and the low-resistance region 46, n⁺ emitter region 36, and n⁺ source region 76 are activated. A photoresist 77 is applied, and after performing a lithography process, ion implantation of $BF_2$, boron, or another p-type impurity is performed. By this means, the p⁺ contact regions 35, 78 and p⁺ collector region 42 are formed, as shown in FIG. 27. After removing the photoresist 77 (see FIG. 26), the wafer is washed. In FIG. 27, the p⁺ contact region 78 of the MOSFET 410 is in contact with the n⁺ source region 76, but the two may be separated as well.

Figure 28:
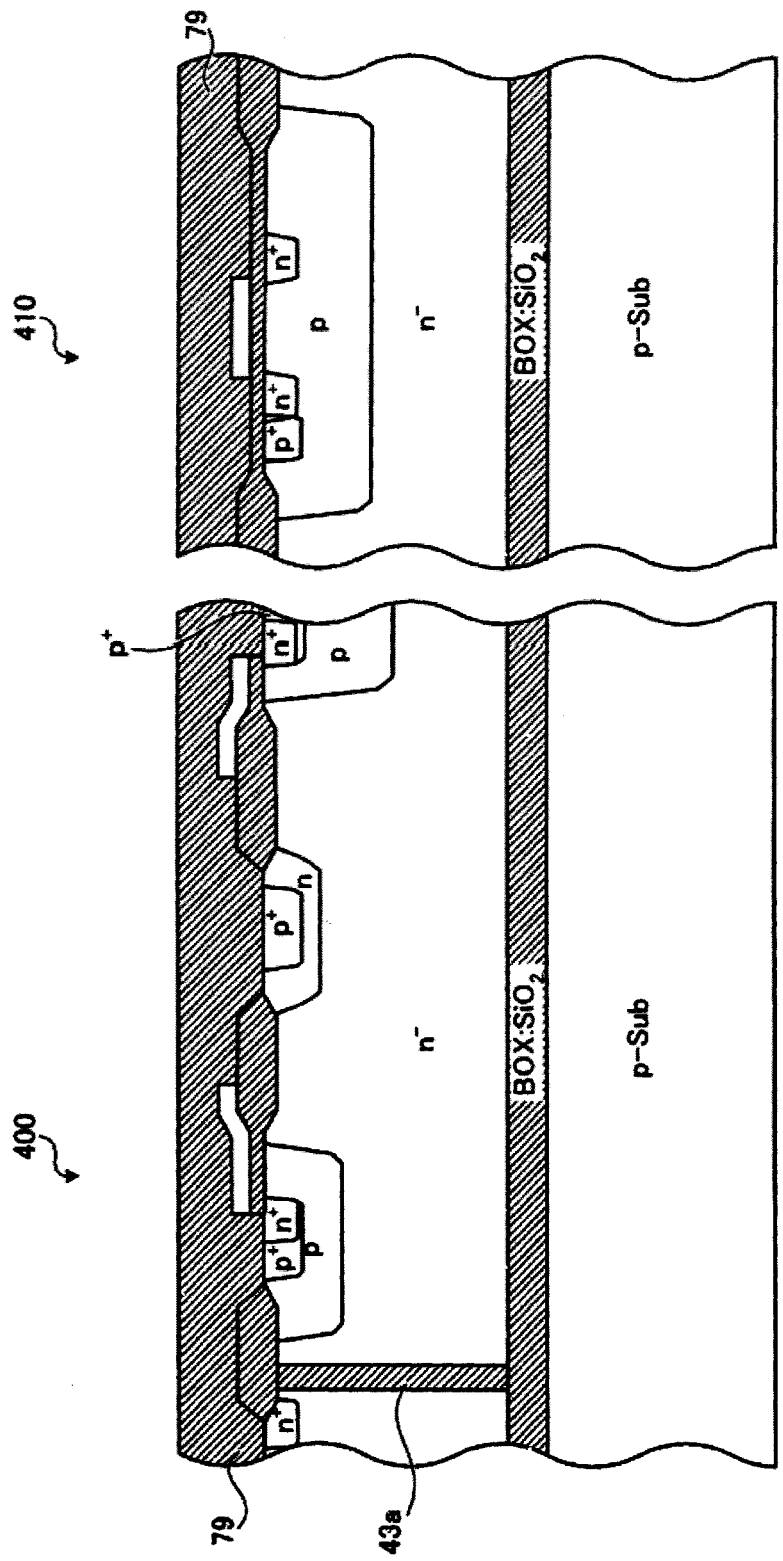
FIG. 28 is a cross-sectional view explaining a manufacturing process of Embodiment 9.

Next, as shown in FIG. 28, a premetal insulating film (PMD, Pre-Metalization Dielectric) is deposited over the entire wafer surface. A photoresist is applied, a photolithography process and etching process are performed, and the portions of the premetal insulating film on regions for isolation trench formation are removed. After removing the photoresist, the remaining premetal insulating film is used as a mask to perform silicon etching. After washing the wafer, a refill' oxide film 79 is deposited to form the first isolation trench 43a and second isolation trench (not appearing in the figure). Chemical-mechanical polishing (CMP) is performed, to flatten the surface of the refill oxide film 79.

Figure 29:
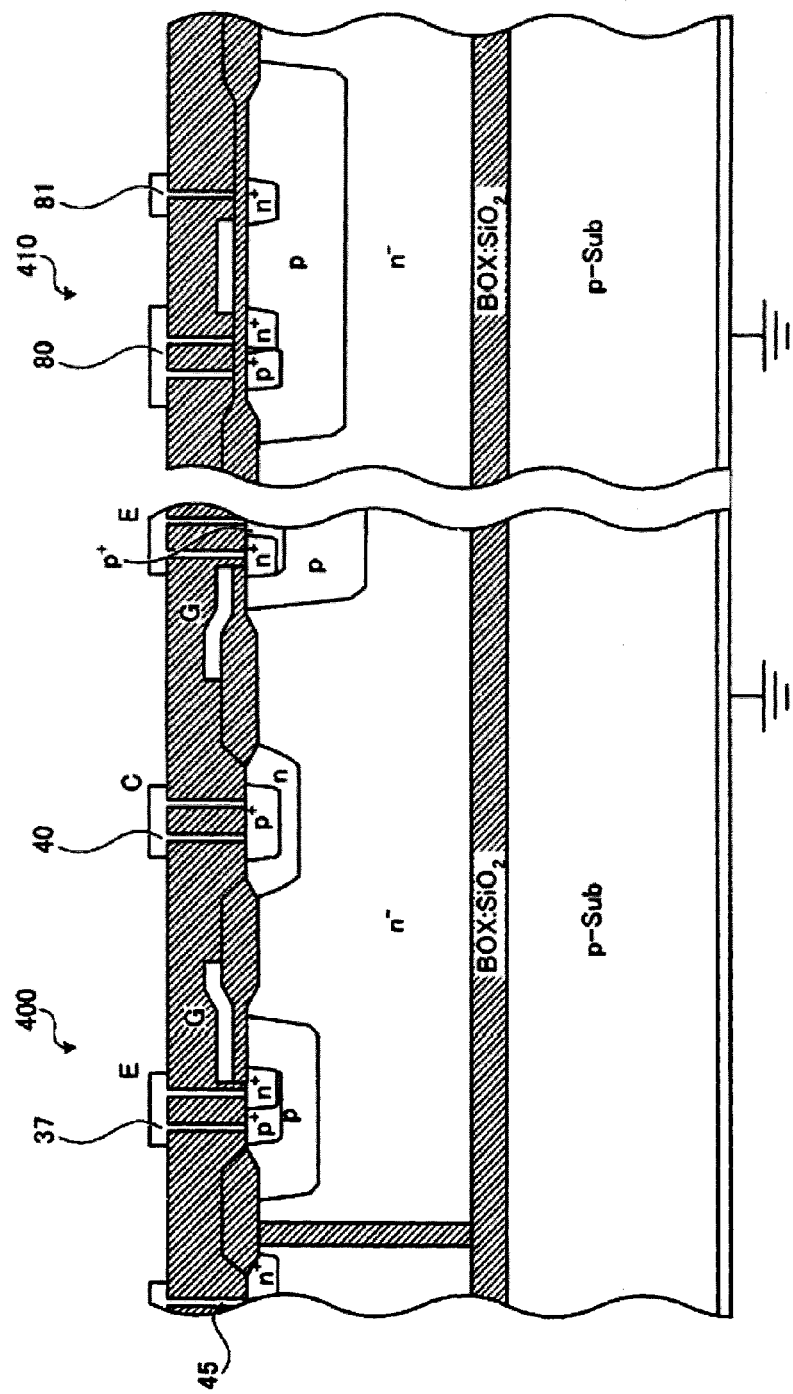
FIG. 29 is a cross-sectional view explaining a manufacturing process of Embodiment 9.

Next, as shown in FIG. 29, photoresist is applied, a photolithography process and etching process are performed, and a contact hole is formed in the refill oxide film 79. After removing the photoresist, the wafer is washed. A Ti/TiN or other barrier metal is deposited as necessary. A W plug is buried in the contact hole, and a metal wiring layer, comprising Al, Cu, or Si, is deposited. Photoresist is applied, and a photolithography process and etching process are performed to pattern the first metal wiring layer, forming the short-circuiting electrode 45, emitter electrode 37, collector electrode 40, source electrode 80, and drain electrode 81. After removing the photoresist, the wafer is washed. Then, by forming the desired" number of metal wires, the element is completed.

When forming the third isolation trench, in the process shown in FIG. 28, the trench may be formed together with the first isolation trench 43a. And, when a second isolation trench is not formed, in the process shown in FIG. 28, only the first isolation trench 43a maybe formed. When there is a trench gate structure, the trench gate structure may be fabricated before or after fabrication of the planar gate structure.

Figures 30, 31:
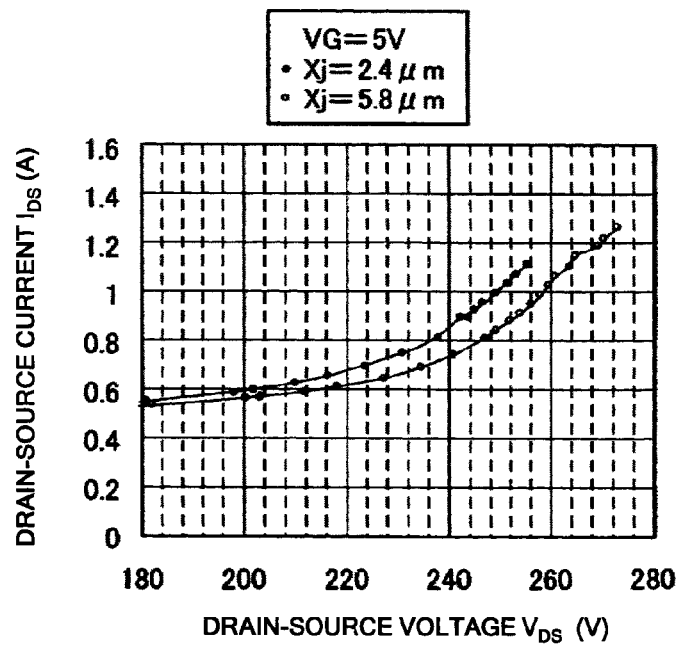
FIG. 30 is experimental results showing the relation between the p base region depth and breakdown voltage in Embodiment 9.
FIG. 31 is a characteristic diagram showing the on-state voltage waveform in Embodiment 9.

FIG. 30 is experimental results showing the relation between the p base region depth and breakdown voltage. These experimental results are results of investigations of the off-state breakdown voltage BVoff and of the on-state breakdown voltage BVon with a gate voltage VG of 5 V applied, for a device structure with an off-state breakdown voltage in approximately the 250 V class. In these experiments, only the depth Xj of the center straight-line portion p base regions 34a is modified. As shown in FIG. 30, when Xj is 2.4 µm, BVoff and BVon are respectively 245 V and 255 V. On the other hand, when Xj is 5.8 µm, BVoff and BVon are 259 V and 273 V respectively, so that the breakdown voltages are higher than when Xj is 2.4 µm. Here, in experiments the above-described $L_{PW}$ is 2.1 µm, and the above-described $L_{pb}$ is 3.8 µm. The depth Xj of the center straight-line portion p base regions 34a is the result of a two-dimensional process simulation. The off-state breakdown voltage BVoff is the result in DC short mode of a curve tracer. The on-state breakdown voltage BVon is the result of measurement of transmission line pulses (TLPs). Here the pulse width is 200 ns.

FIG. 31 is a characteristic diagram showing the waveform of the on-state breakdown voltage BVon. In FIG. 31, the plot of black circles denotes cases in which the depth Xj of the center straight-line portion p base region 34a is 2.4 µm, and the plot of white circles denotes cases in which the depth Xj of the center straight-line portion p base region 34a is 5.8 µm. From FIG. 31 it is seen that the breakdown voltage is higher when the depth Xj of the center straight-line portion p base region 34a is 5.8 µm.

Embodiment 10

Figure 32:
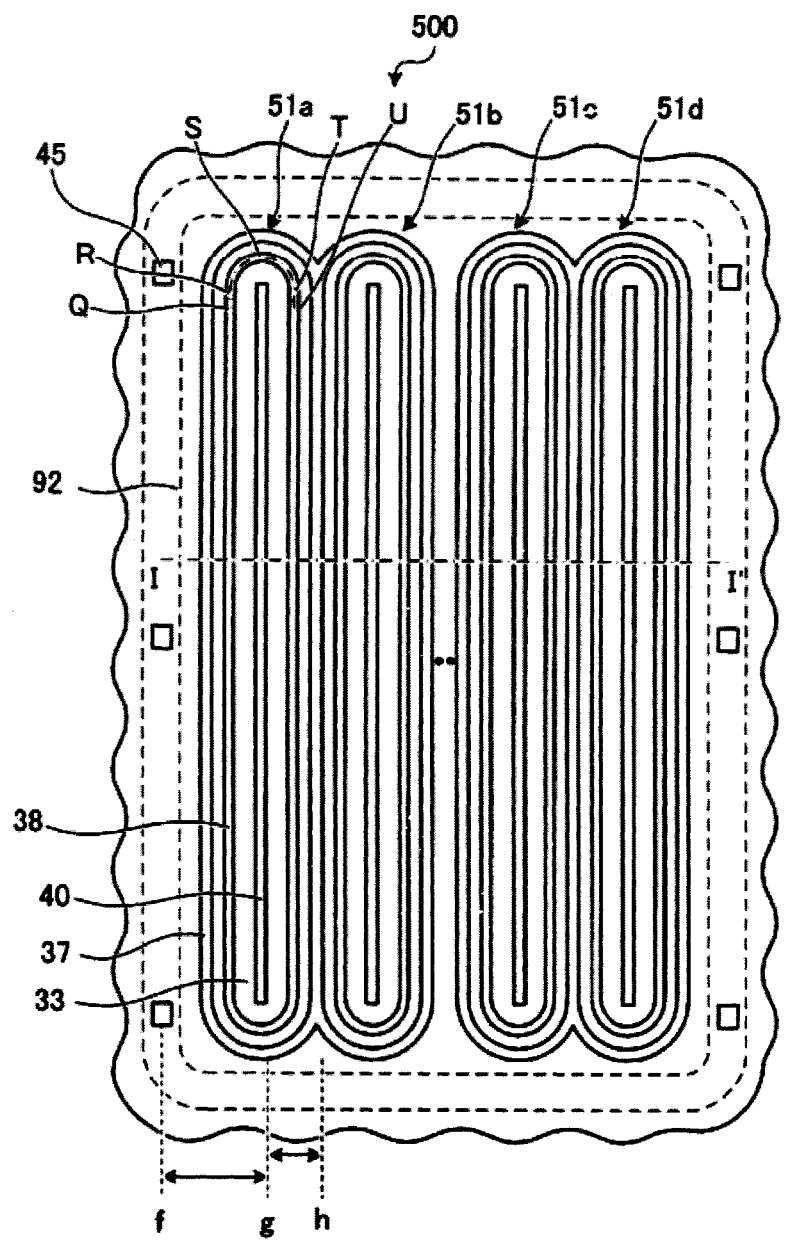
FIG. 32 is a plane view showing the planar layout of the IGBT of Embodiment 10.
Figure 33:
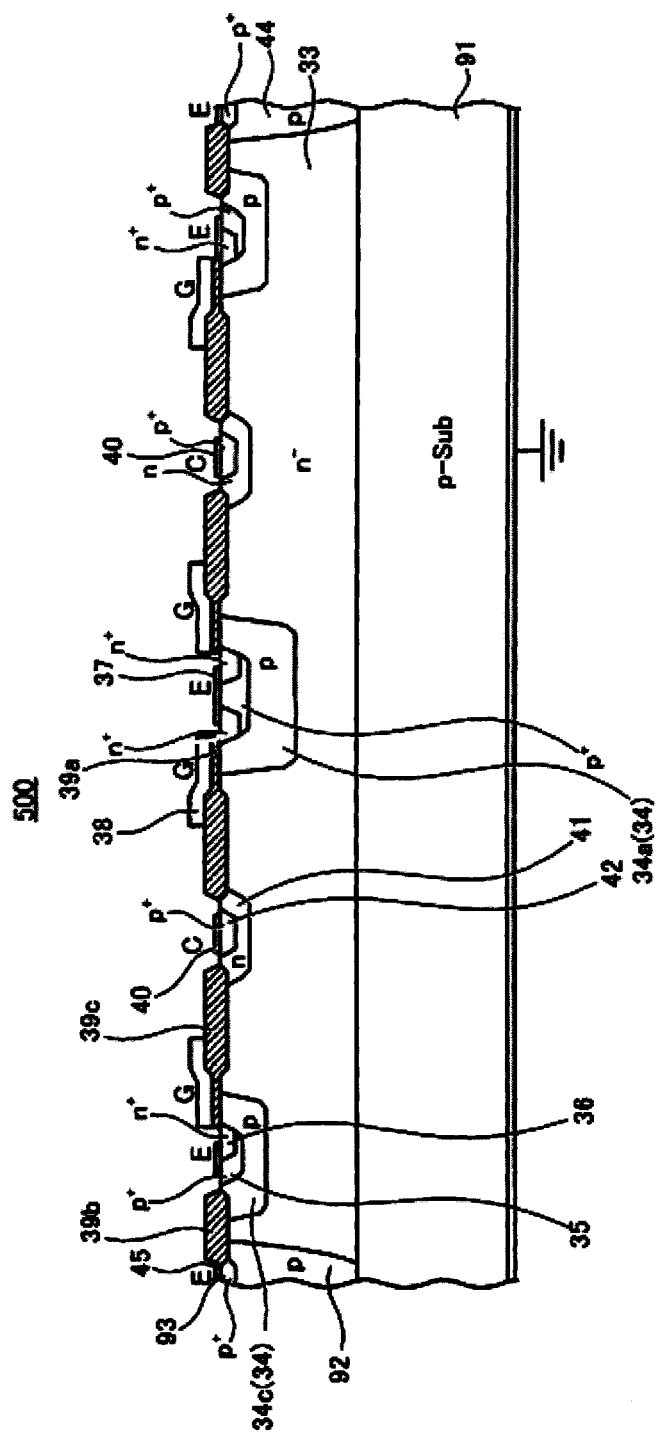
FIG. 33 is a cross-sectional view showing the configuration at section line I-I' in FIG. 32.

FIG. 32 is a plane view showing the planar layout of the IGBT of Embodiment 10 of the invention. FIG. 33 is a cross-sectional view showing the configuration at section line I-I' in FIG. 32. As shown in these figures, the IGBT 500 of Embodiment 10 employs, in place of an SOI substrate, a substrate on which an n-type semiconductor layer is deposited, to serve as an n⁻ drift region 33, on a p semiconductor substrate 91. Also, in place of a dielectric isolation structure employing a trench, a junction isolation structure is employed, using the junction formed by the n⁻ drift region 33 and p isolation semiconductor region 92. The p isolation semiconductor region 92 surrounds the multicell structure, from the second LOCOS oxide film 39b to the p semiconductor substrate 91. The low-resistance region 93 provided on the surface of the p isolation semiconductor region 92 is a p-type region. The low-resistance region 93 is fixed at ground potential or at a common potential by the short-circuiting electrode 45. Otherwise the configuration is similar to that of Embodiment 3.

Figure 34:
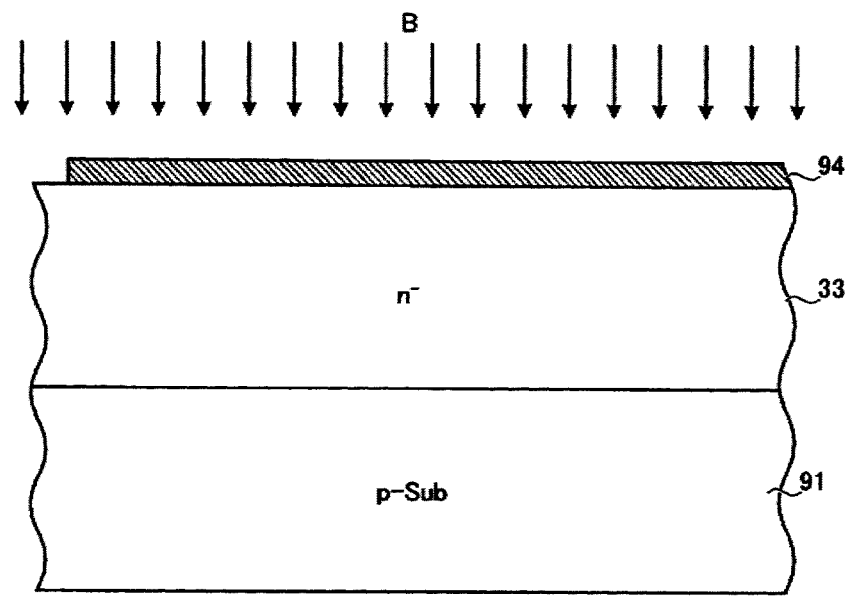
FIG. 34 is a cross-sectional view explaining a manufacturing process of Embodiment 10.
Figure 35:
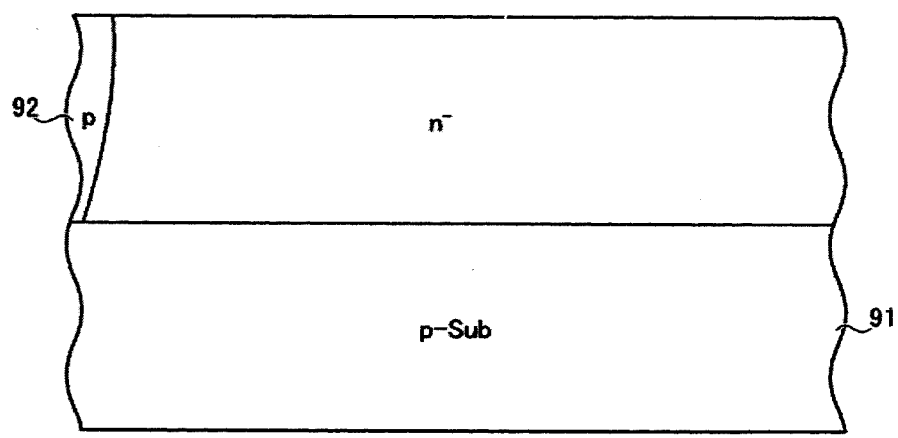
FIG. 35 is a cross-sectional view explaining a manufacturing process of Embodiment 10.

FIG. 34 and FIG. 35 are cross-sectional views showing in order manufacturing processes of Embodiment 10. Representative manufacturing processes for the semiconductor device of Embodiment 10 are explained referring to these drawings.

First, as shown in FIG. 34, an epitaxial wafer is prepared, with an epitaxially grown layer to serve as the n drift region 33 on the p semiconductor substrate 91. An oxide film 94 is either grown or deposited on the surface of this epitaxial wafer. Photoresist, not shown, is applied, a photolithography process is performed, and the portions of the photoresist on regions in which p isolation semiconductor regions (the region with the symbol 92 in FIG. 33) are to be formed are removed. Next, additional ion implantation of boron (B) or another p-type impurity is performed. After removing the photoresist, the wafer is washed.

Next, as shown in FIG. 35, a thermal diffusion process is performed, and a p isolation semiconductor region 92 is formed so as to be connected to the p semiconductor substrate 91. The oxide film 94 (see FIG. 34) is then removed. Next, similarly to Embodiment 9, the processes of FIG. 18 to FIG. 27 are performed. However, the p⁺ low-resistance region 93 is formed by ion implantation of $BF_2$, boron, or another p-type impurity together with formation of the p⁺ contact region 35 and p⁺ collector region 42. A premetal insulating film is then deposited on the entire wafer surface. A chemical-mechanical polishing process is performed to flatten the wafer surface. Then, similarly to Embodiment 9, the process of FIG. 29 is performed, to complete the element. By means of Embodiment 10, the center straight-line portion p base regions 34a are deeper than the outside straight-line portion p base regions 34c, so that a balance is maintained between breakdown voltages, and the breakdown voltages of the element as a whole are improved.

Embodiment 11

Figure 36:
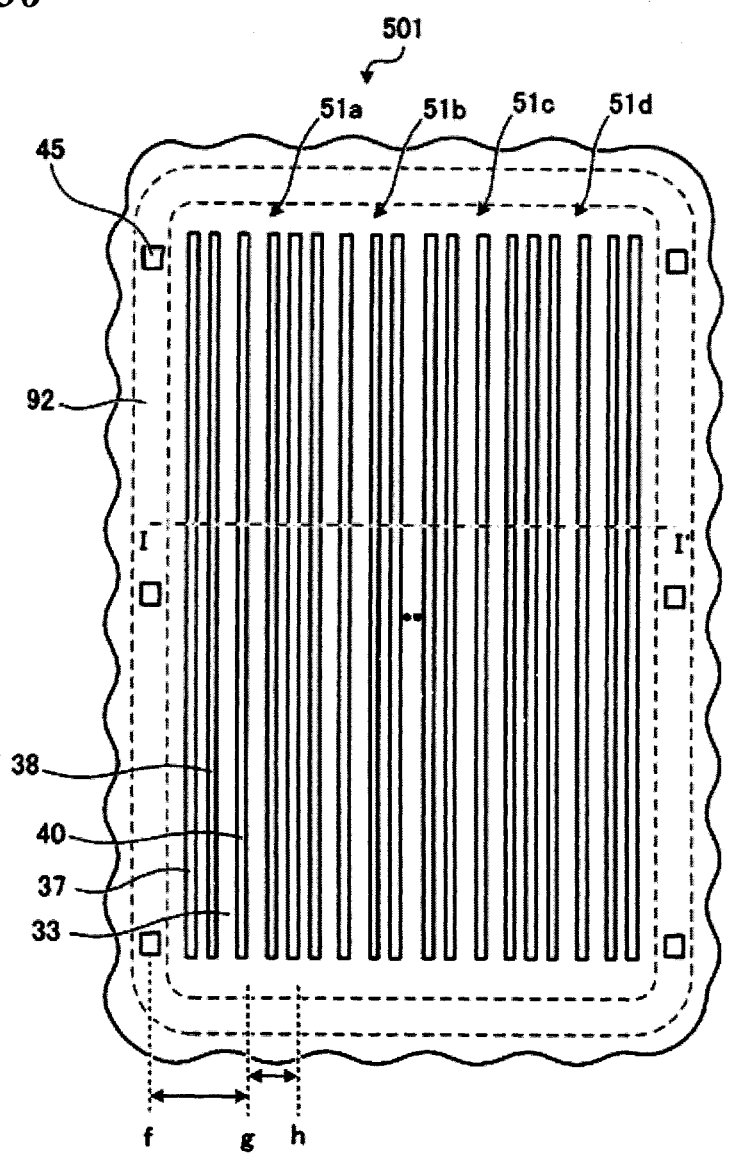
FIG. 36 is a plane view showing the planar layout of the IGBT of Embodiment 11.

FIG. 36 is a plane view showing the planar layout of the IGBT of Embodiment 11 of the invention. The IGBT 501 of Embodiment 11 has the planar layout of Embodiment 10, but with the arc-shape portions of the gate electrodes 38 and emitter electrodes 37 removed, leaving only straight-line portions. Otherwise the configuration and manufacturing process are similar to those of Embodiment 10.

Embodiment 12

Figure 37:
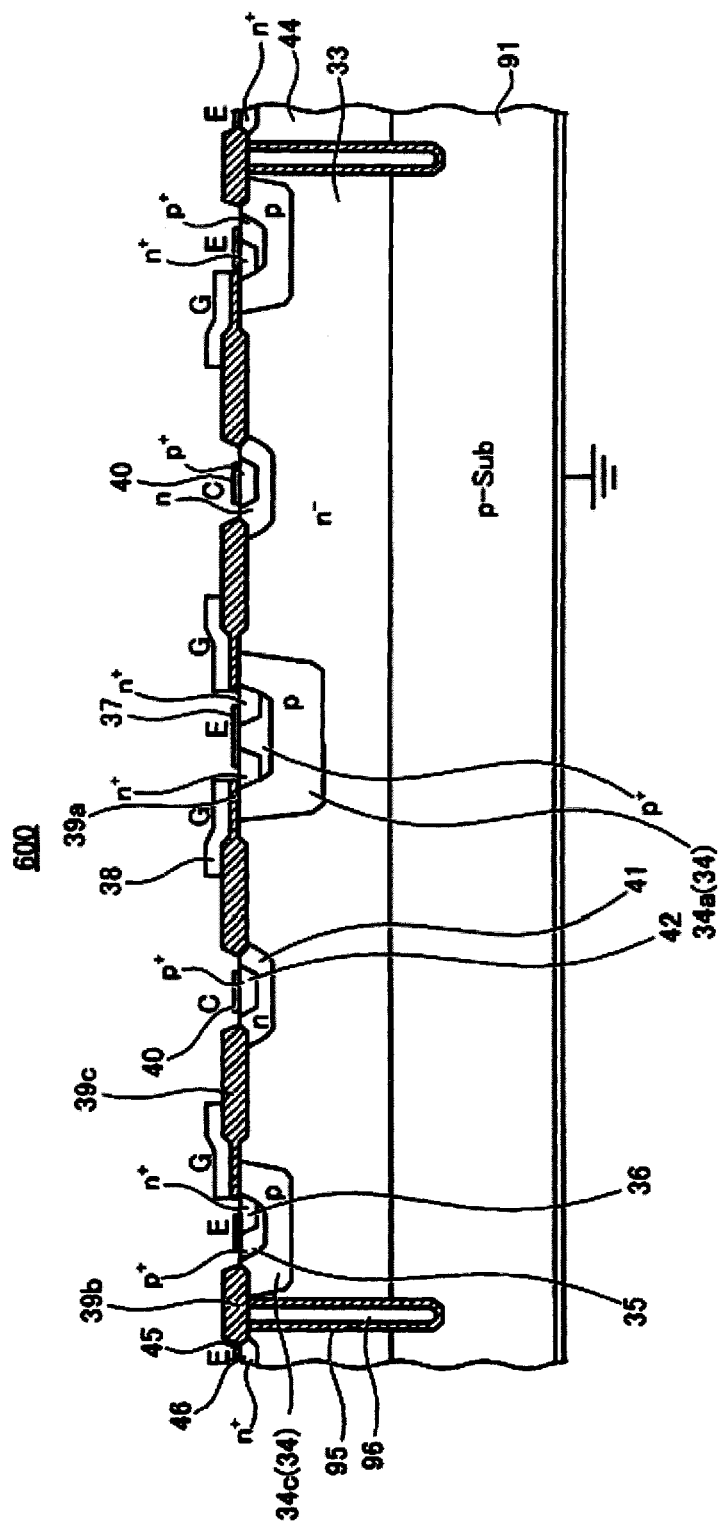
FIG. 37 is a cross-sectional view showing the configuration of the IGBT of Embodiment 12.

FIG. 37 is a cross-sectional view showing the configuration at for example section line H-H' in FIG. 12 or FIG. 13. As shown in FIG. 37, the IGBT 600 of Embodiment 12 uses, in place of an SOI substrate, a substrate in which an n-type semiconductor layer serving as the n⁻ drift region 33 is deposited on a p semiconductor substrate 91. The trench of the trench isolation structure surrounds the multicell structure, and extends from the second LOCOS oxide film 39b, penetrating the n drift region 33, to reach the p semiconductor substrate 91. This trench is buried by for example a polysilicon fill region 96, with an insulating film 95 intervening. The trench isolation region is formed by the insulating film 95 and fill region 96. The low-resistance region 46 is fixed at ground potential or at a common potential via the short-circuiting electrode 45. Otherwise the configuration is similar to that of Embodiment 4.

FIG. 38 to FIG. 45 are cross-sectional views showing in order manufacturing processes of Embodiment 12. A representative manufacturing process for the semiconductor device of Embodiment 12 is explained referring to these drawings.

Figure 38:
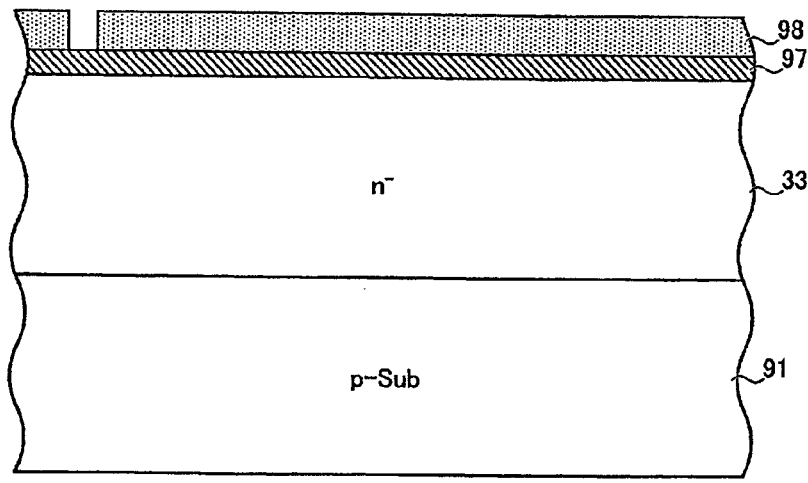
FIG. 38 is a cross-sectional view explaining a manufacturing process of Embodiment 12.

First, as shown in FIG. 38, an epitaxial wafer is prepared, with an epitaxially grown layer serving as the n⁻ drift region 33 on the p semiconductor substrate 91. An oxide film 97 is either grown on or deposited onto the surface of this epitaxial wafer. Photoresist 98 is applied, a photolithography process is performed, and the portions of the photoresist 98 on regions in which trench isolation regions are to be formed are removed.

Figure 39:
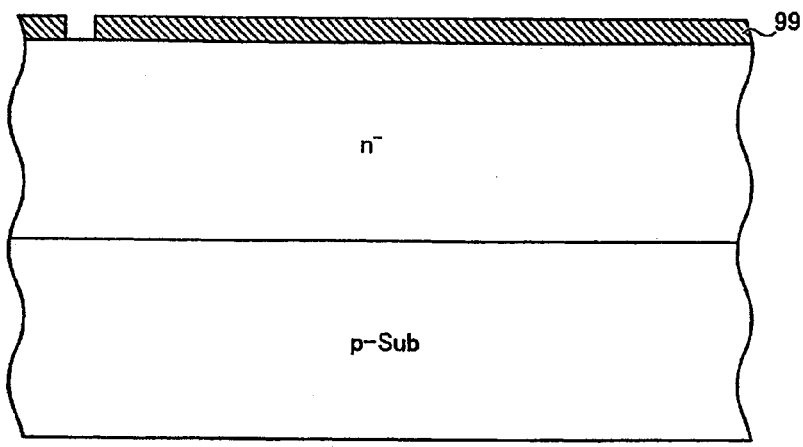
FIG. 39 is a cross-sectional view explaining a manufacturing process of Embodiment 12.
Figure 40:
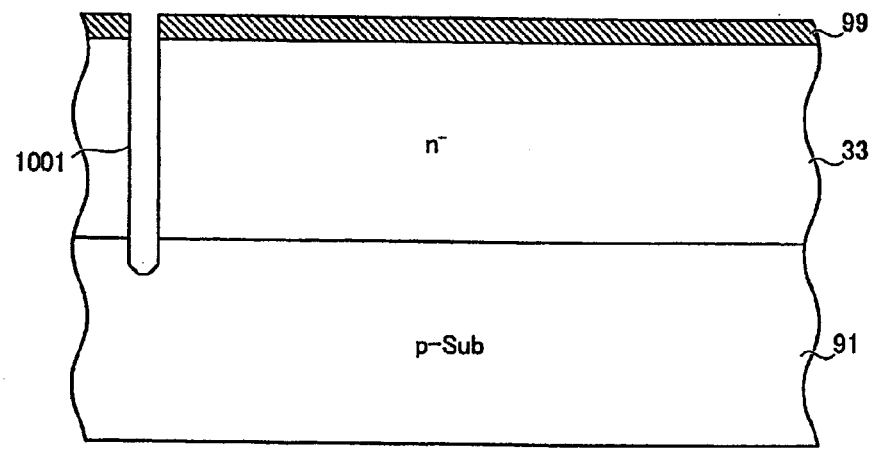
FIG. 40 is a cross-sectional view explaining a manufacturing process of Embodiment 12.

Next, as shown in FIG. 39, the remaining photoresist is used as a mask to perform etching, to form an oxide film mask 99. After removing the photoresist, the wafer is washed. Then, as shown in FIG. 40, the oxide film mask 99 is used as a mask to perform anisotropic etching, to form a trench 1001 which penetrates the n⁻ drift region 33 and reaches the p semiconductor substrate 91. After washing the wafer, sacrificial oxidation of the entire wafer surface is performed, and either the sacrificial oxide film is removed or chemical dry etching (CDE) is performed to remove damage occurring in the trench formation process.

Figure 41:
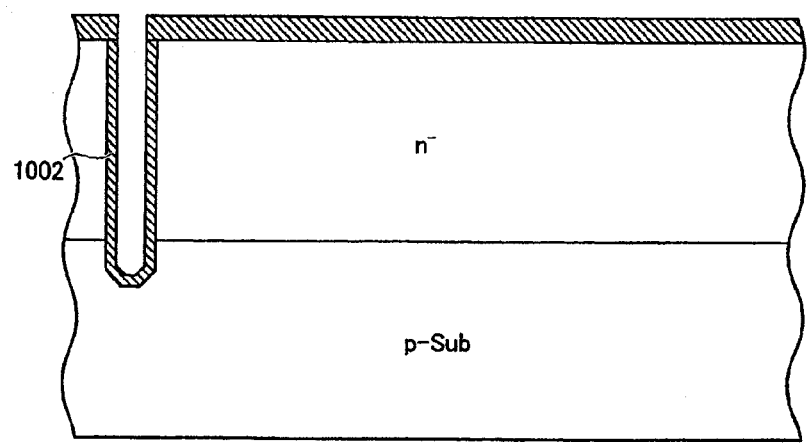
FIG. 41 is a cross-sectional view explaining a manufacturing process of Embodiment 12.
Figure 42:
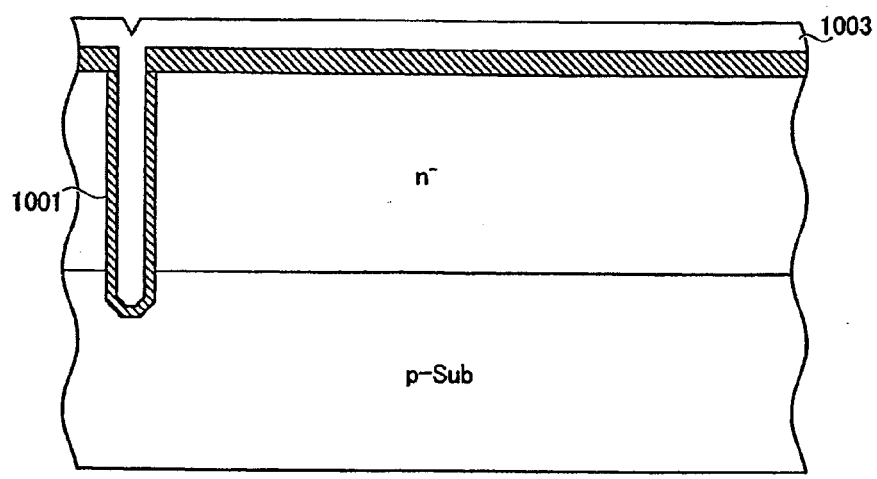
FIG. 42 is a cross-sectional view explaining a manufacturing process of Embodiment 12.
Figure 43:
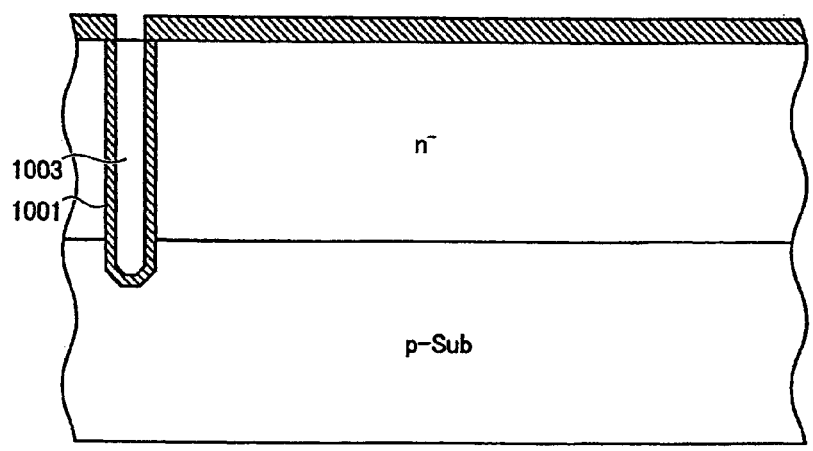
FIG. 43 is a cross-sectional view explaining a manufacturing process of Embodiment 12.

Next, as shown in FIG. 41, an oxide film 1002 is grown on the surface of the trench 1001. The oxide film 1002 on the surface of the trench 1001 becomes the insulating film 95 of the trench isolation region. Next, as shown in FIG. 42, a fill layer 1003 of for example polysilicon is deposited on the entire wafer surface. At this time, the trench 1001 is buried by the fill layer 1003. Next, as shown in FIG. 43, a polysilicon etchback process is performed, leaving only the fill layer 1003 in the trench 1001. The fill layer 1003 remaining in the trench 1001 becomes the fill region 96 of the trench isolation region.

Figure 44:
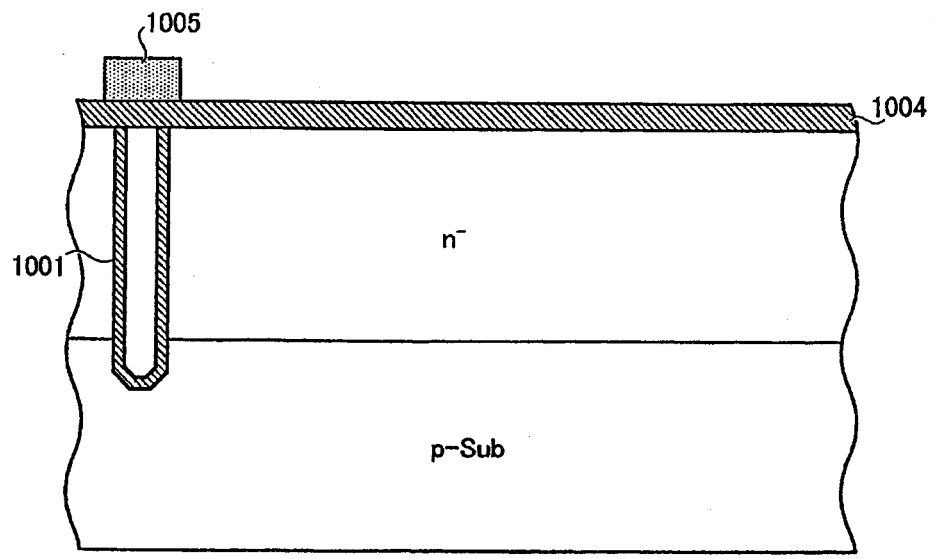
FIG. 44 is a cross-sectional view explaining a manufacturing process of Embodiment 12.
Figure 45:
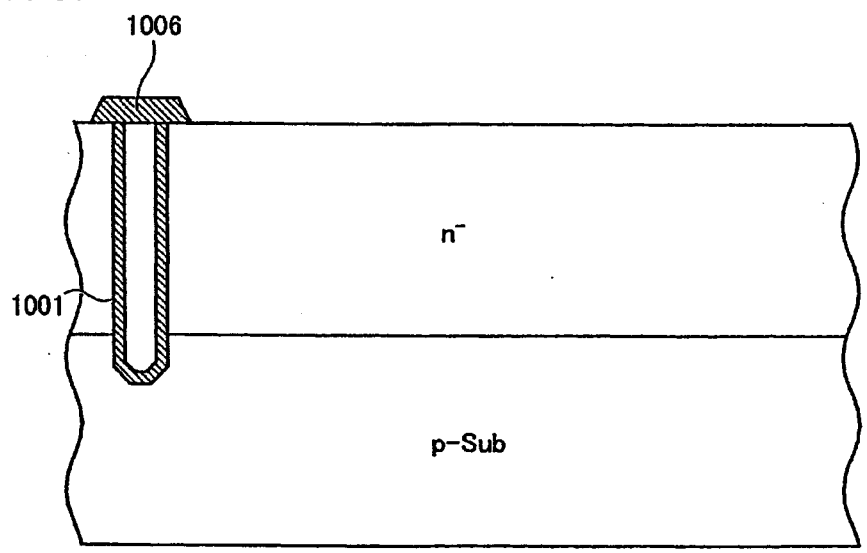
FIG. 45 is a cross-sectional view explaining a manufacturing process of Embodiment 12.

Next, as shown in FIG. 44, an oxide film 1004 is deposited on the entire wafer surface. CMP is performed as necessary to flatten the surface of the oxide film 1004. A photoresist is applied, a photolithography process is performed, and a resist mask 1005 covering the surface above the trench 1001 is formed. Next, as shown in FIG. 45, wet etching is performed to remove the portion of the oxide film 1004 not covered by the resist mask 1005 (see FIG. 44), leaving only the oxide film 1006 above the trench 1001. After removing the photoresist, the wafer is washed.

Next, similarly to Embodiment 9, the processes of FIG. 18 to FIG. 27 are performed. Then, a premetal insulating film is deposited over the entire wafer surface. Chemical-mechanical polishing is performed to flatten the wafer surface. Then, similarly to Embodiment 9, the process of FIG. 29 is performed to complete the element. By means of Embodiment 12, advantageous results similar to those of Embodiment 10 are obtained.

Embodiment 13

Figure 46:
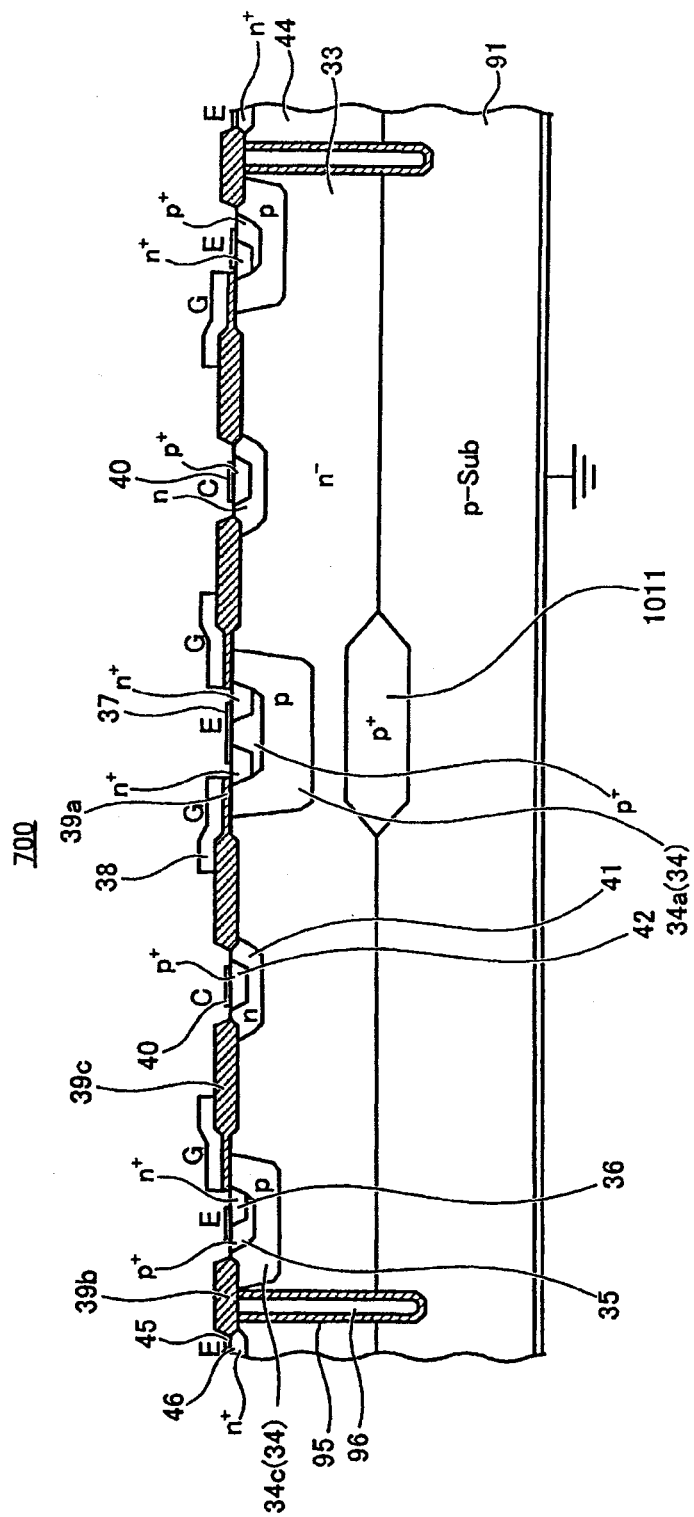
FIG. 46 is a cross-sectional view showing the configuration of the IGBT of Embodiment 13.

FIG. 46 is a cross-sectional view showing the configuration at for example the section line H-H' in FIG. 12 or FIG. 13. As shown in FIG. 46, the IGBT 700 of Embodiment 13 has a p⁺ low-resistance region 1011 provided below the center straight-line portion p base region 34a, between the p semiconductor substrate 91 and the n⁻ drift region 33. The low-resistance region 46 provided on the surface of the isolation silicon region 44 is fixed at ground potential or at the emitter potential via the short-circuiting electrode 45. Otherwise the configuration is similar to that of Embodiment 12.

Figure 47:
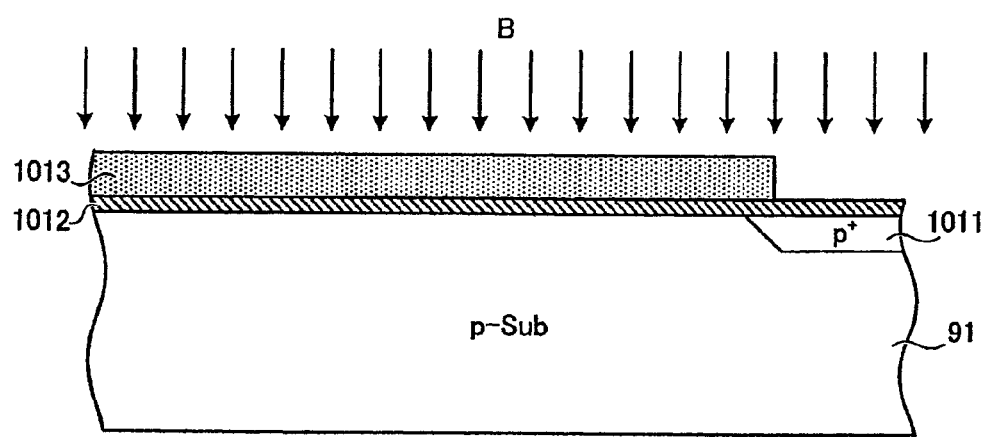
FIG. 47 is a cross-sectional view explaining a manufacturing process of Embodiment 13.
Figure 48:
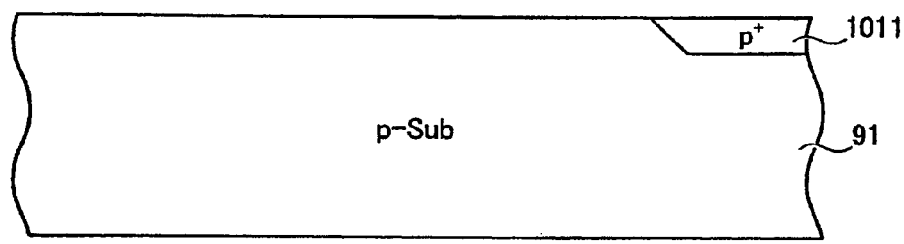
FIG. 48 is a cross-sectional view explaining a manufacturing process of Embodiment 13.
Figure 49:
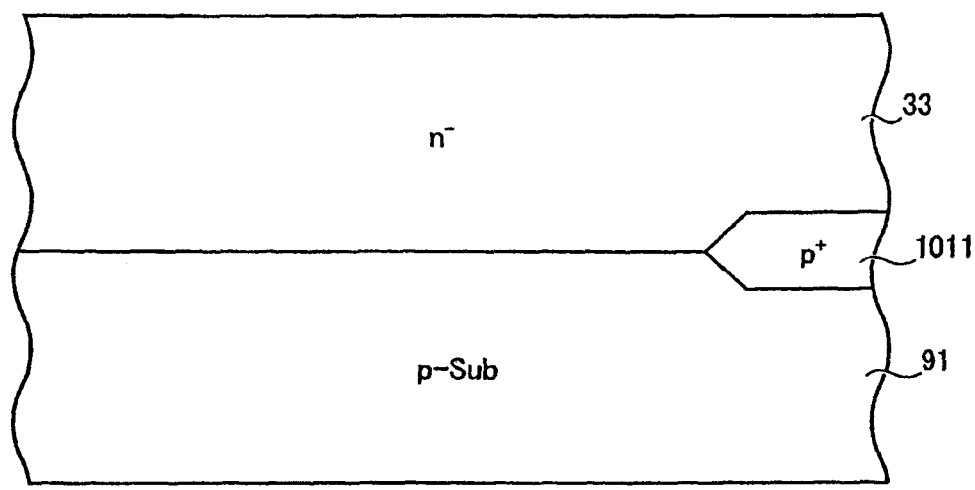
FIG. 49 is a cross-sectional view explaining a manufacturing process of Embodiment 13.

FIG. 47 to FIG. 49 are cross-sectional views showing in order manufacturing processes for Embodiment 13. Representative manufacturing processes for the semiconductor device of Embodiment 13 are explained referring to these drawings.

First, as shown in FIG. 47, a screen oxide film 1012 is grown on the surface of the p semiconductor substrate 91. A photoresist 1013 is applied, and a photolithography process is performed to remove portions of the photoresist 1013 on the region in which the p⁺ low-resistance region is to be formed. Next, ion implantation of boron (B) or another p-type impurity is performed, to form a p⁺ low-resistance region 1011. Next, as shown in FIG. 48, after removing the photoresist 1013 (see FIG. 47), the wafer is washed. Annealing is performed in for example a nitrogen atmosphere, to remove the crystal damage caused by ion implantation. Then, after removing the screen oxide film 1012 (see FIG. 47), the wafer is washed.

Next, as shown in FIG. 49, a semiconductor layer to become the n⁻ drift region 33 is grown epitaxially on the surface of the p semiconductor substrate 91. An oxide film is either grown or deposited on the surface of the epitaxial wafer obtained. A photoresist is applied, and by performing a photolithography process, portions of the photoresist on the region in which the trench isolation region is to be formed are removed. Next, similarly to Embodiment 12, the processes of FIG. 39 to FIG. 45 are performed. Then, similarly to Embodiment 9, the processes of FIG. 18 to FIG. 27 are performed. Then a premetal insulating film is deposited on the entire wafer surface. Chemical-mechanical polishing is performed to flatten the wafer surface. Then, similarly to Embodiment 9, the process of FIG. 29 is performed, to complete the element. By means of Embodiment 13, through the presence of the p⁺ low-resistance region 1011, advantageous results equivalent to those of making the center straight-line portion p base region 34a deeper are obtained. Hence a balance in breakdown voltages is maintained still more effectively, and breakdown voltages for the element as a whole are improved.

Embodiment 14

Figure 50:
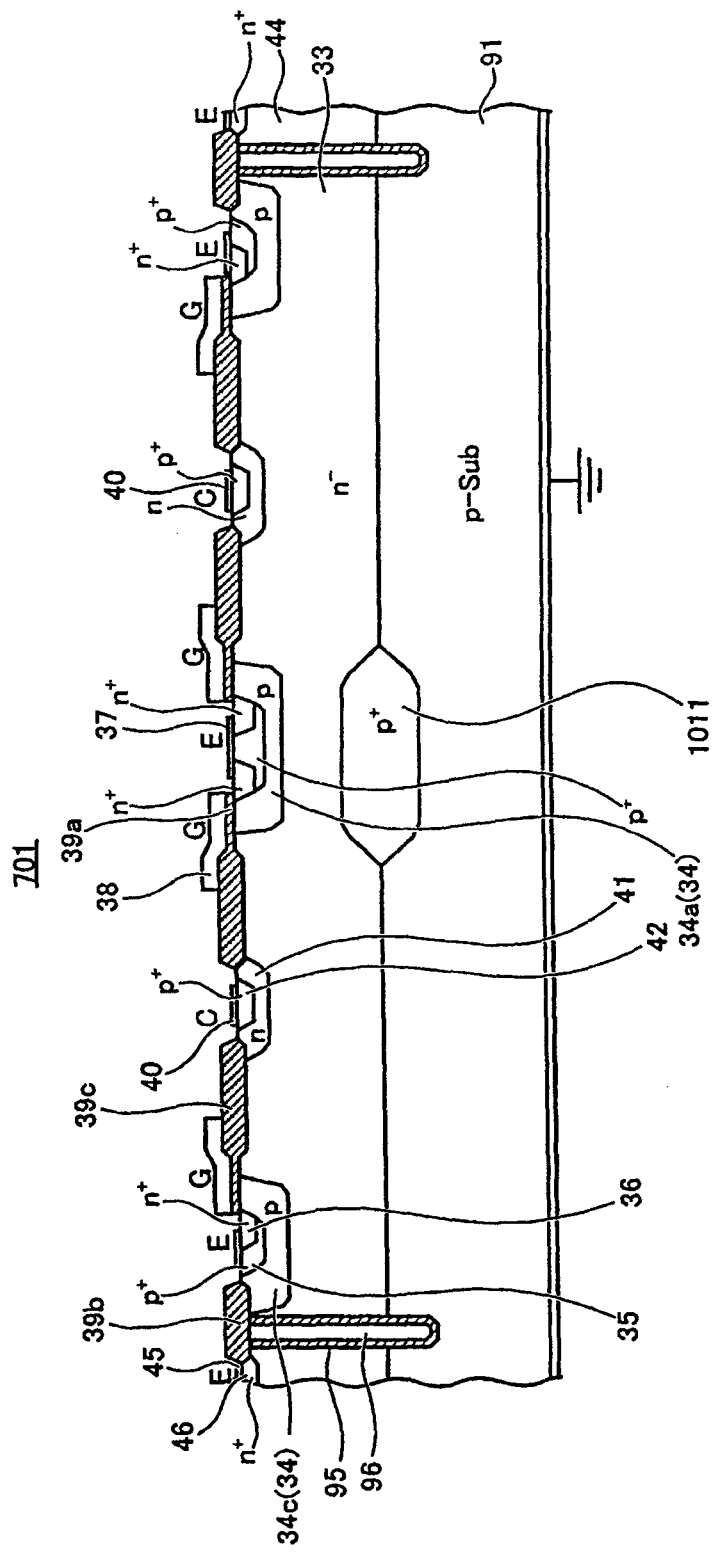
FIG. 50 is a cross-sectional view showing the configuration of the IGBT of Embodiment 14.

FIG. 50 is a cross-sectional view showing the configuration at for example the section line H-H' in FIG. 12 or FIG. 13. As shown in FIG. 50, in the IGBT 701 of Embodiment 14, the center straight-line portion p base region 34a is not deeper than the outside straight-line portion p base region 34c. Otherwise the configuration is similar to that of Embodiment 13.

Figure 51:
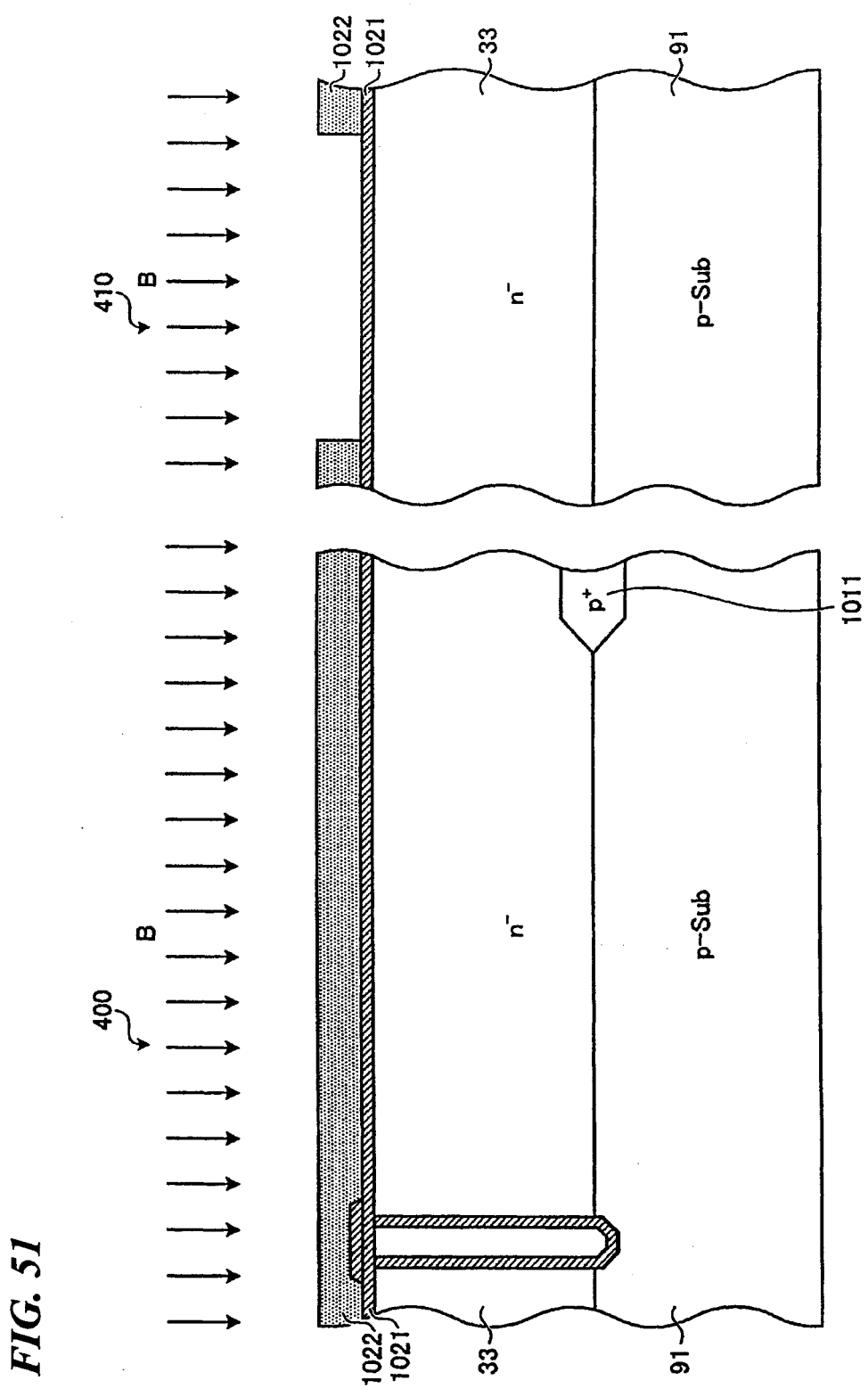
FIG. 51 is a cross-sectional view explaining a manufacturing process of Embodiment 14.
Figure 52:
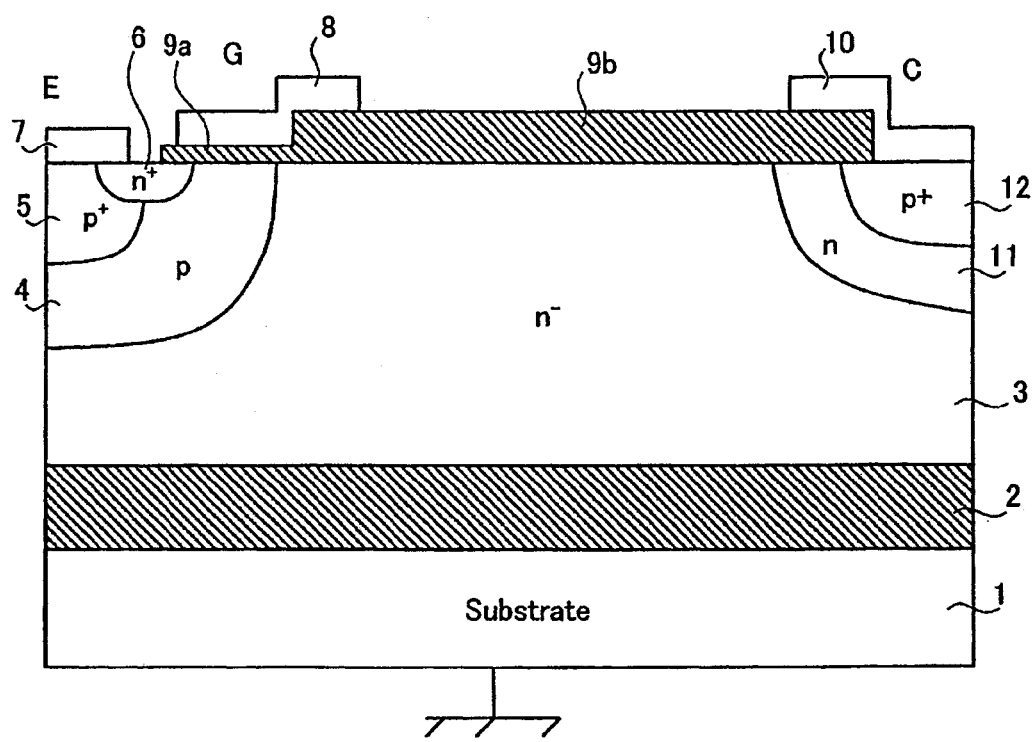
FIG. 52 is a cross-sectional view showing the configuration of an IGBT of the prior art.

FIG. 51 is a cross-sectional view explaining a manufacturing process of Embodiment 14. Representative manufacturing processes for the semiconductor device of Embodiment 14 are explained referring to this drawing. In FIG. 51, on either side of a center portion which is omitted, the left-half portion is a lateral IGBT 400 during manufacture, and the right-half portion is a CMOS element N-channel MOSFET 410 during manufacture.

First, similarly to Embodiment 13, the processes of FIG. 47 to FIG. 49 are performed. An oxide film is either grown or deposited on the surface of the epitaxial wafer obtained. A photoresist is applied, and a photolithography process is performed to remove the portions of the photoresist on the region in which the trench isolation region is to be formed. Then, similarly to Embodiment 12, the processes of FIG. 39 to FIG. 45 are performed.

Next, as shown in FIG. 51, a screen oxide film 1021 is grown on the surface of the wafer. A photoresist 1022 is applied onto the screen oxide film 1021. A photolithography process is performed, and portions of the photoresist 1022 on the region of p well formation in the MOSFET 410 are removed. At this time, the p well formation region of the IGBT 400 remains covered by the photoresist 1022. Then, ion implantation of boron (B) or another p-type impurity is performed. No limitations in particular are placed on the implantation conditions; for example, an accelerating voltage of 150 keV and dose of $2\times10^{13}$ cm$^{-2}$ may be used. After removing the photoresist 1022, the wafer is washed. A thermal driving process is performed at 1150° C. for 300 to 360 minutes in a nitrogen or oxygen atmosphere, to form the p well of the MOSFET 410.

Next, similarly to Embodiment 9, the processes after formation of the p well of FIG. 19 up to the process of FIG. 27 are performed. Then, a premetal insulating film is deposited on the entire wafer surface. Chemical-mechanical polishing is performed, to flatten the wafer surface. Then, similarly to Embodiment 9, the process of FIG. 29 is performed to complete the element. By means of Embodiment 14, through the presence of the p$^+$ low-resistance region 1011, advantageous results equivalent to those of making the center straight-line portion p base region 34a deeper are obtained, even when the center straight-line portion p base region 34a is not deep. Hence a balance in breakdown voltages is maintained, and breakdown voltages for the element as a whole are improved.

This invention is not limited to the above-described aspects, and various modifications are possible within the scope of the appended claims. For example, the dimensions and concentrations given in the aspects are examples, and this invention is not limited to these values. Further, by making the second semiconductor region an n-type low-resistance region, this invention can be applied to MOSFETs. And, in the aspects the first conduction type was the n type and the second conduction type was the p type, but this invention is similarly valid when the first conduction type is the p type and the second conduction type is the n type.

As described above, a semiconductor device of this invention is useful for lateral-type semiconductor devices with high breakdown voltages, and in particular is suited to IGBTs and power MOSFETs used in automobile engine control, the driving circuits of plasma display panels, and other applications.

This application is based on, and claims priority to, Japanese Patent Application Nos: 2008-080489, filed on Mar. 26, 2008 and 2008-192294 filed on Jul. 25, 2008. The disclosure of these priority applications, in their entirety, including the drawings, claims, and the specification thereof, is incorporated herein by reference.

What is claimed is:

1. A semiconductor device, including a dielectric isolation structure including an insulating film extending in a depth direction, the device having a planar layout and comprising:
    a compound structure having a plurality of unit structures comprising a first semiconductor region of a first conduction type provided on a supporting substrate with a buried insulating layer intervening, and surrounding a straight-line first electrode, a closed planar-shape gate electrode surrounding the first semiconductor region, and a closed planar-shape second electrode surrounding the gate electrode;
    a second semiconductor region of a first or second conduction type, provided in a surface region of the first semiconductor region along the first electrode, and electrically connected to the first electrode;
    a third semiconductor region of a second conduction type, provided in a surface region of the first semiconductor region along the second electrode, separated from the second semiconductor region, and electrically connected to the second electrode, the third semiconductor region having a planar shape which has straight-line portions connected by arc-shaped portions;
    a fourth semiconductor region of a first conduction type, provided in a surface region of the third semiconductor region along the second electrode, and electrically connected to the second electrode;
    the gate electrode being provided on the surface of the third semiconductor region between the fourth semiconductor region and the first semiconductor region, with a gate insulating film intervening;
    a closed planar-shape first dielectric isolation region surrounding the compound structure;
    a closed planar-shape isolation semiconductor region of a first conduction type, provided on the side opposite the first semiconductor region, with the first dielectric isolation region intervening, the isolation semiconductor region surrounding the first dielectric isolation region; and,
    a closed planar-shape second dielectric isolation region surrounding the isolation semiconductor region;
    a local insulating film provided in contact with and on the outside of the third semiconductor region positioned on the outermost side of a compound structure having a plurality of unit structures comprising the second semiconductor region, the third semiconductor region, the fourth semiconductor region, the first electrode, the second electrode, and the gate electrode;
    the first dielectric isolation region extending from the local insulating film, penetrating the first semiconductor region, and reaching the buried insulating layer; and
    a third electrode, held at the same potential as the second electrode, and electrically connected to the isolation semiconductor region, wherein a depth of the third semiconductor region positioned on the outermost side of the compound structure is shallower than a depth of other third semiconductor regions,
    wherein the outermost straight-line portions of the third semiconductor region are shallower in depth than the rest of the straight-line portion of the third semiconductor region which is between the outermost portions.

2. The semiconductor device according to claim 1, wherein the planar shape of the third semiconductor region in each unit structure has straight-line portions extending along the first electrode and arc-shape portions connecting ends of the adjacent straight-line portions, and wherein the depth of the third semiconductor region at the arc-shape portions is shallower than the depth of the straight-line portions of the third semiconductor region positioned outermost in the compound structure.

3. The semiconductor device according to claim 2, wherein a length of portions of contact of the third semiconductor region at the arc-shape portions and the gate insulating film is longer than a length of portions of contact of the third semiconductor region at the straight-line portions and the gate insulating film.

\* \* \* \* \*